(12) United States Patent
Tanaka et al.

(10) Patent No.: US 11,133,402 B2
(45) Date of Patent: Sep. 28, 2021

(54) SEMICONDUCTOR DEVICE, METHOD FOR MANUFACTURING SEMICONDUCTOR DEVICE, AND ELECTRONIC APPLIANCE HAVING SEMICONDUCTOR DEVICE

(71) Applicant: Semiconductor Energy Laboratory Co., Ltd., Kanagawa-ken (JP)

(72) Inventors: Tetsuhiro Tanaka, Kanagawa (JP); Ryo Tokumaru, Kanagawa (JP); Yasumasa Yamane, Kanagawa (JP); Akihisa Shimomura, Kanagawa (JP); Naoki Okuno, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/778,103

(22) Filed: Jan. 31, 2020

(65) Prior Publication Data

US 2020/0243669 A1 Jul. 30, 2020

Related U.S. Application Data

(60) Continuation of application No. 16/038,763, filed on Jul. 18, 2018, now Pat. No. 10,553,704, which is a
(Continued)

(30) Foreign Application Priority Data

Aug. 22, 2014 (JP) .................................. 2014-169430

(51) Int. Cl.
*H01L 29/66* (2006.01)
*H01L 29/423* (2006.01)
(Continued)

(52) U.S. Cl.
CPC .... *H01L 29/66742* (2013.01); *H01L 27/1225* (2013.01); *H01L 29/42384* (2013.01);
(Continued)

(58) Field of Classification Search
CPC ...................................................... H01L 29/66
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Asakuma, N. et al., "Crystallization and Reduction of Sol-Gel-Derived Zinc Oxide Films by Irradiation with Ultraviolet Lamp," Journal of SOL-GEL Science and Technology, 2003, vol. 26, pp. 181-184.
(Continued)

*Primary Examiner* — Marvin Payen
(74) *Attorney, Agent, or Firm* — Husch Blackwell LLP

(57) ABSTRACT

To provide a semiconductor device including an oxide semiconductor layer with high and stable electrical characteristics, the semiconductor device is manufactured by forming a first insulating layer, forming oxide over the first insulating layer and then removing the oxide n times (n is a natural number), forming an oxide semiconductor layer over the first insulating layer, forming a second insulating layer over the oxide semiconductor layer, and forming a conductive layer over the second insulating layer. Alternatively, the semiconductor device is manufactured by forming the oxide semiconductor layer over the first insulating layer, forming the second insulating layer over the oxide semiconductor layer, forming the oxide over the second insulating layer and then removing the oxide n times (n is a natural number), and
(Continued)

US 11,133,402 B2

Page 2 forming the conductive layer over the second insulating layer.

18 Claims, 53 Drawing Sheets

Related U.S. Application Data division of application No. 14/829,029, filed on Aug. 18, 2015, now Pat. No. 10,032,888.

(51) Int. Cl.
    H01L 29/786    (2006.01)
    H01L 29/45     (2006.01)
    H01L 29/49     (2006.01)
    H01L 27/12     (2006.01)

(52) U.S. Cl.
    CPC .......... H01L 29/45 (2013.01); H01L 29/4908 (2013.01); H01L 29/7869 (2013.01); H01L 29/78648 (2013.01); H01L 29/78696 (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,530,289 B2 | 9/2013 | Yamazaki |
| 8,551,824 B2 | 10/2013 | Yamazaki et al. |
| 8,669,148 B2 | 3/2014 | Yamazaki |
| 8,748,240 B2 | 6/2014 | Yamazaki |
| 8,748,881 B2 | 6/2014 | Yamazaki |
| 8,779,420 B2 | 7/2014 | Yamazaki |
| 8,785,258 B2 | 7/2014 | Yamazaki |
| 8,828,794 B2 | 9/2014 | Yamazaki et al. |
| 8,878,173 B2 | 11/2014 | Yamazaki |
| 8,895,377 B2 | 11/2014 | Yamazaki |
| 8,952,380 B2 | 2/2015 | Honda et al. |
| 9,006,024 B2 | 4/2015 | Akimoto |
| 9,099,303 B2 | 8/2015 | Yamazaki |
| 9,099,499 B2 | 8/2015 | Yamazaki |
| 9,117,920 B2 | 8/2015 | Koezuka et al. |
| 9,184,296 B2 | 11/2015 | Koezuka et al. |
| 9,209,267 B2 | 12/2015 | Ito et al. |
| 9,209,314 B2 | 12/2015 | Takemura |
| 9,214,520 B2 | 12/2015 | Yamazaki |
| 9,245,983 B2 | 1/2016 | Yamazaki |
| 9,276,121 B2 | 3/2016 | Yamazaki |
| 9,281,412 B2 | 3/2016 | Takemura |
| 9,450,104 B2 | 9/2016 | Koezuka et al. |
| 9,472,683 B2 | 10/2016 | Takemura |
| 9,530,895 B2 | 12/2016 | Honda et al. |
| 9,640,639 B2 | 5/2017 | Yamazaki |
| 9,887,298 B2 | 2/2018 | Yamazaki |
| 9,911,866 B2 | 3/2018 | Takemura |
| 10,263,120 B2 | 4/2019 | Yamazaki |
| 10,608,118 B2 | 3/2020 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0284844 A1 | 11/2011 | Endo et al. |

(56) References Cited

U.S. PATENT DOCUMENTS

| | | |
|---|---|---|
| 2012/0319113 A1 | 12/2012 | Yamazaki |
| 2013/0137232 A1 | 5/2013 | Ito et al. |
| 2013/0161610 A1 | 6/2013 | Yamazaki |
| 2013/0187150 A1 | 7/2013 | Yamazaki et al. |
| 2013/0270563 A1 | 10/2013 | Yamazaki |
| 2013/0277672 A1 | 10/2013 | Sano et al. |
| 2014/0038351 A1 | 2/2014 | Yamazaki et al. |
| 2014/0103337 A1 | 4/2014 | Yamazaki et al. |
| 2014/0106504 A1 | 4/2014 | Yamazaki et al. |
| 2014/0319514 A1 | 10/2014 | Noda et al. |
| 2014/0339547 A1 | 11/2014 | Hondo et al. |
| 2020/0212222 A1 | 7/2020 | Yamazaki |
| 2020/0220028 A1 | 7/2020 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2011-199272 A | 10/2011 |
| JP | 2011-243974 A | 12/2011 |
| JP | 2012-009836 A | 1/2012 |
| JP | 2012-023352 A | 2/2012 |
| JP | 2012-209543 A | 10/2012 |
| JP | 2012-248868 A | 12/2012 |
| JP | 2012-256871 A | 12/2012 |
| JP | 2013-021317 A | 1/2013 |
| JP | 2013-110392 A | 6/2013 |
| JP | 2013-138189 A | 7/2013 |
| JP | 2013-168646 A | 8/2013 |
| JP | 2013-236068 A | 11/2013 |
| JP | 2013-243349 A | 12/2013 |
| WO | WO 2004/114391 A1 | 12/2004 |
| WO | WO 2011/065243 A1 | 6/2011 |
| WO | WO 2011/132529 A1 | 10/2011 |
| WO | WO 2011/158888 A1 | 12/2011 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2:AL and SN-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZNO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID DIGEST '09: SID International Symposium Digest of Technical Papers, May, 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009 pp. 41-44.

Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZNO TFTS) for AMLCDS," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the IN2O3 and SC2O3—A2O3—BO

(56) References Cited

OTHER PUBLICATIONS

Systems [A; Fe, Ga, or Al; B: Mg, Mn, Fe, Ni, Cu,or Zn] At Temperatures Over 1000 ," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits , 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350°C," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector with Suppressed Voltage Loss for White Tandem OLEDS," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of Zno Thin-Film Transistors with Aluminum Oxide Dielectric Layers," Journal of the Electrochemical Society, 2008, vol. 155, No. 12, pp. H1009-H1014.

Ohara, H. et al., "21.3: 4.0 in. QVGA AMOLED Display Using In—Ga—Zn-Oxide TFTS with a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZNO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display,"SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display with Driver Circuit Using Amorphous In—Ga—Zn-Oxide TFTS," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

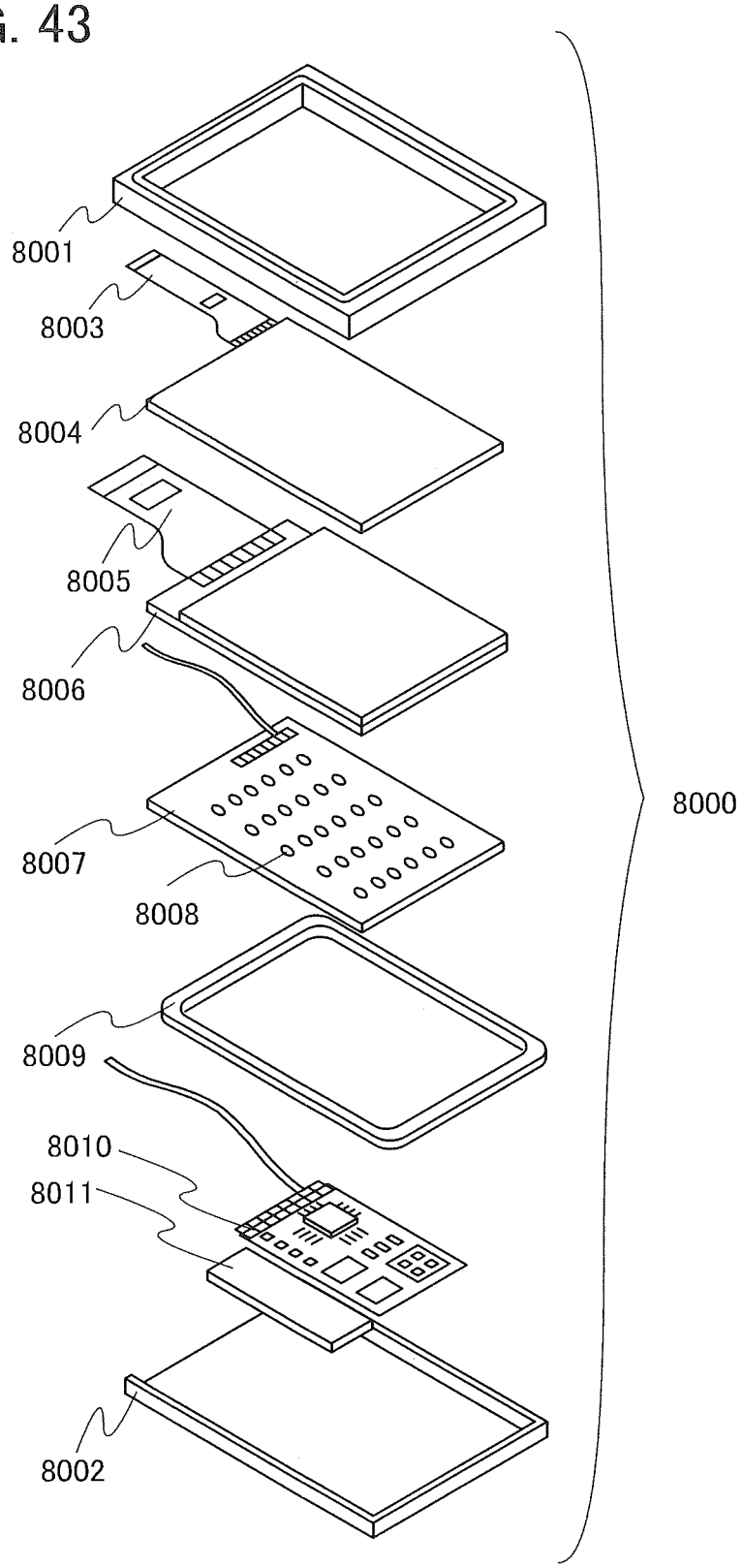

SEMICONDUCTOR DEVICE, METHOD FOR MANUFACTURING SEMICONDUCTOR DEVICE, AND ELECTRONIC APPLIANCE HAVING SEMICONDUCTOR DEVICE

This application is a continuation of U.S. application Ser. No. 16/038,763, filed on Jul. 18, 2018 which is a divisional of U.S. application Ser. No. 14/829,029, filed on Aug. 18, 2015 (now U.S. Pat. No. 10,032,888 issued Jul. 24, 2018) which are all incorporated herein by reference.

BACKGROUND OF THE INVENTION

1. Field of the Invention

One embodiment of the present invention relates to a semiconductor device and an electronic appliance including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. One embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used in a transistor. As another material, an oxide semiconductor has been attracting attention (e.g., Patent Document 1).

A semiconductor device including, as a base insulating layer of an oxide semiconductor layer where a channel is formed, an insulating layer that releases oxygen by heating to reduce oxygen vacancy in the oxide semiconductor layer is disclosed (e.g., Patent Document 2).

A method for manufacturing a semiconductor device in which an oxide semiconductor layer is highly purified in the following manner is disclosed: an oxide insulating layer is formed over the oxide semiconductor layer; oxygen is taken (added) through the oxide insulating layer; heat treatment is performed; and impurities such as hydrogen, moisture, a hydroxyl group, or a hydride are removed from the oxide semiconductor layer by taking oxygen into the oxide semiconductor layer and performing the heat treatment (e.g., Patent Document 3).

REFERENCE

Patent Document

[Patent Document 1] Japanese Published Patent Application No. 2006-165529
[Patent Document 2] Japanese Published Patent Application No. 2012-009836
[Patent Document 3] Japanese Published Patent Application No. 2011-199272

SUMMARY OF THE INVENTION

An object of one embodiment of the present invention is to suppress a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification and the like.

One embodiment of the present invention is a method for manufacturing a semiconductor device including the steps of forming a first insulating layer, forming oxide over the first insulating layer, removing the oxide, forming an oxide semiconductor layer over the first insulating layer, forming a second insulating layer over the oxide semiconductor layer, and forming a conductive layer over the second insulating layer.

In the above method for manufacturing a semiconductor device of the present invention, removal of the oxide is performed by planarization treatment on the first insulating layer.

Another embodiment of the present invention is a method for manufacturing a semiconductor device including the steps of forming a first insulating layer, forming oxide over the first insulating layer and then removing the oxide n times (n is a natural number of 2 or more), forming an oxide semiconductor layer over the first insulating layer, forming a second insulating layer over the oxide semiconductor layer, and forming a conductive layer over the second insulating layer.

In the above method for manufacturing a semiconductor device of the present invention, n-th removal of the oxide is performed by planarization treatment on the first insulating layer.

In the above method for manufacturing a semiconductor device of the present invention, the planarization treatment is performed with chemical mechanical polishing (CMP).

In the above method for manufacturing a semiconductor device of the present invention, an upper part of the first insulating layer is removed by 5 nm or more and less than 100 nm.

Another embodiment of the present invention is a method for manufacturing a semiconductor device including the steps of forming an oxide semiconductor layer, forming an insulating layer over the oxide semiconductor layer, forming oxide over the insulating layer, removing the oxide, and forming a conductive layer over the insulating layer.

Another embodiment of the present invention is a method for manufacturing a semiconductor device including the steps of forming an oxide semiconductor layer, forming an insulating layer over the oxide semiconductor layer, forming first oxide over the insulating layer, removing the first oxide, forming second oxide over the insulating layer, and forming a conductive layer over the second oxide.

Another embodiment of the present invention is a method for manufacturing a semiconductor device including the steps of forming an oxide semiconductor layer, forming an insulating layer over the oxide semiconductor layer, forming oxide over the insulating layer and then removing the oxide n times (n is a natural number of 2 or more), and forming a conductive layer over the insulating layer.

Another embodiment of the present invention is a method for manufacturing a semiconductor device including the steps of forming an oxide semiconductor layer, forming an insulating layer over the oxide semiconductor layer, forming first oxide over the insulating layer and then removing the first oxide n times (n is a natural number of 2 or more), forming second oxide over the insulating layer, and forming a conductive layer over the second oxide.

In the above method for manufacturing a semiconductor device of the present invention, the oxide is formed to a thickness of 4 nm or more.

In the above method for manufacturing a semiconductor device of the present invention, the first oxide is formed to a thickness of 4 nm or more.

Another embodiment of the present invention is a semiconductor device including a first insulating layer, an oxide semiconductor layer over the first insulating layer, a second insulating layer over the oxide semiconductor layer, and a conductive layer over the second insulating layer. The first insulating layer includes a first region and a second region. The first region is in contact with the oxide semiconductor layer and has a higher content of a rare gas than the second region.

Another embodiment of the present invention is a semiconductor device including a first insulating layer, an oxide semiconductor layer over the first insulating layer, a second insulating layer over the oxide semiconductor layer, oxide over the second insulating layer, and a conductive layer over the oxide. The second insulating layer includes a first region and a second region. The first region is in contact with the oxide semiconductor layer. The second region is in contact with the oxide and has a higher content of a rare gas than the first region.

In the above semiconductor device of the present invention, the second region has a higher content of oxygen than the first region.

In the above semiconductor device of the present invention, the conductive layer faces a side surface of the oxide semiconductor layer with the second insulating layer provided therebetween.

An electronic appliance includes the above semiconductor device of the present invention, and at least one of a display device, a microphone, a speaker, an operation key, a touch panel, and an antenna.

According to one embodiment of the present invention, a change in electrical characteristics can be inhibited and reliability can be improved in a semiconductor device using a transistor including an oxide semiconductor. According to one embodiment of the present invention, a semiconductor device with low power consumption can be provided.

According to one embodiment of the present invention, a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 43 illustrates a display module.

DETAILED DESCRIPTION OF THE INVENTION

Figure 1A:
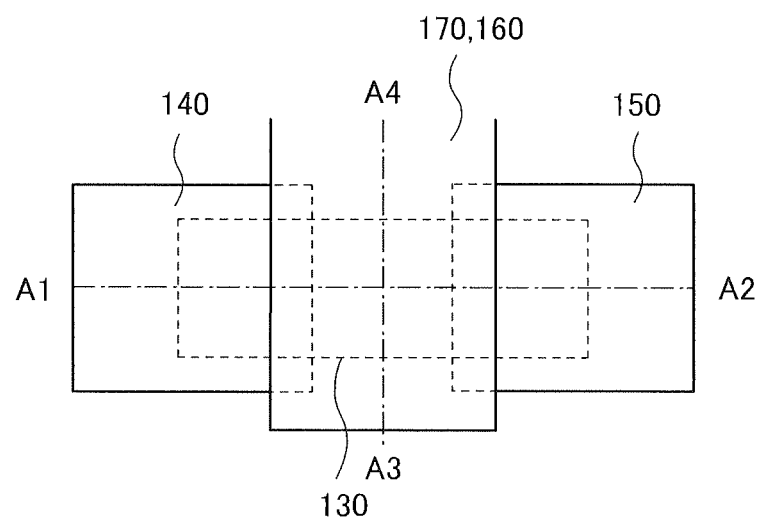
FIGS. 1A and 1B are a top view and a cross-sectional view illustrating one embodiment of a semiconductor device.

Embodiments will be described below with reference to drawings. Note that the embodiments can be implemented with various modes. It will be readily appreciated by those skilled in the art that modes and details can be changed in various ways without departing from the spirit and scope of the present invention. Therefore, the present invention should not be interpreted as being limited to the following description of the embodiments.

In the drawings, the size, the layer thickness, and the region are exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source.

Furthermore, functions of a source and a drain might be switched when transistors having different polarities are employed or a direction of current flow is changed in circuit operation, for example. Therefore, the terms "source" and "drain" can be switched in this specification and the like.

In this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, "an oxynitride film like a silicon oxynitride film" refers to a film that includes oxygen at a higher proportion than nitrogen, and "a nitride oxide film like a silicon nitride oxide film" refers to a film that includes nitrogen at a higher proportion than oxygen.

In describing structures of the present invention with reference to the drawings in this specification and the like, common reference numerals are used for the same portions in different drawings.

In this specification and the like, a term "parallel" indicates that the angle formed between two straight lines is greater than or equal to −10° and less than or equal to 10°, and accordingly includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification and the like, the terms "film" and "layer" can be switched depending on the case or circumstances. For example, the term "conductive layer" can be used instead of the term "conductive film" in some cases. Similarly, the term "insulating film" can be used instead of the term "insulating layer" in some cases.

Embodiment 1

In this embodiment, a transistor including an oxide semiconductor that can be used in one embodiment of the present invention will be described with reference to drawings. In the drawings in this embodiment, some components are enlarged, reduced in size, or omitted for easy understanding.
<Structure Example 1 of Transistor>

Figure 1B:
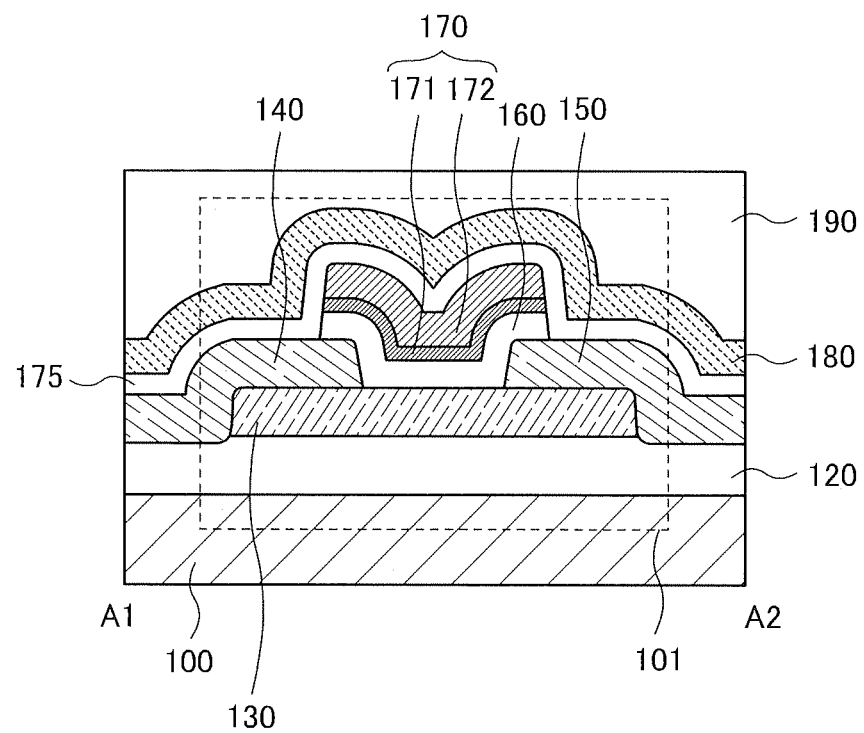
Figure 7A:
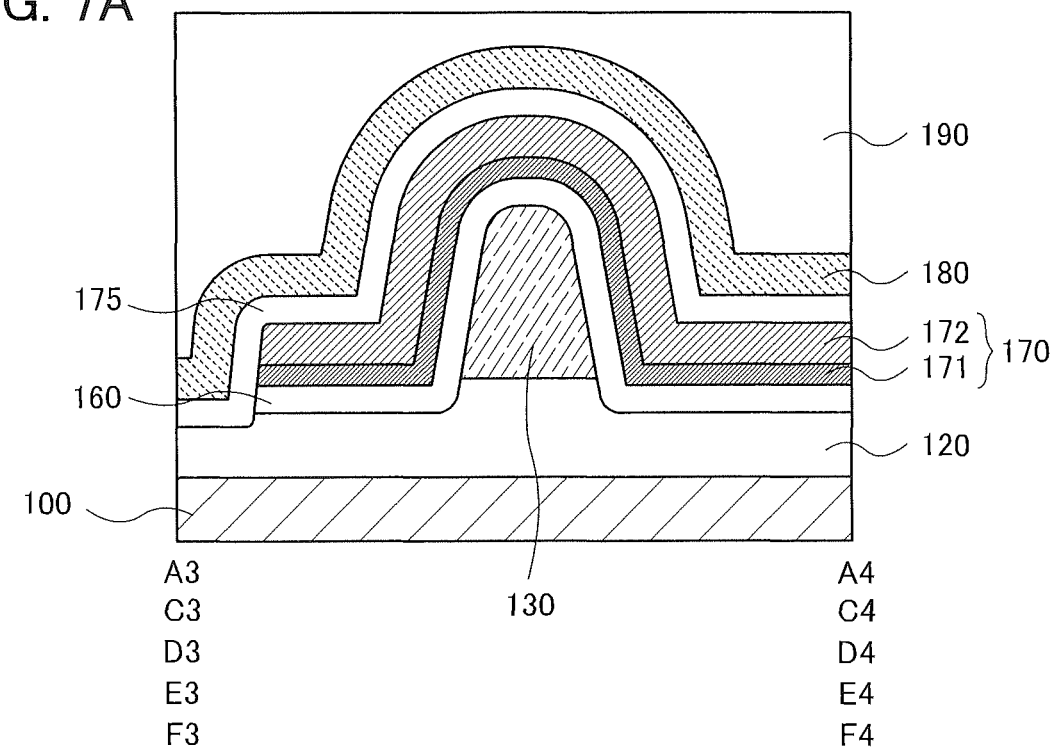
FIGS. 7A and 7B are cross-sectional views each illustrating one embodiment of a semiconductor device.

FIGS. 1A and 1B are a top view and a cross-sectional view illustrating a transistor 101 of one embodiment of the present invention. FIG. 1A is the top view. A cross section in the direction of a dashed-dotted line A1-A2 in FIG. 1A is illustrated in FIG. 1B. A cross section in the direction of a dashed-dotted line A3-A4 in FIG. 1A is illustrated in FIG. 7A. The direction of the dashed-dotted line A1-A2 may be referred to as a channel length direction, and the direction of the dashed-dotted line A3-A4 may be referred to as a channel width direction.

The transistor 101 includes an insulating layer 120 over a substrate 100; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The transistor 101 may also include, for example, an insulating layer 190 (planarization film) in contact with the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The conductive layer 170 includes two layers which are a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Electrons serving as carriers are generated in the oxide semiconductor layer 130 of the transistor 101 because of oxygen vacancies; as a result, the transistor 101 tends to have normally-on characteristics. Thus, for stable transistor characteristics, it is important to reduce oxygen vacancy in the oxide semiconductor layer 130.

In the structure of this transistor, excess oxygen is taken into an insulating film in contact with the oxide semiconductor layer 130, here, the insulating layer 120 below the oxide semiconductor layer 130, whereby oxygen is moved from the insulating layer 120 to the oxide semiconductor layer 130 to fill oxygen vacancy in the oxide semiconductor layer 130. Alternatively, excess oxygen is taken into the insulating layer 160 over the oxide semiconductor layer 130, whereby oxygen is moved from the insulating layer 160 to the oxide semiconductor layer 130 to fill oxygen vacancy in the oxide semiconductor layer 130. Alternatively, excess oxygen is taken into the insulating layer 160 and/or 120 over or below the oxide semiconductor layer 130, whereby oxygen is moved from both the insulating layers 160 and 120 to the oxide semiconductor layer 130 to fill oxygen vacancy in the oxide semiconductor layer 130.

The insulating layer 120 or 160 includes a region (oxygen-excess region) containing oxygen in excess of that in the stoichiometric composition. In other words, the insulating layer 120 or 160 is an insulating layer capable of releasing oxygen. In some cases, the insulating layer 160 includes a region containing a rare gas (typically, argon, krypton, xenon, or the like) (a rare gas region). Note that in the case where the insulating layer 160 includes both the rare gas region and the oxygen-excess region, the oxygen-excess region is preferably formed closer to the oxide semiconductor layer 130 than the rare gas region is. As the oxygen-excess region is formed closer to the oxide semiconductor layer 130, oxygen can be moved efficiently.

The oxygen-excess region is preferred to be formed in the insulating layer 120 or 160 in such a manner that oxygen is taken into the insulating layer 120 or 160 after the deposition. For example, one way to take oxygen is to form oxide over the insulating layer 120 or 160 so that the insulating layer 120 or 160 can take oxygen therefrom.

At the formation of the oxide over the insulating layer 120 or 160, the oxide is formed in an upper part of the insulating layer 120 or 160 while the insulating layer 120 or 160 is exposed to an atmosphere containing oxygen. Oxygen is taken into the insulating layer 120 or 160 from the deposition atmosphere, and oxygen in the insulating layer 120 or 160 is confined by the oxide. Excessive oxygen confined in the insulating layer 120 or 160 is moved to the oxide semiconductor layer 130 by heating the insulating layer 120 or 160 in a subsequent step. Thus, the excess oxygen can be taken into the oxide semiconductor layer 130.

At the same time as when oxygen is taken into the insulating layer 120 or 160, a rare gas (typically, argon) contained in the deposition atmosphere is also taken into the insulating layer. However, a region of the insulating layer 120 or 160 into which the rare gas is taken is different from the region into which oxygen is taken. In the insulating layer 120 or 160, the rare gas region is formed in a region close to a film surface and the oxygen-excess region is formed in a region more distant from the film surface than the rare gas region.

In the case where oxygen is taken into the insulating layer 160 formed over the oxide semiconductor layer 130, the oxygen-excess region is formed closer to the oxide semiconductor layer 130 than the rare gas region is. Therefore, although oxide which is formed over the insulating layer 160 may be removed before the formation of the conductive layer 170, influence to transistor characteristics is small even if it is left as part of the gate insulating layer. In that case, because the oxide also functions as a protective film, impurity diffusion to the oxide semiconductor layer 130 and release of oxygen from the upper part of the insulating layer 160 are prevented; therefore, oxygen in the insulating layer 160 can be efficiently supplied to the oxide semiconductor layer 130.

In contrast, in the case of taking oxygen into the insulating layer 120, the rare gas region is formed closer to the oxide semiconductor layer 130 than the oxygen-excess region is. In such a case, the oxide and the rare gas region formed in the insulating layer 120 are preferred to be removed. Note that in a step of removing the oxide and the rare gas region, disconnection of the oxide semiconductor layer 130, the conductive layer 140, the conductive layer 150, and the like that are formed over the insulating layer 120 can be prevented if the step serves also as a planarization step.

The oxide semiconductor layer 130 includes oxygen and at least one of In, Zn, and M (M is Ti, Ga, Y, Zr, Sn, La, Ce, Nd, or Hf). Typically, an In—Ga oxide, an In—Zn oxide, or an In-M-Zn oxide can be used for the oxide semiconductor layer 130. It is particularly preferable to use an In-M-Zn oxide for the oxide semiconductor layer 130.

The oxide semiconductor layer 130 preferably includes oxygen, In, and Ga. In that case, it is preferable that the oxide semiconductor layer 130 have a homologous structure and the content of In be larger than that of Ga. The oxide semiconductor layer 130 in which the content of In is larger than that of Ga can increase the field-effect mobility (also simply referred to as mobility or μFE) of the transistor 101.

Oxygen in the insulating layer 120 or 160 is diffused to the oxide semiconductor layer 130 by heat treatment. The number of oxygen molecules released from the insulating layer 120 or 160 can be measured by thermal desorption spectroscopy (TDS).

As described above, at least the insulating layer 160 or 120 provided over or below the oxide semiconductor layer 130 allows oxygen in the insulating layer 120 or 160 to transfer to the oxide semiconductor layer 130 and fill oxygen vacancy formed in the oxide semiconductor layer 130. Accordingly, a highly reliable semiconductor device can be provided.

Modification Example 1 of Transistor

Figure 2A:
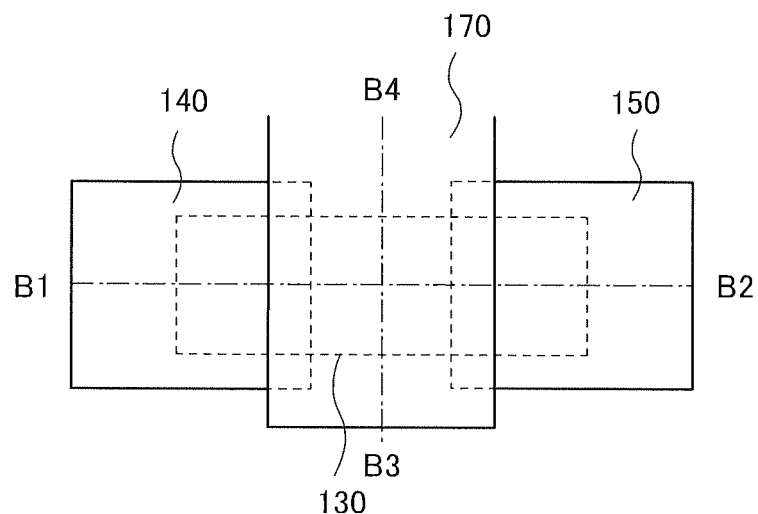
FIGS. 2A and 2B are a top view and a cross-sectional view illustrating one embodiment of a semiconductor device.
Figure 2B:
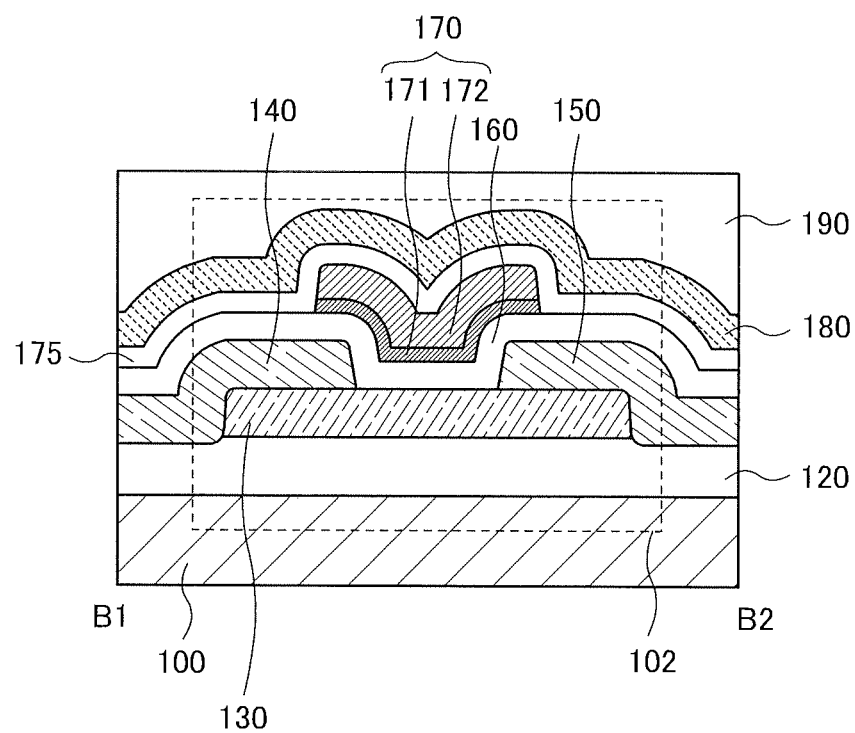
Figure 7B:
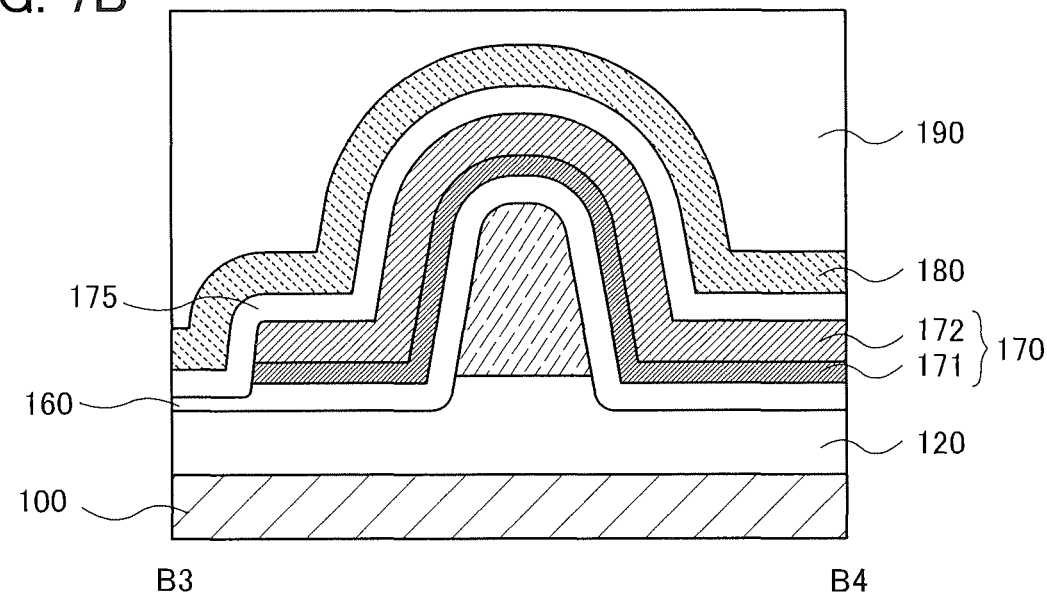
Figure 8A:
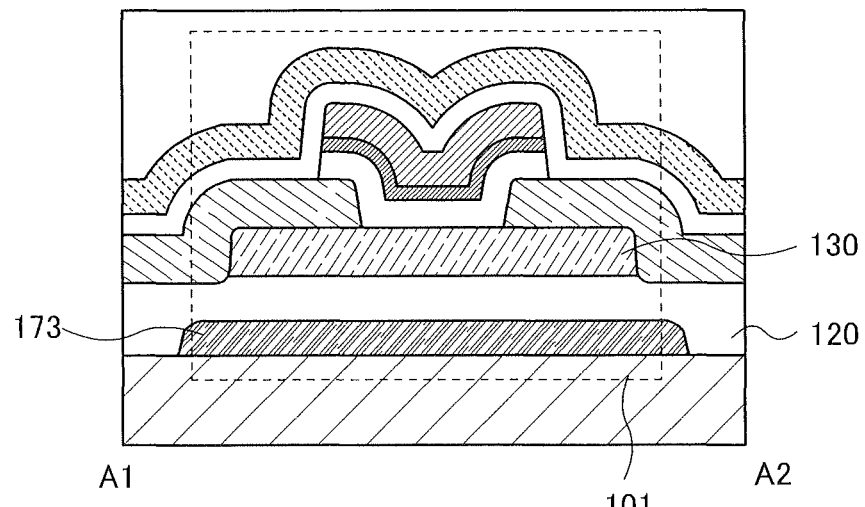
FIGS. 8A to 8C are cross-sectional views each illustrating one embodiment of a semiconductor device.
Figure 8B:
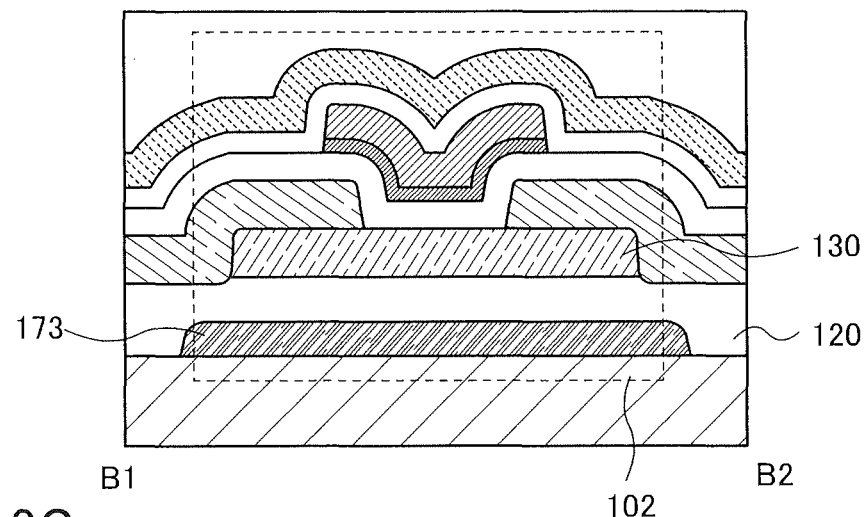
Figure 8C:
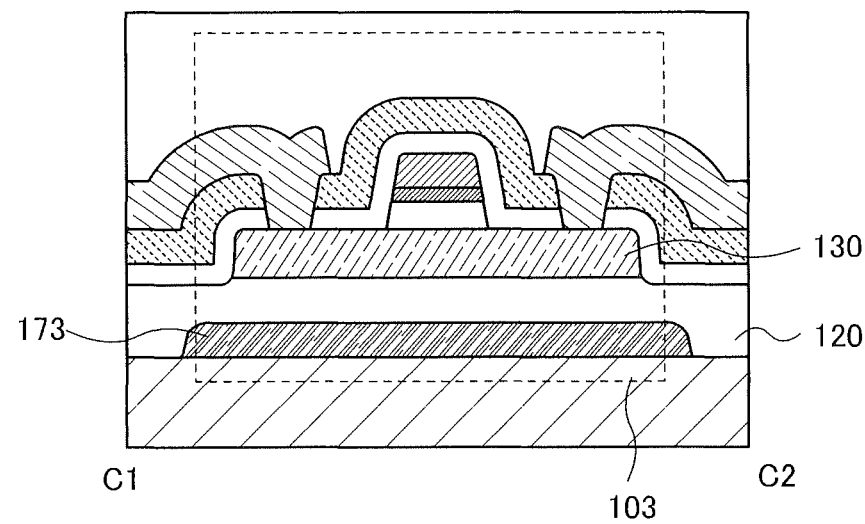
Figure 9A:
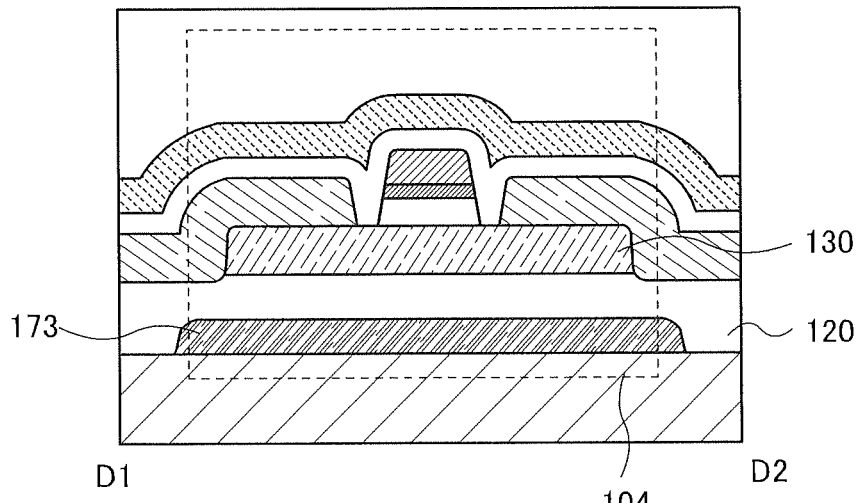
FIGS. 9A to 9C are cross-sectional views each illustrating one embodiment of a semiconductor device.
Figure 9B:
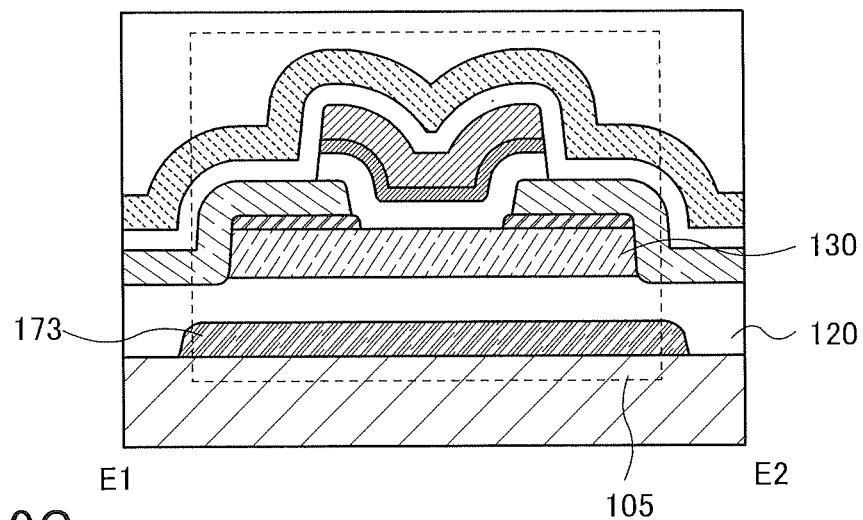
Figure 9C:
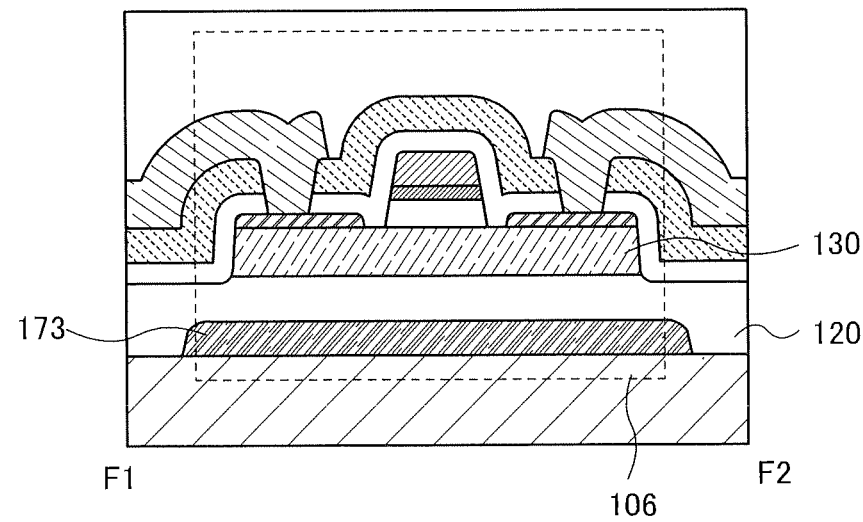

The transistor of one embodiment of the present invention may have a structure illustrated in FIGS. 2A and 2B. FIG. 2A is a top view of a transistor 102. A cross section in the direction of a dashed-dotted line B1-B2 in FIG. 2A is illustrated in FIG. 2B. A cross section in the direction of a dashed-dotted line B3-B4 in FIG. 2A is illustrated in FIG. 7B. The direction of the dashed-dotted line B1-B2 may be referred to as a channel length direction, and the direction of the dashed-dotted line B3-B4 may be referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly an influence of surface conduction generated in an end portion of a gate insulating layer is reduced as compared with the structure illustrated in FIGS. 1A and 1B. Thus, the transistor 102 has a feature of low leakage current between the conductive layer 170 and each of the conductive layers 140 and 150.

The transistor 101 and the transistor 102 each have a top-gate structure including a region where the conductive layer 170 overlaps with each of the conductive layers 140 and 150. To reduce parasitic capacitance, the length of the region in the channel length direction is preferably greater than or equal to 3 nm and less than 300 nm. With the region, a transistor with high on-state current can be easily formed.

Modification Example 2 of Transistor

Figure 3A:
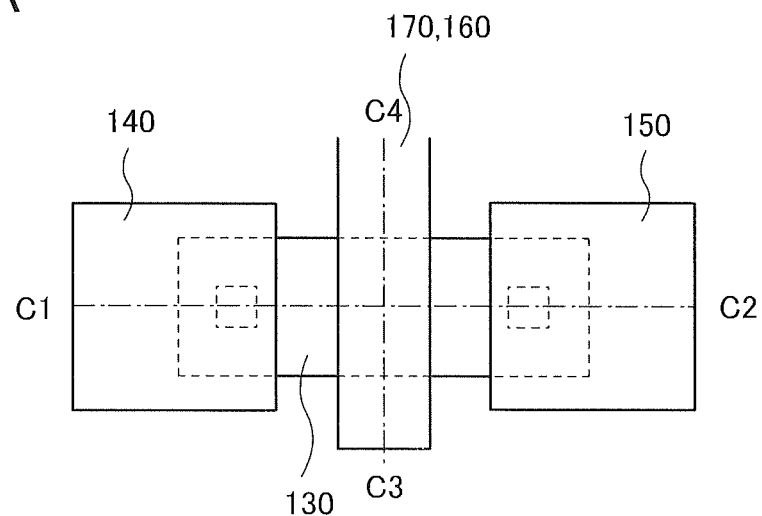
FIGS. 3A and 3B are a top view and a cross-sectional view illustrating one embodiment of a semiconductor device.
Figure 3B:
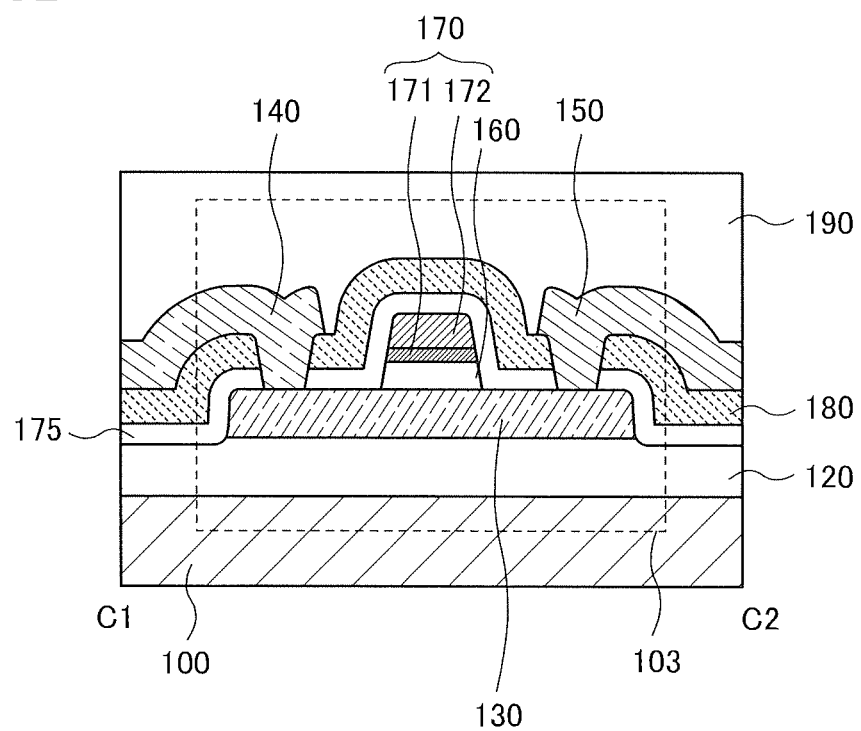

The transistor of one embodiment of the present invention may have a structure illustrated in FIGS. 3A and 3B. FIG. 3A is a top view of a transistor 103. A cross section in the direction of a dashed-dotted line C1-C2 in FIG. 3A is illustrated in FIG. 3B. A cross section in the direction of a dashed-dotted line C3-C4 in FIG. 3A is illustrated in FIG. 7A. The direction of the dashed-dotted line C1-C2 may be referred to as a channel length direction, and the direction of the dashed-dotted line C3-C4 may be referred to as a channel width direction.

The transistor 103 includes the insulating layer 120 over the substrate 100; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, the insulating layer 190 (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Modification Example 3 of Transistor

Figure 4A:
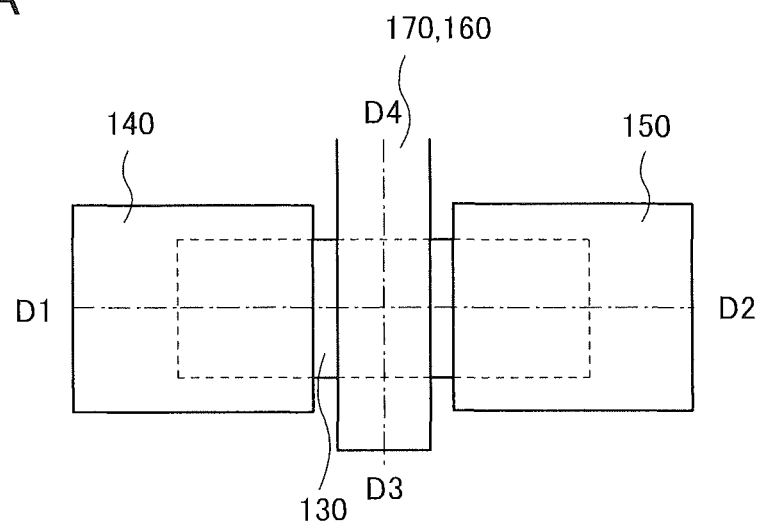
FIGS. 4A and 4B are a top view and a cross-sectional view illustrating one embodiment of a semiconductor device.
Figure 4B:
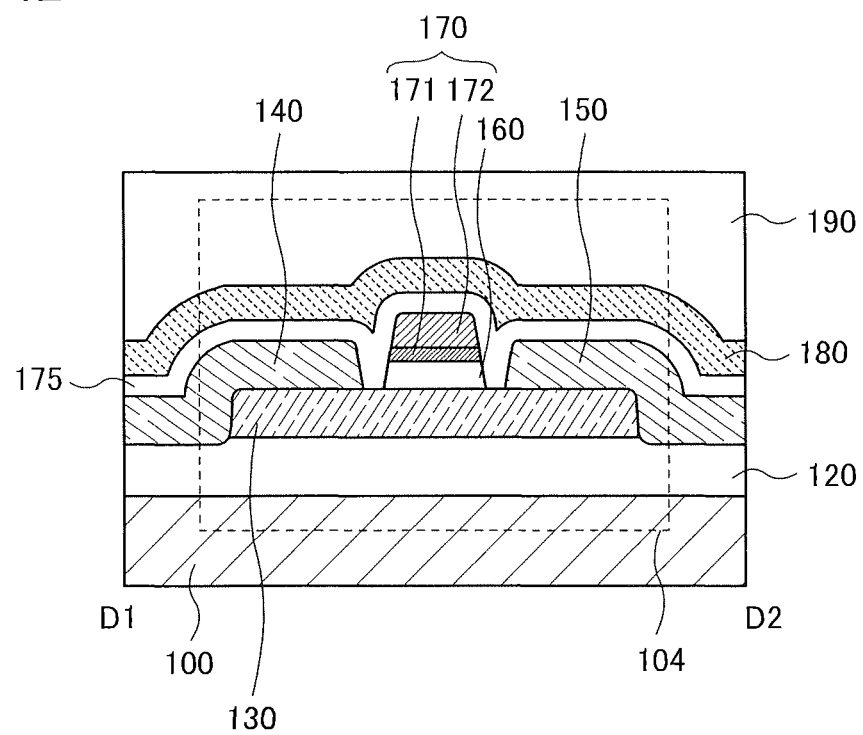

The transistor of one embodiment of the present invention may have a structure illustrated in FIGS. 4A and 4B. FIG. 4A is a top view of a transistor 104. A cross section in the direction of a dashed-dotted line D1-D2 in FIG. 4A is illustrated in FIG. 4B. A cross section in the direction of a dashed-dotted line D3-D4 in FIG. 4A is illustrated in FIG. 7A. The direction of the dashed-dotted line D1-D2 may be referred to as a channel length direction, and the direction of the dashed-dotted line D3-D4 may be referred to as a channel width direction.

The transistor 104 has the same structure as the transistor 103 except that the conductive layer 140 and the conductive layer 150 in contact with the oxide semiconductor layer 130 cover end portions thereof.

In the structures of FIG. 3B and FIG. 4B, the insulating layer 175 may be provided with an oxygen-excess region.

The transistor 103 and the transistor 104 each have a structure not including a region where the conductive layer 170 overlaps with each of the conductive layers 140 and 150. A transistor with such a structure, which has extremely small parasitic capacitance between a gate electrode layer and a source electrode layer and between the gate electrode layer and a drain electrode layer, is suitable for applications that require high-speed operation.

Modification Example 4 of Transistor

Figure 5A:
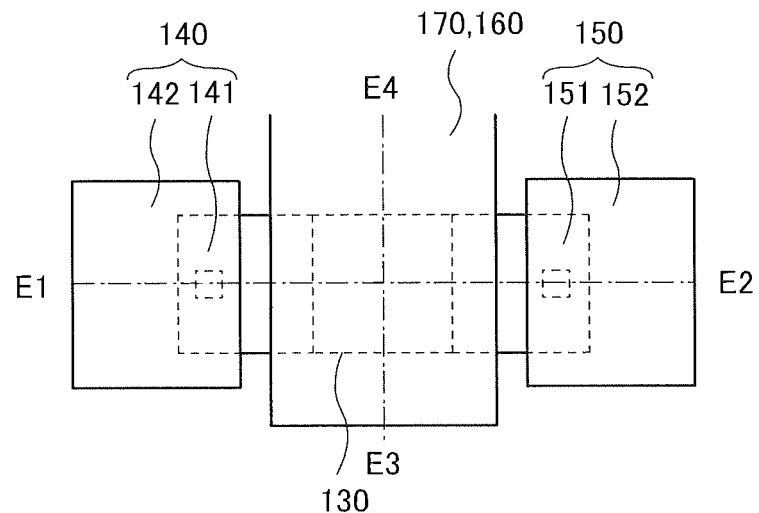
FIGS. 5A and 5B are a top view and a cross-sectional view illustrating one embodiment of a semiconductor device.
Figure 5B:
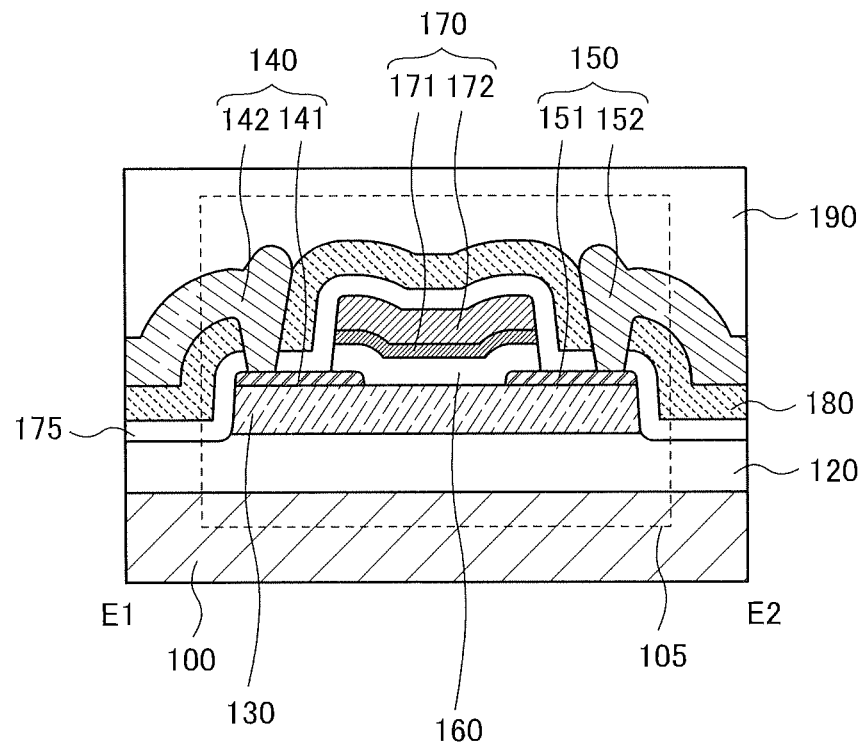

The transistor of one embodiment of the present invention may have a structure illustrated in FIGS. 5A and 5B. FIG. 5A is a top view of a transistor 105. A cross section in the direction of a dashed-dotted line E1-E2 in FIG. 5A is illustrated in FIG. 5B. A cross section in the direction of a dashed-dotted line E3-E4 in FIG. 5A is illustrated in FIG. 7A. The direction of the dashed-dotted line E1-E2 may be referred to as a channel length direction, and the direction of the dashed-dotted line E3-E4 may be referred to as a channel width direction.

The transistor 105 includes the insulating layer 120 over the substrate 100; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided, that openings provided in the insulating layer 175 and the insulating layer 180 are provided, and that the conductive layer 142 and the conductive layer 152 electrically connected to the conductive layer 141 and the conductive layer 151, respectively, through the openings are provided. The conductive layer 140 (the conductive layer 141 and the conductive layer 142) can function as a source electrode layer, and the conductive layer 150 (the conductive layer 151 and the conductive layer 152) can function as a drain electrode layer.

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Modification Example 5 of Transistor

Figure 6A:
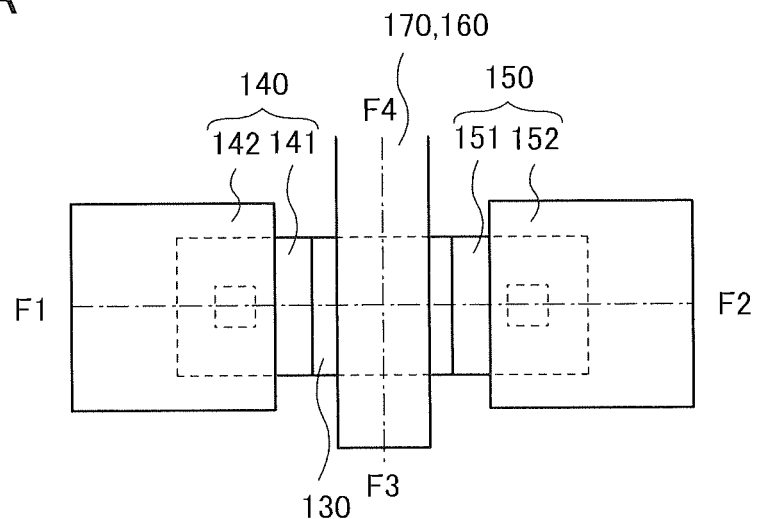
FIGS. 6A and 6B are a top view and a cross-sectional view illustrating one embodiment of a semiconductor device.
Figure 6B:
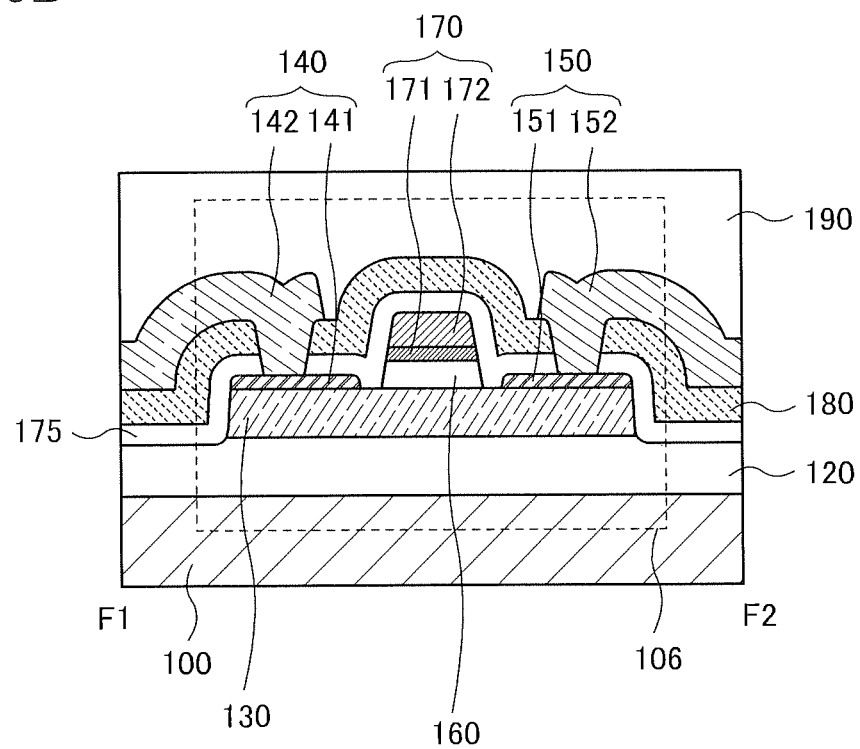

The transistor of one embodiment of the present invention may have a structure illustrated in FIGS. 6A and 6B. FIG. 6A is a top view of a transistor 106. A cross section in the direction of a dashed-dotted line F1-F2 in FIG. 6A is illustrated in FIG. 6B. A cross section in the direction of a dashed-dotted line F3-F4 in FIG. 6A is illustrated in FIG. 7A. The direction of the dashed-dotted line F1-F2 may be referred to as a channel length direction, and the direction of the dashed-dotted line F3-F4 may be referred to as a channel width direction.

The transistor 106 includes the insulating layer 120 over the substrate 100; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Structure Example 2 of Transistor

Figure 10A:
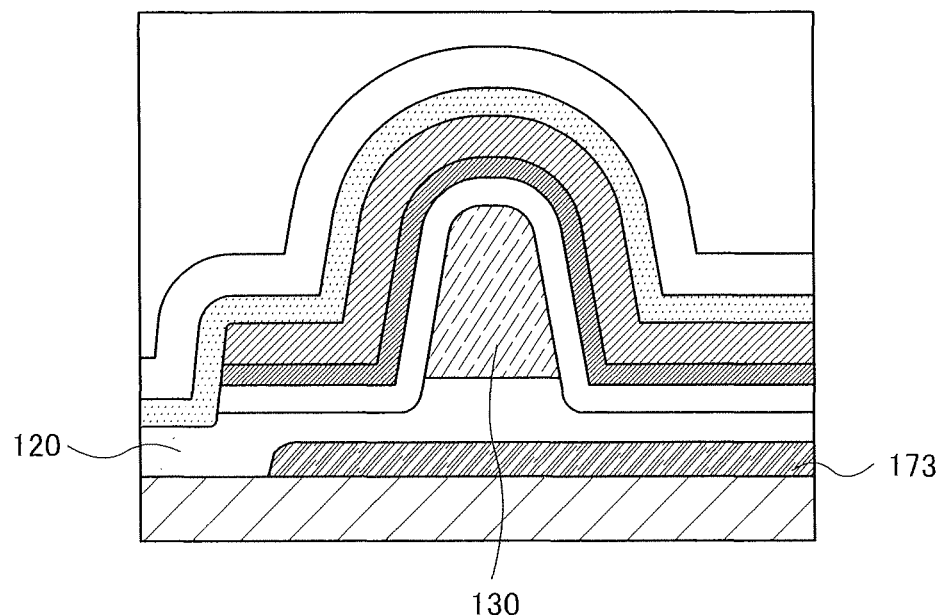
FIGS. 10A and 10B are cross-sectional views each illustrating one embodiment of a semiconductor device.
Figure 10B:
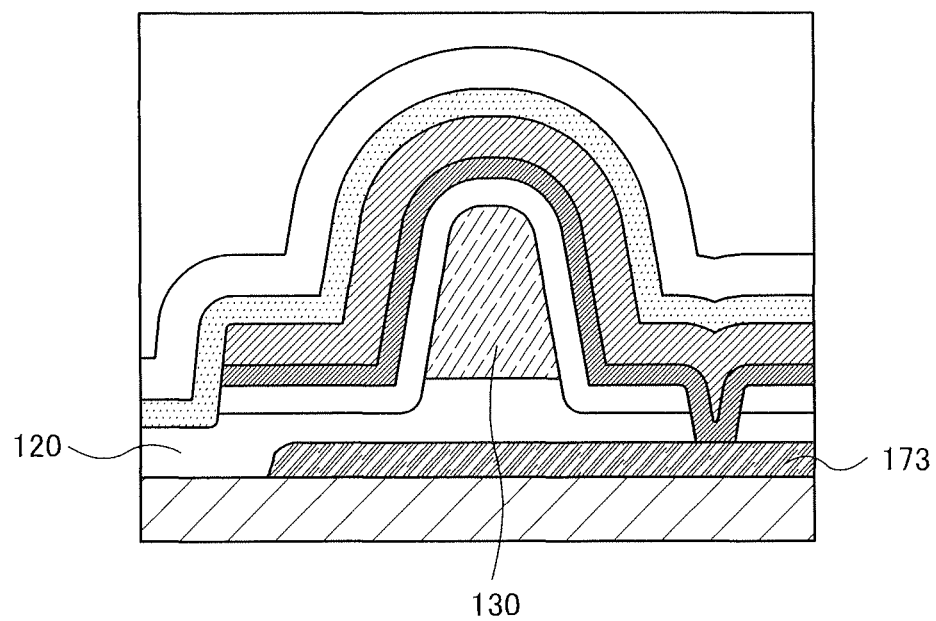

The transistor of one embodiment of the present invention may include a conductive layer 173 between the oxide semiconductor layer 130 and the substrate 100 as illustrated in the cross-sectional views in the channel length direction in FIGS. 8A to 8C and FIGS. 9A to 9C and the cross-sectional views in the channel width direction in FIGS. 10A and 10B. When the conductive layer 173 is used as a second gate electrode layer (back gate), the on-state current can be further increased or the threshold voltage can be controlled. In the cross-sectional views in FIGS. 8A to 8C and FIGS. 9A to 9C, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Further, to control the threshold voltage, a fixed potential, which is different from a potential of the conductive layer 170, is supplied to the conductive layer 173. To set the conductive layer 170 and the conductive layer 173 at the same potential, for example, as illustrated in FIG. 10B, the conductive layer 170 and the conductive layer 173 may be electrically connected to each other through an opening.

The transistors 101 to 106 shown in FIGS. 1A and 1B, FIGS. 2A and 2B, FIGS. 3A and 3B, FIGS. 4A and 4B, FIGS. 5A and 5B, FIGS. 6A and 6B, FIGS. 7A and 7B, FIGS. 8A to 8C, and FIGS. 9A to 9C are examples in which the oxide semiconductor layer 130 has a single-layer structure; alternatively, the oxide semiconductor layer 130 may be a stacked-layer structure. The oxide semiconductor layer 130 in the transistors 101 to 106 can be replaced with the oxide semiconductor layer 130 illustrated in FIGS. 11A to 11C or FIGS. 12A to 12C.

Figure 11A:
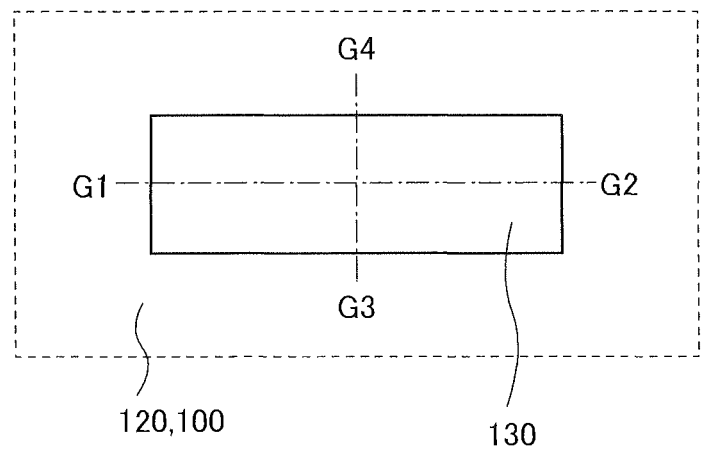
FIG. 11A is a top view.
Figure 11B:
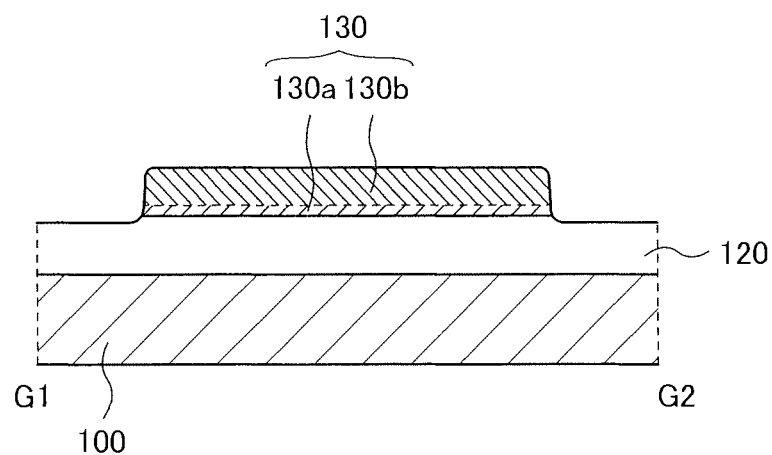
FIGS. 11B and 11C are cross-sectional views of an example of a manufacturing process of a semiconductor device.
Figure 11C:
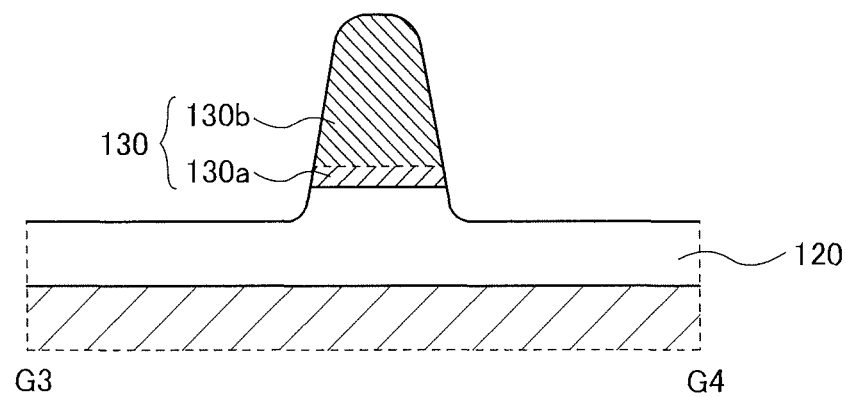

FIGS. 11A to 11C are a top view and cross-sectional views of the oxide semiconductor layer 130 with a two-layer structure. FIG. 11A is the top view. A cross section in the direction of a dashed-dotted line G1-G2 in FIG. 11A is illustrated in FIG. 11B. A cross section in the direction of a dashed-dotted line G3-G4 in FIG. 11A is illustrated in FIG. 11C.

Figure 12A:
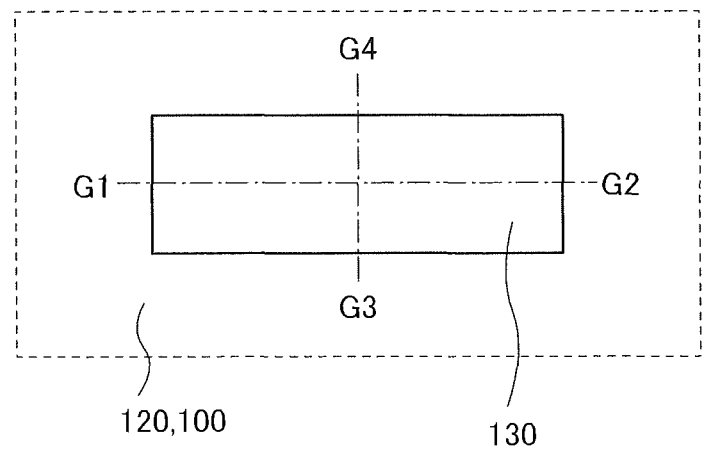
FIG. 12A is a top view.
Figure 12B:
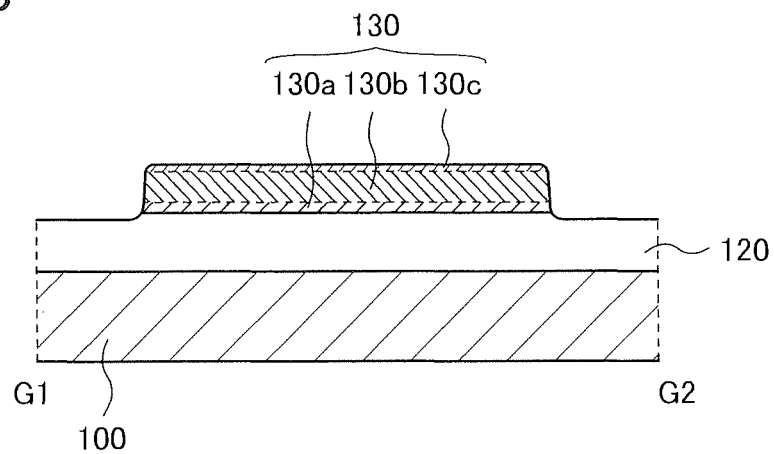
FIGS. 12B and 12C are cross-sectional views of an example of a manufacturing process of a semiconductor device.
Figure 12C:
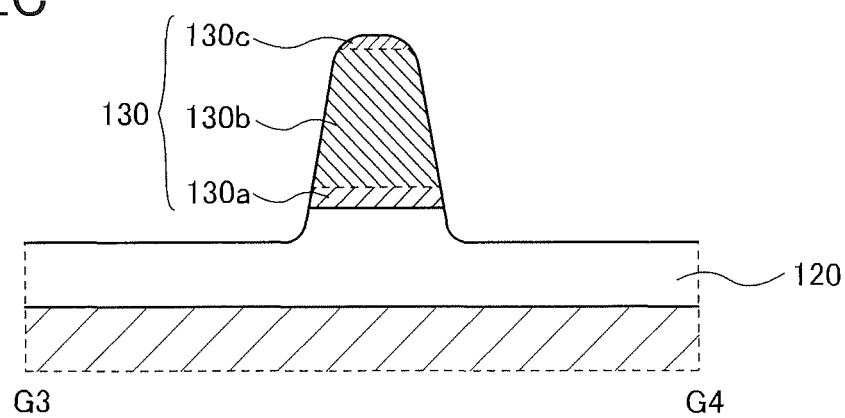

FIGS. 12A to 12C are a top view and cross-sectional views of the oxide semiconductor layer 130 with a three-layer structure. FIG. 12A is the top view. A cross section in the direction of a dashed-dotted line G1-G2 in FIG. 12A is illustrated in FIG. 12B. A cross section in the direction of a dashed-dotted line G3-G4 in FIG. 12A is illustrated in FIG. 12C.

Oxide semiconductor layers with different compositions, for example, can be used as an oxide semiconductor layer 130a, an oxide semiconductor layer 130b, and an oxide semiconductor layer 130c.

Modification Example 6 of Transistor

Figure 13A:
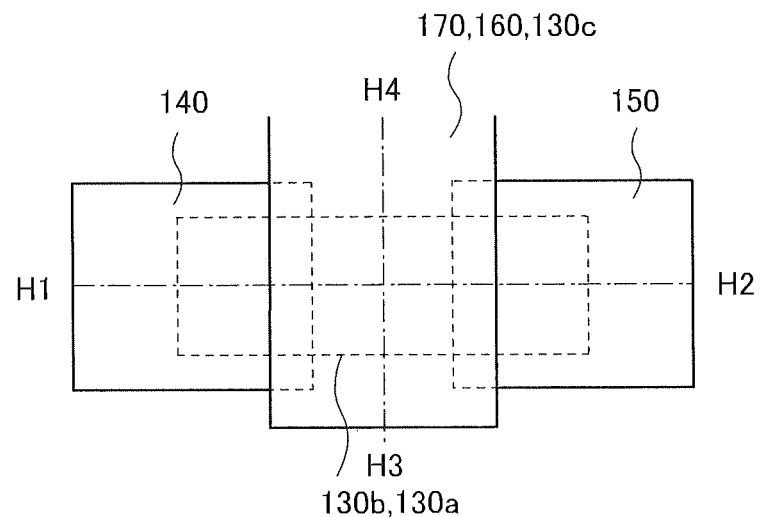
FIGS. 13A and 13B are a top view and a cross-sectional view illustrating one embodiment of a semiconductor device.
Figure 13B:
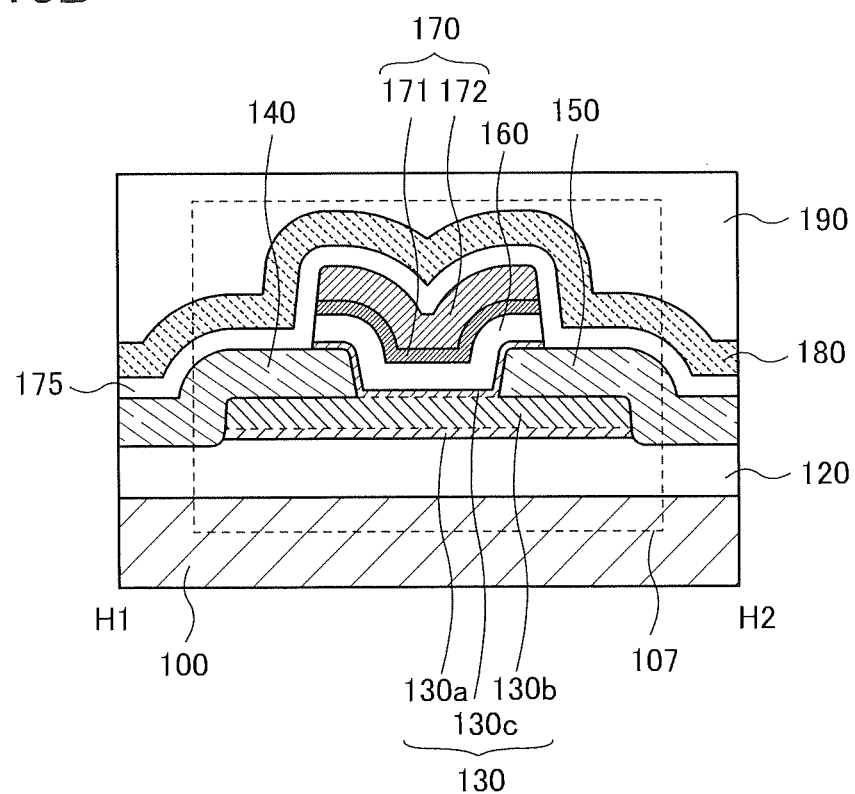
Figure 19A:
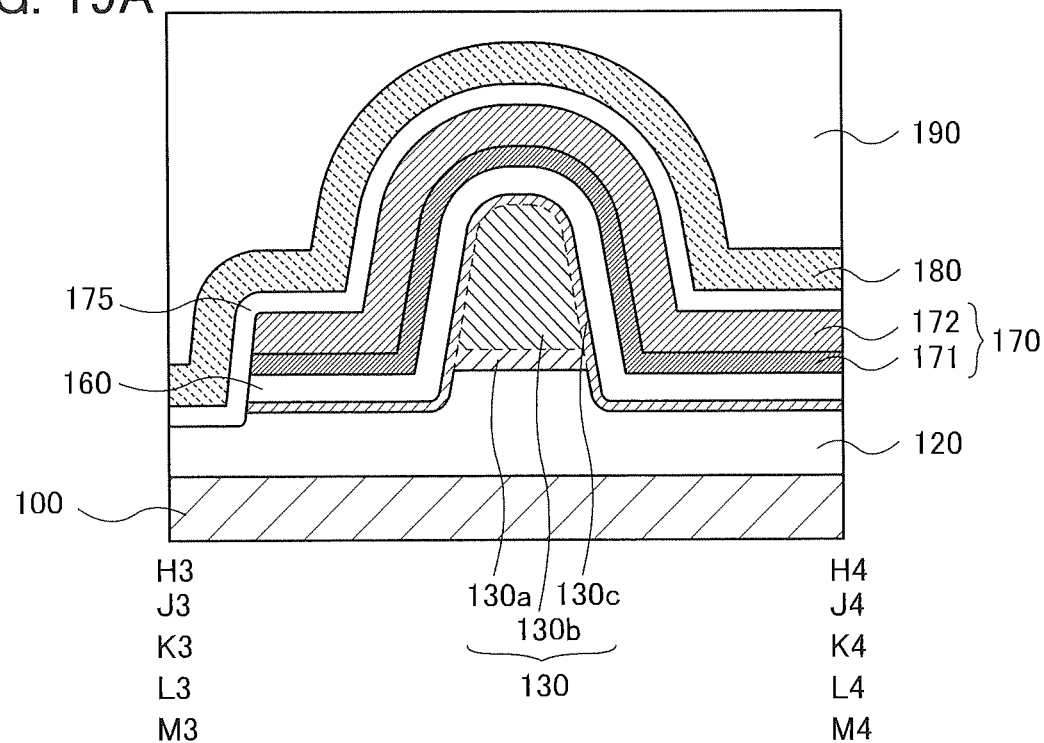
FIGS. 19A and 19B are cross-sectional views each illustrating one embodiment of a semiconductor device.

The transistor of one embodiment of the present invention may have a structure illustrated in FIGS. 13A and 13B. FIG. 13A is a top view of a transistor 107. A cross section in the direction of a dashed-dotted line H1-H2 in FIG. 13A is illustrated in FIG. 13B. A cross section in the direction of a dashed-dotted line H3-H4 in FIG. 13A is illustrated in FIG. 19A. The direction of the dashed-dotted line H1-H2 may be referred to as a channel length direction, and the direction of the dashed-dotted line H3-H4 may be referred to as a channel width direction.

The transistor 107 includes the insulating layer 120 over the substrate 100; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The transistor 107 may also include, for example, the insulating layer 190 (planarization film) in contact with the insulating layer 180 as necessary.

Modification Example 7 of Transistor

Figure 14A:
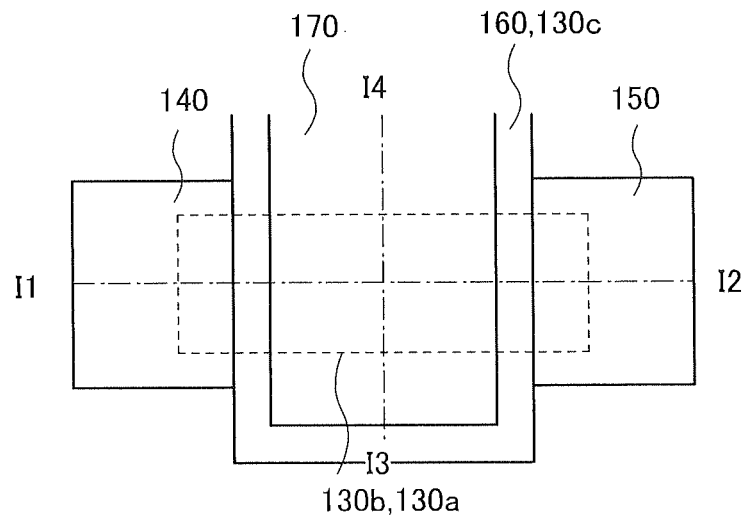
FIGS. 14A and 14B are a top view and a cross-sectional view illustrating one embodiment of a semiconductor device.
Figure 14B:
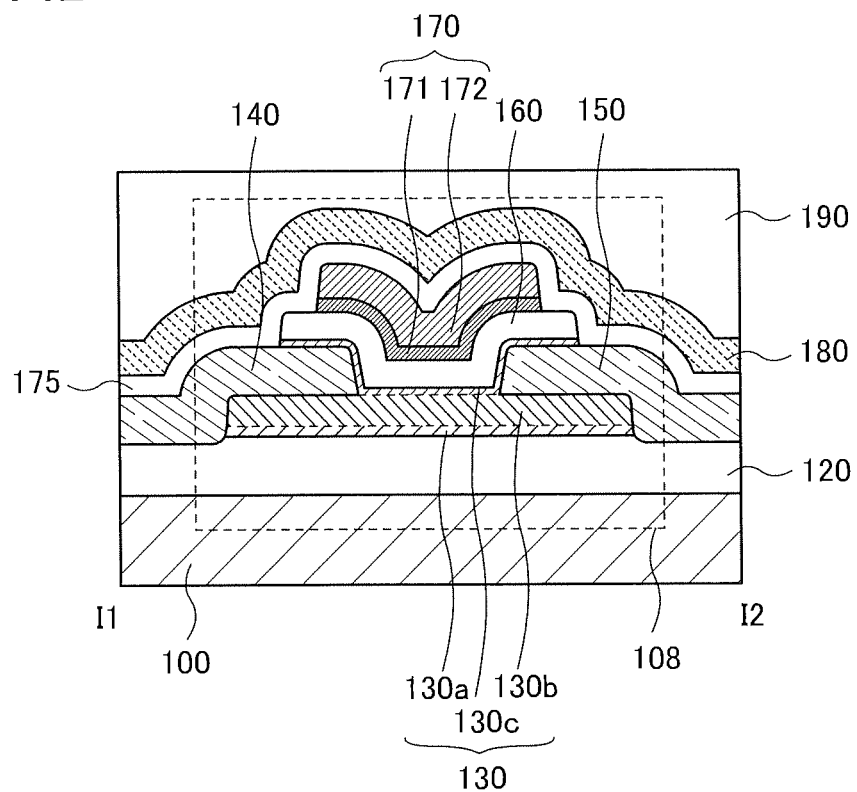
Figure 19B:
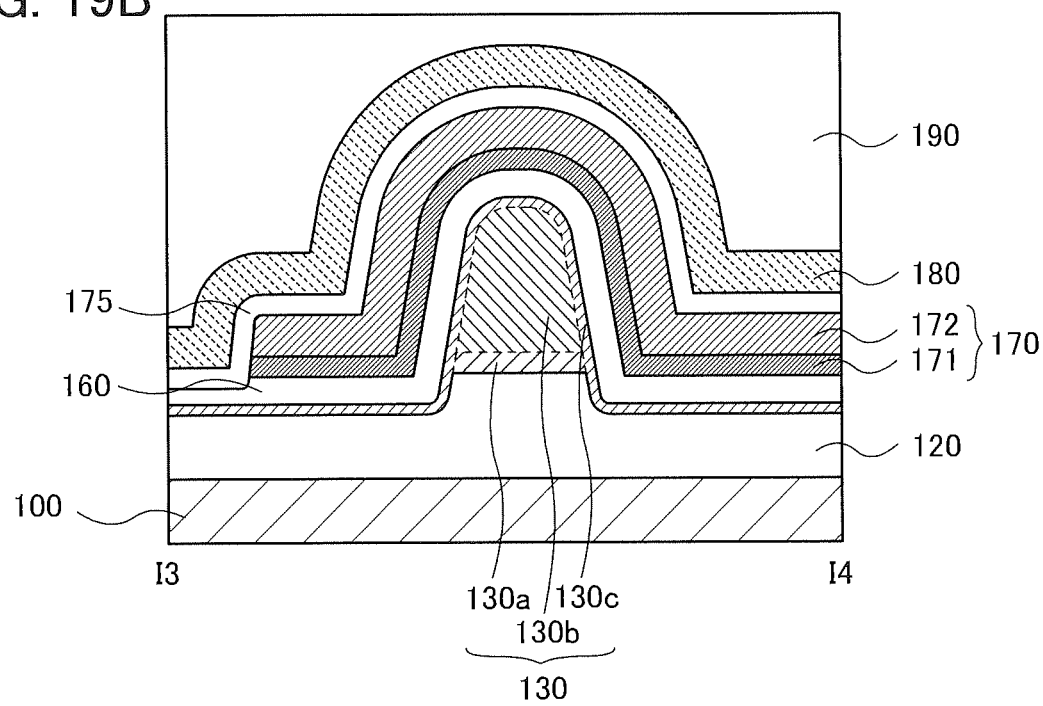
Figure 20A:
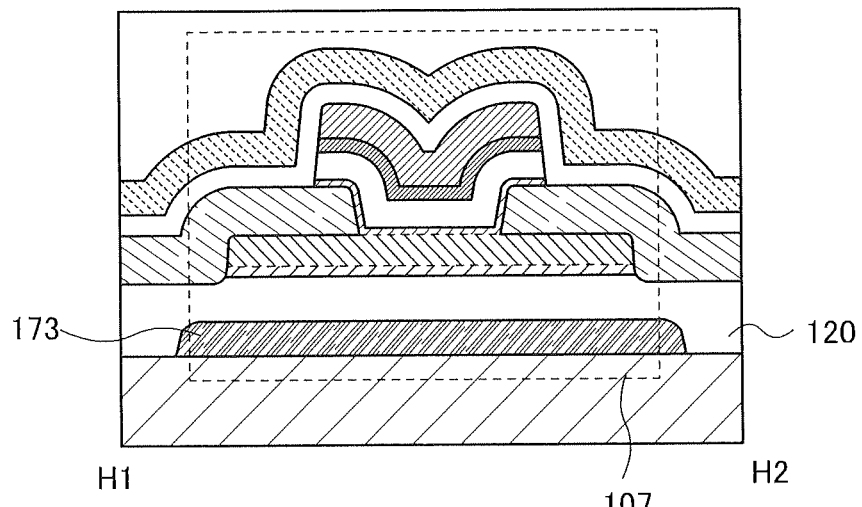
FIGS. 20A to 20C are cross-sectional views each illustrating one embodiment of a semiconductor device.
Figure 20B:
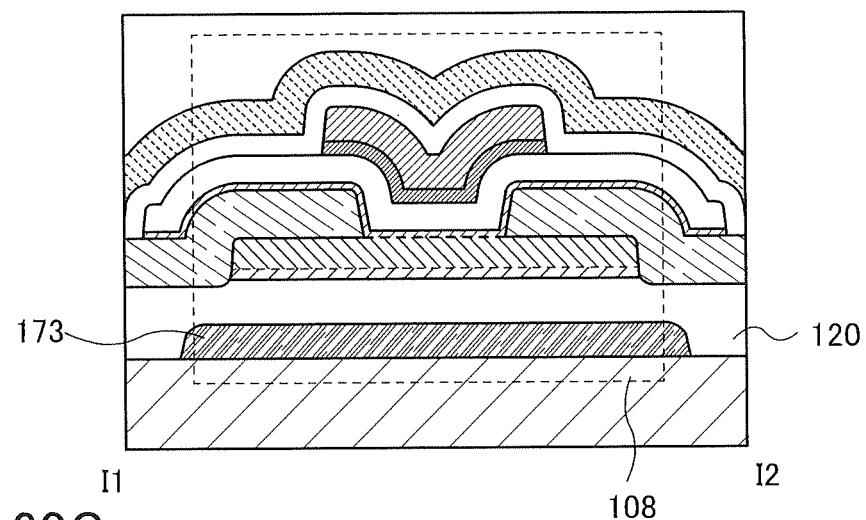
Figure 20C:
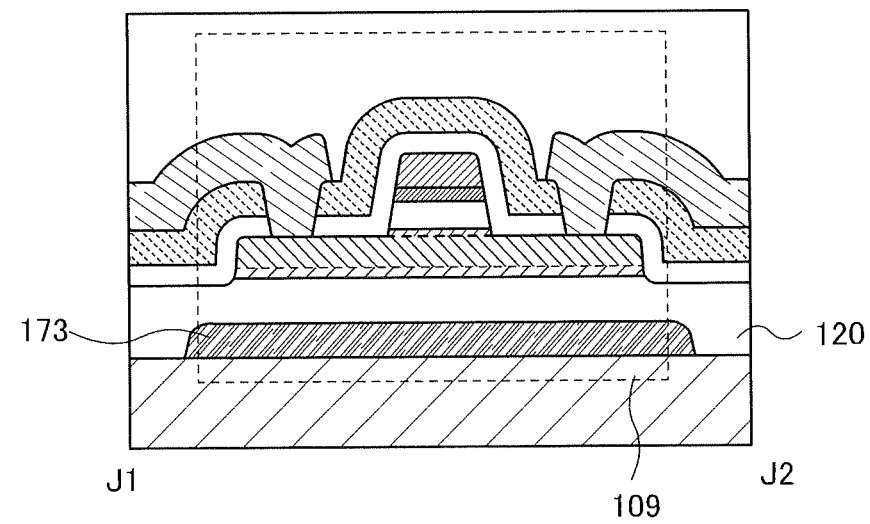
Figure 21A:
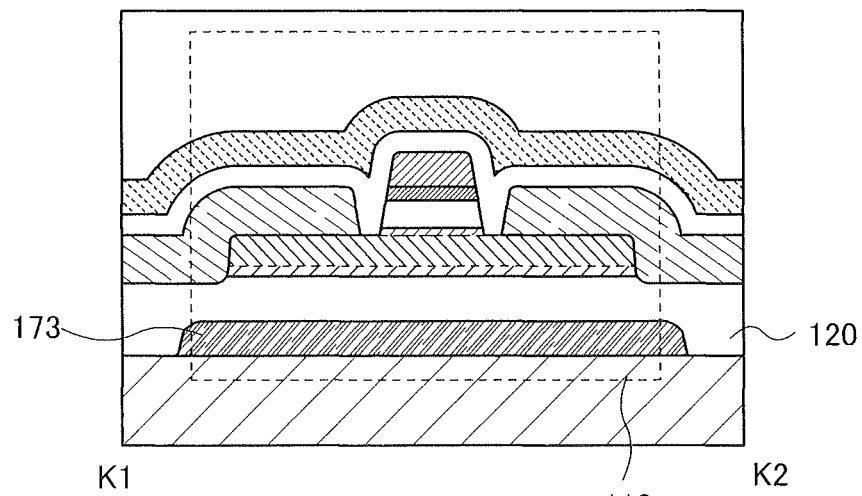
FIGS. 21A to 21C are cross-sectional views each illustrating one embodiment of a semiconductor device.
Figure 21B:
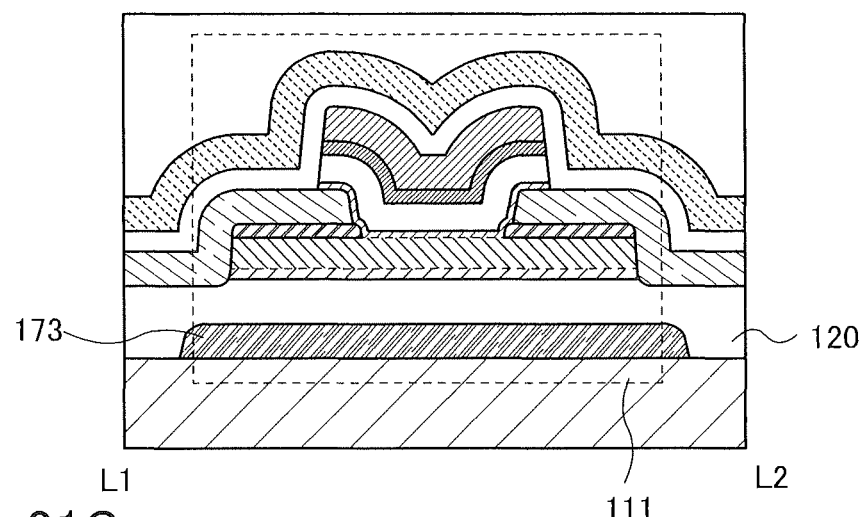
Figure 21C:
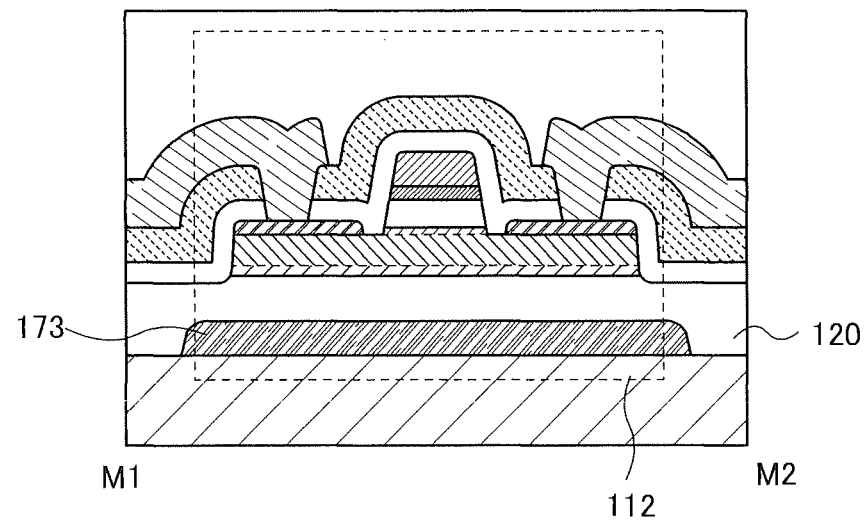

The transistor of one embodiment of the present invention may have a structure illustrated in FIGS. 14A and 14B. FIG. 14A is a top view of a transistor 108. A cross section in the direction of a dashed-dotted line I1-I2 in FIG. 14A is illustrated in FIG. 14B. A cross section in the direction of a dashed-dotted line I3-I4 in FIG. 14A is illustrated in FIG. 19B. The direction of the dashed-dotted line I1-I2 may be referred to as a channel length direction, and the direction of the dashed-dotted line I3-I4 may be referred to as a channel width direction.

The transistor 108 has the same structure as the transistor 102 except that the oxide semiconductor layer 130 includes two layers (the oxide semiconductor layer 130a and the oxide semiconductor layer 130b), that the oxide semiconductor layer 130 includes three layers (the oxide semiconductor layer 130a, the oxide semiconductor layer 130b, and the oxide semiconductor layer 130c), that part of the oxide semiconductor layer (the oxide semiconductor layer 130c) exists between the insulating layer 160 and the conductive layers 140 and 150, and that a gate electrode is formed smaller than a gate insulating film.

Modification Example 8 of Transistor

Figure 15A:
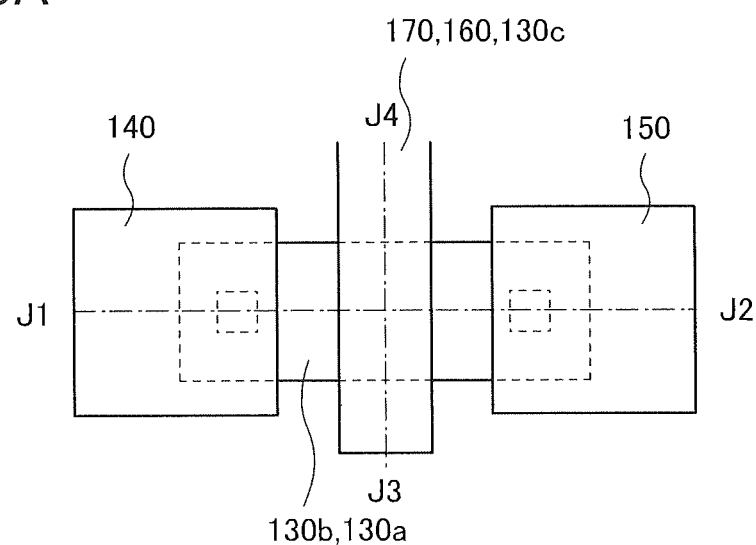
FIGS. 15A and 15B are a top view and a cross-sectional view illustrating one embodiment of a semiconductor device.
Figure 15B:
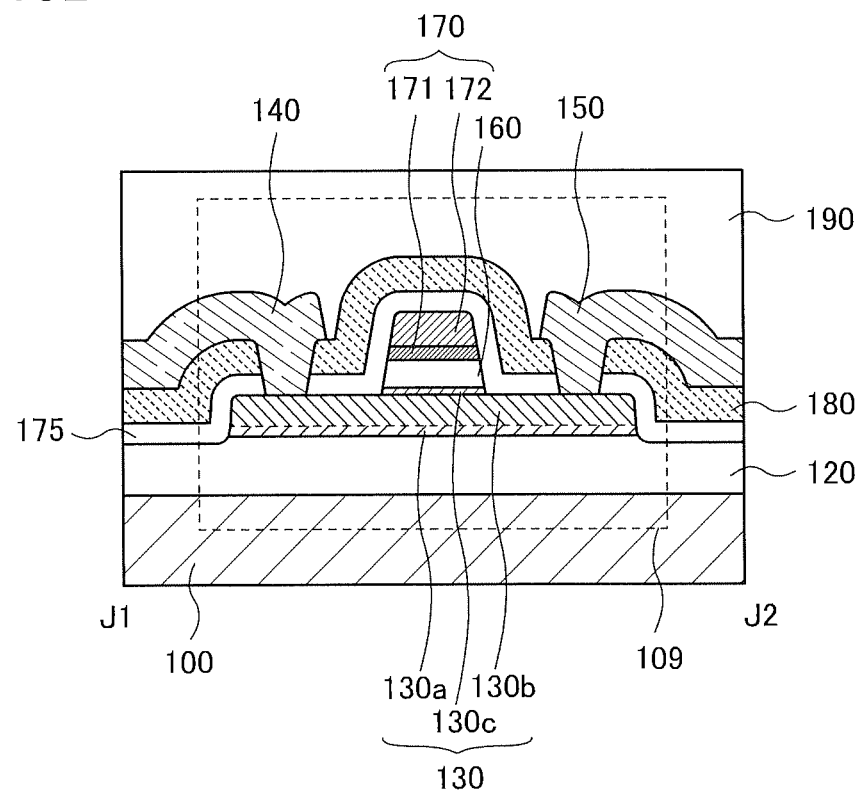

The transistor of one embodiment of the present invention may have a structure illustrated in FIGS. 15A and 15B. FIG. 15A is a top view of a transistor 109. A cross section in the direction of a dashed-dotted line J1-J2 in FIG. 15A is illustrated in FIG. 15B. A cross section in the direction of a dashed-dotted line J3-J4 in FIG. 15A is illustrated in FIG. 19A. The direction of the dashed-dotted line J1-J2 may be referred to as a channel length direction, and the direction of the dashed-dotted line J3-J4 may be referred to as a channel width direction.

The transistor 109 includes the insulating layer 120 over the substrate 100; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160;

the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. The transistor 109 may also include, for example, the insulating layer 190 (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130a and the oxide semiconductor layer 130b) and that the oxide semiconductor layer 130 includes three layers (the oxide semiconductor layer 130a, the oxide semiconductor layer 130b, and the oxide semiconductor layer 130c).

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Modification Example 9 of Transistor

Figure 16A:
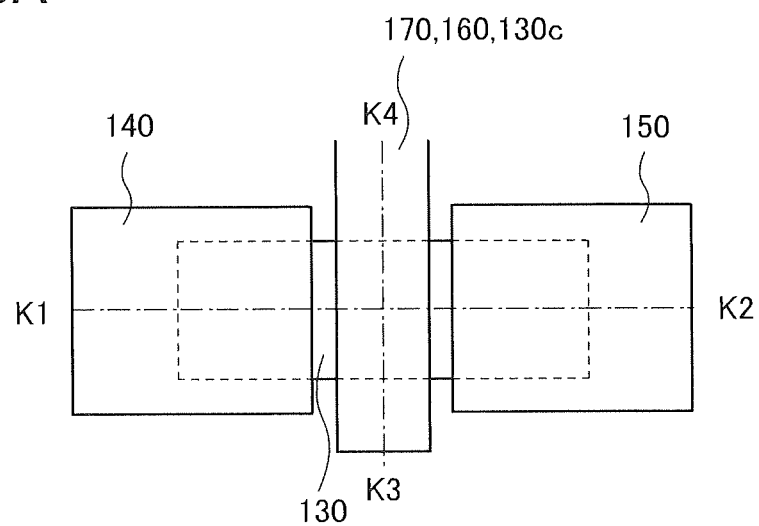
FIGS. 16A and 16B are a top view and a cross-sectional view illustrating one embodiment of a semiconductor device.
Figure 16B:
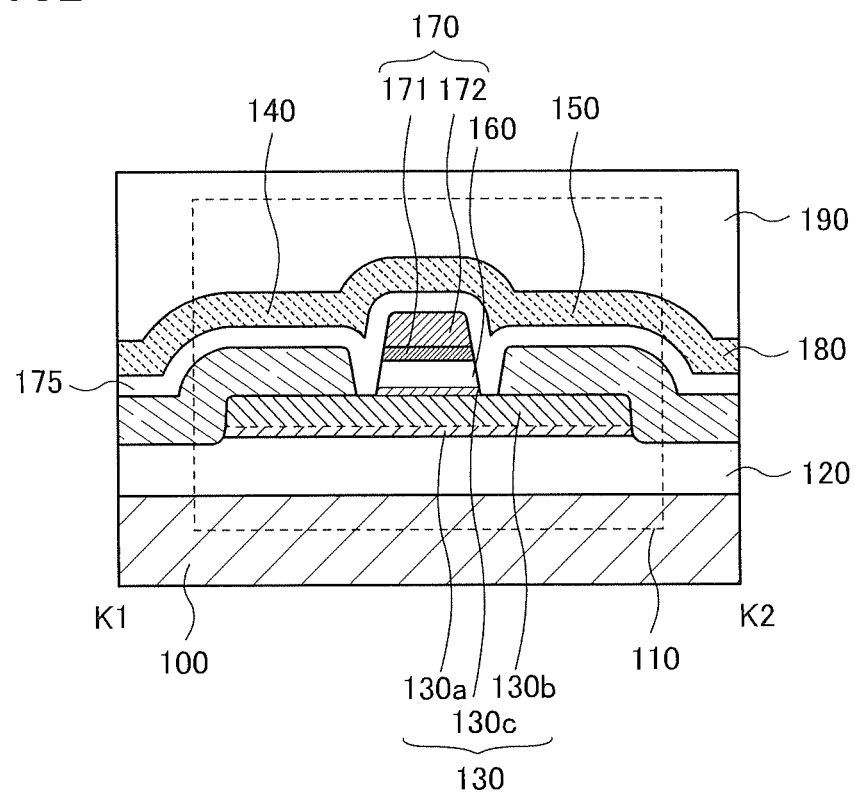

The transistor of one embodiment of the present invention may have a structure illustrated in FIGS. 16A and 16B. FIG. 16A is a top view of a transistor 110. A cross section in the direction of a dashed-dotted line K1-K2 in FIG. 16A is illustrated in FIG. 16B. A cross section in the direction of a dashed-dotted line K3-K4 in FIG. 16A is illustrated in FIG. 19A. The direction of the dashed-dotted line K1-K2 may be referred to as a channel length direction, and the direction of the dashed-dotted line K3-K4 may be referred to as a channel width direction.

The transistor 110 has the same structure as the transistor 104 except that the oxide semiconductor layer 130 includes two layers (the oxide semiconductor layer 130a and the oxide semiconductor layer 130b) and that the oxide semiconductor layer 130 includes three layers (the oxide semiconductor layer 130a, the oxide semiconductor layer 130b, and the oxide semiconductor layer 130c).

Modification Example 10 of Transistor

Figure 17A:
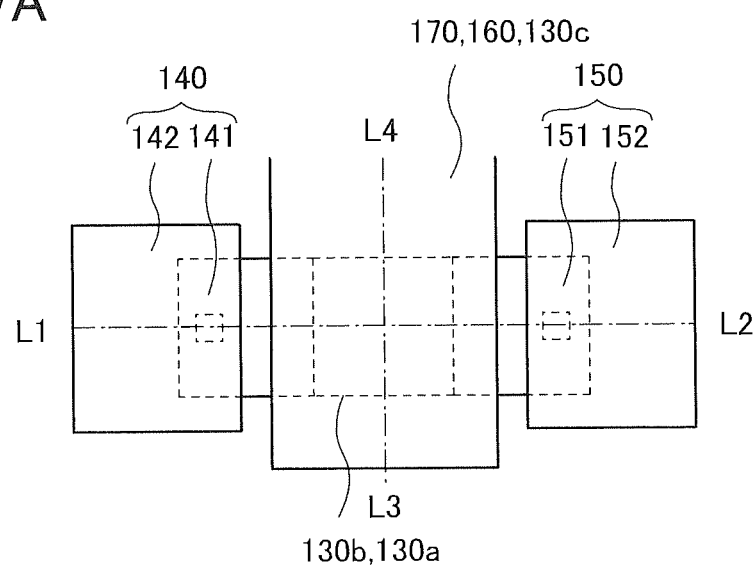
FIGS. 17A and 17B are a top view and a cross-sectional view illustrating one embodiment of a semiconductor device.
Figure 17B:
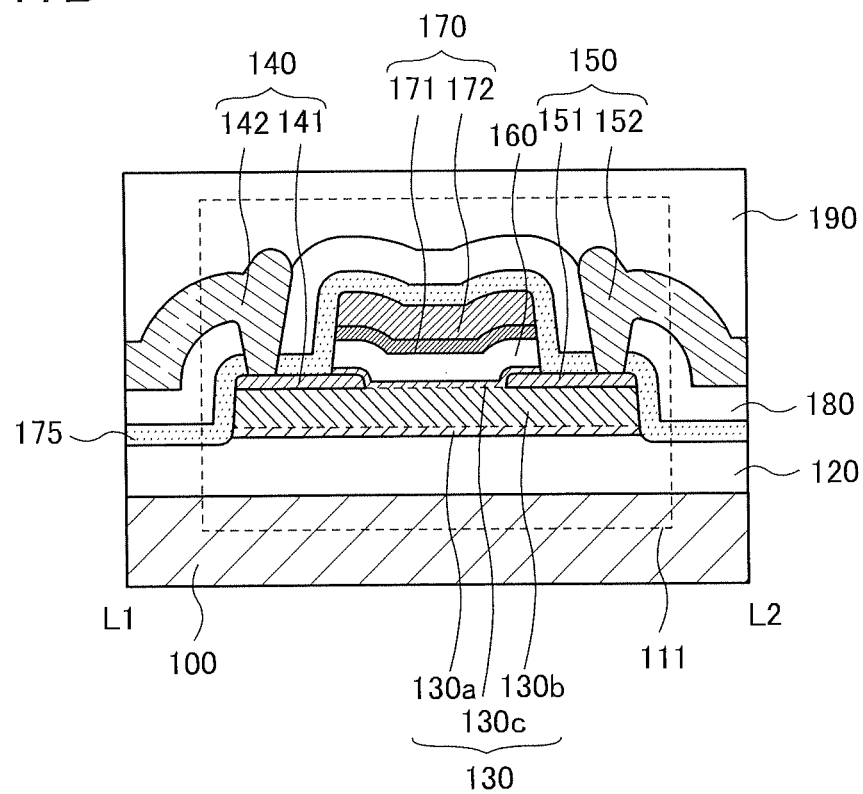

The transistor of one embodiment of the present invention may have a structure illustrated in FIGS. 17A and 17B. FIG. 17A is a top view of a transistor 111. A cross section in the direction of a dashed-dotted line L1-L2 in FIG. 17A is illustrated in FIG. 17B. A cross section in the direction of a dashed-dotted line L3-L4 in FIG. 17A is illustrated in FIG. 19A. The direction of the dashed-dotted line L1-L2 may be referred to as a channel length direction, and the direction of the dashed-dotted line L3-L4 may be referred to as a channel width direction.

The transistor 111 includes the insulating layer 120 over the substrate 100; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, the insulating layer 190 (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130a and the oxide semiconductor layer 130b), that the oxide semiconductor layer 130 includes three layers (the oxide semiconductor layer 130a, the oxide semiconductor layer 130b, and the oxide semiconductor layer 130c), and that part of the oxide semiconductor layer (the oxide semiconductor layer 130c) exists between the insulating layer 160 and the conductive layers 141 and 151.

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Modification Example 11 of Transistor

Figure 18A:
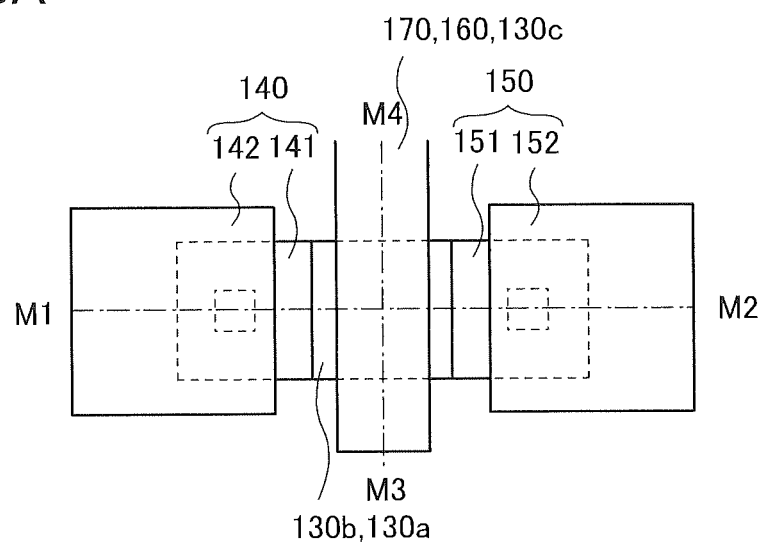
FIGS. 18A and 18B are a top view and a cross-sectional view illustrating one embodiment of a semiconductor device.
Figure 18B:
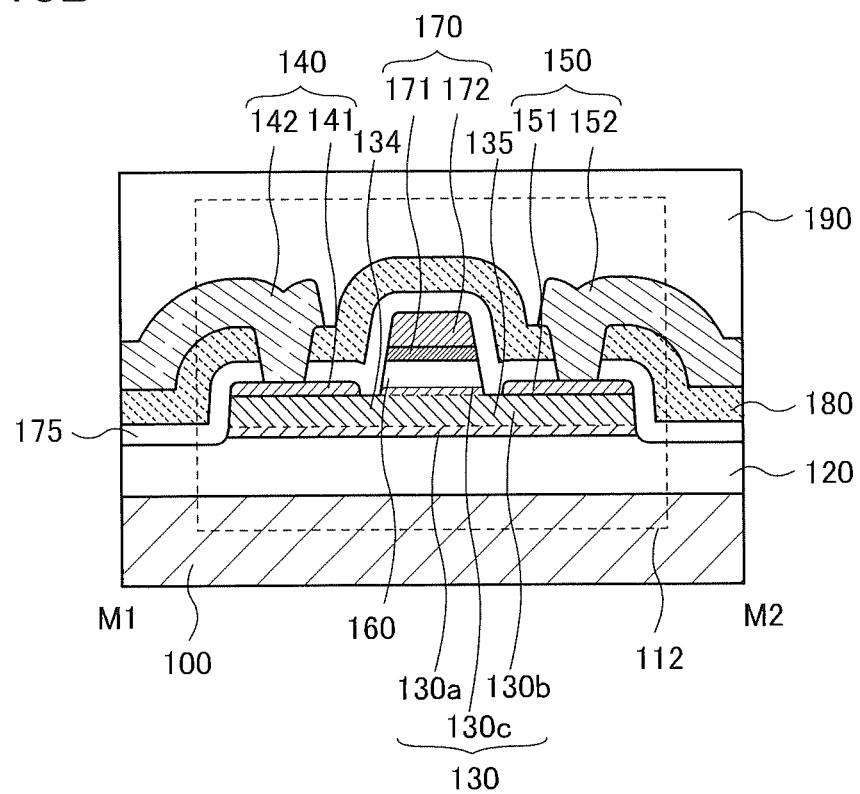

The transistor of one embodiment of the present invention may have a structure illustrated in FIGS. 18A and 18B. FIG. 18A is a top view of a transistor 112. A cross section in the direction of a dashed-dotted line M1-M2 in FIG. 18A is illustrated in FIG. 18B. A cross section in the direction of a dashed-dotted line M3-M4 in FIG. 18A is illustrated in FIG. 19A. The direction of the dashed-dotted line M1-M2 may be referred to as a channel length direction, and the direction of the dashed-dotted line M3-M4 may be referred to as a channel width direction.

The transistor 112 has the same structure as the transistor 106 except that the oxide semiconductor layer 130 includes two layers (the oxide semiconductor layer 130a and the oxide semiconductor layer 130b) and that the oxide semiconductor layer 130 includes three layers (the oxide semiconductor layer 130a, the oxide semiconductor layer 130b, and the oxide semiconductor layer 130c).

In the case where a metal material is used for the conductive layer 140 functioning as a source electrode layer and the conductive layer 150 functioning as a drain electrode layer, oxygen is extracted from the oxide semiconductor layer depending on the metal material. Therefore, this structure in which the conductive layer 140 and the conductive layer 150 are not in contact with the insulating layer 120 and the insulating layer 160 makes the insulating layer 120 and the insulating layer 160 less likely to be deprived of oxygen by the conductive layer 140 and the conductive layer 150 and facilitate oxygen supply from the insulating layer 120 to the oxide semiconductor layer 130.

Structure Example 3 of Transistor

Figure 22A:
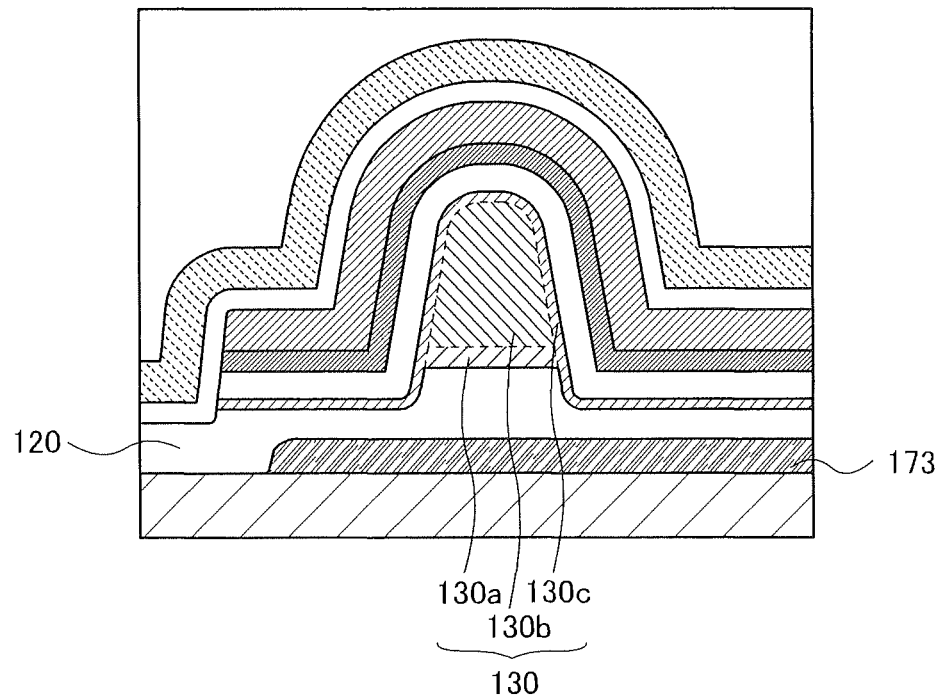
FIGS. 22A and 22B are cross-sectional views each illustrating one embodiment of a semiconductor device.
Figure 22B:
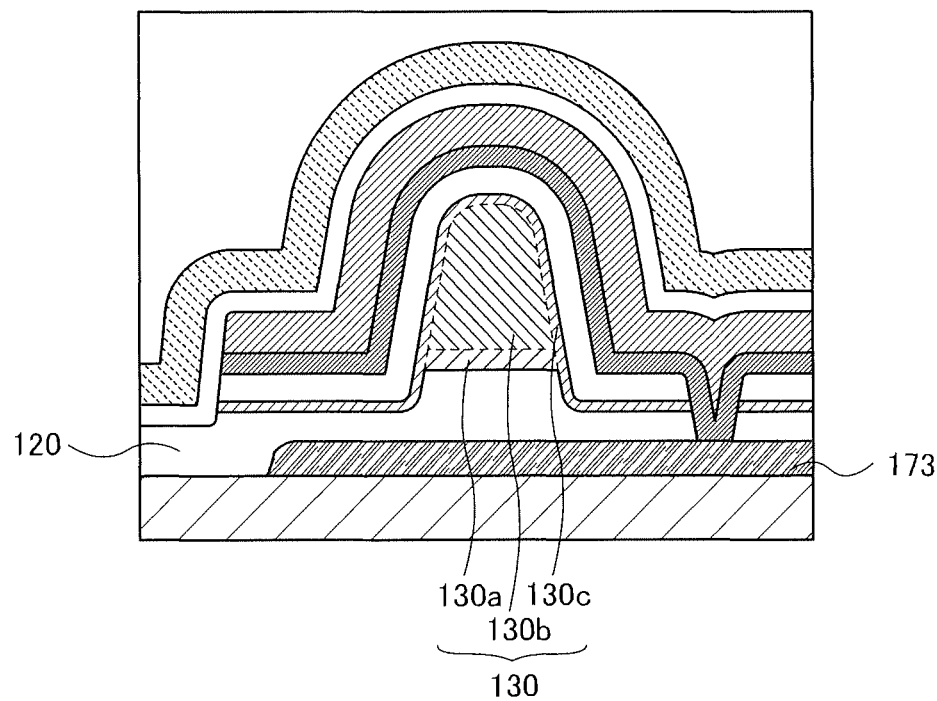

The transistor of one embodiment of the present invention may include the conductive layer 173 between the oxide semiconductor layer 130 and the substrate 100 as illustrated in the cross-sectional views in the channel length direction in FIGS. 20A to 20C and FIGS. 21A to 21C and the cross-sectional views in the channel width direction in FIGS. 22A and 22B. When the conductive layer 173 is used as a second gate electrode layer (back gate), the on-state current can be further increased or the threshold voltage can be controlled. In the cross-sectional views in FIGS. 20A to 20C and FIGS. 21A to 21C, the width of the conductive layer 173 may be shorter than that of the oxide semiconductor layer 130. Moreover, the width of the conductive layer 173 may be shorter than that of the conductive layer 170.

Figure 23A:
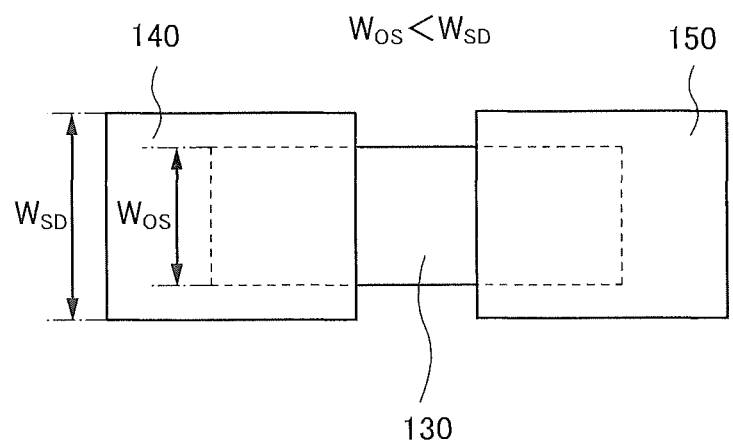
FIGS. 23A and 23B are top views each illustrating one embodiment of a semiconductor device.
Figure 23B:
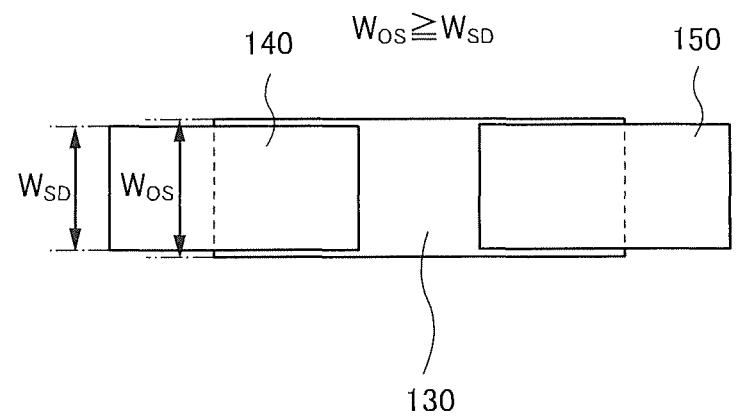

The conductive layer 140 (source electrode layer) and the conductive layer 150 (drain electrode layer) of the transistor of one embodiment of the present invention may have any of structures illustrated in top views of FIGS. 23A and 23B. Note that FIGS. 23A and 23B each illustrate only the oxide semiconductor layer 130, the conductive layer 140, and the conductive layer 150. As illustrated in FIG. 23A, the width ($W_{SD}$) of the conductive layers 140 and 150 may be larger than the width ($W_{OS}$) of the oxide semiconductor layer 130. Alternatively, as illustrated in FIG. 23B, $W_{SD}$ may be smaller than $W_{OS}$. When $W_{OS}$ is greater than or equal to $W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130a and the oxide semiconductor layer 130b and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, a channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are calculated, a surrounded channel width may be used for the calculation. In that case, a value might be different from one calculated by using an effective channel width.

In this embodiment, one embodiment of the present invention has been described. Other embodiments of the present invention are described in Embodiments 2 to 10.

Note that one embodiment of the present invention is not limited to the above examples. Although an example in which the case where the insulating layer 120 below the oxide semiconductor layer 130 or the insulating layer 160 above the oxide semiconductor layer 130 contains excess oxygen is described as one embodiment of the present invention, one embodiment of the present invention is not limited thereto. Depending on circumstances or conditions, another layer may contain excess oxygen in one embodiment of the present invention. Alternatively, depending on circumstances or conditions, the insulating layer 120 below the oxide semiconductor layer 130 or the insulating layer 160 above the oxide semiconductor layer 130 does not necessarily contain excess oxygen in one embodiment of the present invention.

This embodiment can be combined as appropriate with any of the other embodiments and examples in this specification.

Embodiment 2

In this embodiment, components of the transistors 101 to 112 described in Embodiment 1 will be described in detail.

The substrate 100 includes a silicon substrate provided with a transistor, and an insulating layer and a conductor functioning as a wiring which are provided over the silicon substrate.

Although there is no particular limitation on a material and the like of the substrate 100, it is necessary that the substrate have heat resistance high enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 100. Furthermore, any of these substrates further provided with a semiconductor element may be used as the substrate 100. In the case where a glass substrate is used as the substrate 100, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 100, and the transistor may be provided directly on the flexible substrate. Alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well.

The insulating layer 120 may have a function of supplying oxygen to the oxide semiconductor layer 130 as well as a function of preventing diffusion of impurities from components included in the substrate 100. For this reason, the insulating layer 120 is preferably an insulating film containing oxygen and further preferably, an insulating film including a region containing oxygen more than its stoichiometric composition. For example, the insulating layer 120 is preferably a film in which the amount of released oxygen converted into oxygen atoms is $1.0 \times 10^{19}$ atoms/cm$^3$ or more in thermal desorption spectroscopy (TDS) analysis performed such that the surface temperature is higher than or equal to 100° C. and lower than or equal to 700° C., preferably higher than or equal to 100° C. and lower than or equal to 500° C. In the case where the substrate 100 is provided with another device, the insulating layer 120 also has a function as an interlayer insulating film. In that case, the insulating layer 120 is preferably subjected to planarization treatment such as chemical mechanical polishing (CMP) treatment so as to have a flat surface. Note that at the planarization treatment, the top surface of the insulating layer 120 may be removed such that the concentration of a rare gas which is an impurity is less than or equal to $1 \times 10^{19}$ atoms/cm$^3$, preferably less than $7 \times 10^{18}$ atoms/cm$^3$ in the insulating layer 120.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these oxides. The insulating layer 120 may be a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b, which is described in this embodiment, is used.

In the case where the oxide semiconductor layer 130 has a two-layer structure, a stack in which a layer corresponding to the oxide semiconductor layer 130b and a layer corresponding to the oxide semiconductor layer 130c are stacked in this order from the insulating layer 120 side, which is described in this embodiment, is used. In such a case, the oxide semiconductor layer 130b and the oxide semiconductor layer 130c can be replaced with each other.

In the case where the oxide semiconductor layer 130 has a stacked-layer structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (an energy gap) from an energy difference between the vacuum level and the valence band maximum (an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with an interface between the oxide semiconductor layer 130b and the insulating layer 120 on the assumption that the oxide semiconductor layer 130b is in contact with the insulating layer 120. The interface state tends to form a channel; therefore, the threshold voltage of the transistor might be changed. Thus, with the oxide semiconductor layer 130a, fluctuations in electrical characteristics of the transistor, such as a threshold voltage, can be reduced. Further, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with an interface between the oxide semiconductor layer 130b and the gate insulating layer (insulating layer 160) on the assumption that the oxide semiconductor layer 130b is in contact with the gate insulating layer. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio of any of the above metal elements in the oxide semiconductor layer 130a and the oxide semiconductor layer 130c is 1.5 times or more, preferably 2 times or more and further preferably 3 times or more as much as that in the oxide semiconductor layer 130b. Any of the above metal elements is strongly bonded to oxygen and thus has a function of suppressing generation of oxygen vacancy in the oxide semiconductor layer 130a and the oxide semiconductor layer 130c. That is, oxygen vacancy is difficult to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least In or Zn. Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an hi-Nd—Zn oxide, an hi-Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an hi-Yb—Zn oxide, an In—Lu—Zn oxide, an In—Sn-Ga—Zn oxide, an In—Hf-Ga—Zn oxide, an In-Al-Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $In_{1-a}M_{1+a}O_3(ZnO)_m$ ($-1 \leq a \leq 1$ is satisfied, and m is a natural number) may be used. Note that M represents one or more metal elements selected from Ga, Y, Zr, La, Ce, and Nd. Alternatively, a material represented by $In_2SnO_5(ZnO)_n$ (n is a natural number) may be used.

When each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more and further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than 50 atomic %, respectively, and further preferably less than 25 atomic % and greater than 75 atomic %, respectively. In the case where Zn and O are not taken into consideration, the proportion of In and the proportion of M in the oxide semiconductor layer 130b are preferably greater than 25 atomic % and less than 75 atomic %, respectively, and further preferably greater than or equal to 34 atomic % and less than 66 atomic %, respectively.

The indium content in the oxide semiconductor layer 130b is preferred to be higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is increased. Therefore, an oxide having the proportion of In higher than that of M has higher mobility than an oxide having the proportion of In equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm and further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm and further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm and further preferably greater than or equal to 3 nm and less than or equal to 15 nm. The oxide semiconductor layer 130b is preferably thicker than the oxide semiconductor layer 130a and the oxide semiconductor layer 130c.

Note that in order that a transistor in which an oxide semiconductor layer serves as a channel has stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density which is lower than $1 \times 10^{17}/cm^3$, preferably lower than $1 \times 10^{15}/cm^3$ and further preferably lower than $1 \times 10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to form an intrinsic or substantially intrinsic oxide semiconductor layer, in SIMS (secondary ion mass spectrometry) analysis, for example, the concentration of silicon at a certain depth of the oxide semiconductor layer or in a certain region of the oxide semiconductor layer is higher than or equal to $1 \times 10^{17}$ atoms/$cm^3$ and lower than $1 \times 10^{19}$ atoms/$cm^3$, preferably lower than $5 \times 10^{18}$ atoms/$cm^3$ and further preferably lower than $1 \times 10^{18}$ atoms/$cm^3$. Further, the concentration of hydrogen at a certain depth of the oxide semiconductor layer or in a certain region of the oxide semiconductor layer is higher than or equal to $5 \times 10^{17}$ atoms/$cm^3$ and lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, and still further preferably lower than or equal to $5 \times 10^{18}$ atoms/$cm^3$. Further, the concentration of nitrogen at a certain depth of the oxide semiconductor layer or in a certain region of the oxide semiconductor layer is higher than or equal to $5 \times 10^{16}$ atoms/$cm^3$ and lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, and still further preferably lower than or equal to $5 \times 10^{17}$ atoms/$cm^3$.

In the case where the oxide semiconductor layer includes crystals, increase in concentration of silicon or carbon might reduce the crystallinity of the oxide semiconductor layer. In order to avoid the reduction of the crystallinity of the oxide semiconductor layer, for example, the concentration of silicon in a region of the oxide semiconductor layer is lower than $1 \times 10^{19}$ atoms/$cm^3$, preferably lower than $5 \times 10^{18}$ atoms/$cm^3$ and further preferably lower than $1 \times 10^{18}$ atoms/$cm^3$. Further, the concentration of carbon in a region of the oxide semiconductor layer is lower than $1 \times 10^{19}$ atoms/$cm^3$, preferably lower than $5 \times 10^{18}$ atoms/$cm^3$ and further preferably lower than $1 \times 10^{18}$ atoms/$cm^3$, for example.

As described above, a transistor in which a highly purified oxide semiconductor film is used for a channel formation region has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced. From the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, the transistor can have high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shape well)). In other words, the stacked-layer structure is formed such that there exists no impurity that forms a defect state such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, 1:9:6, or the like can be used for the oxide semiconductor layer 130a and the oxide semiconductor layer 130c. An In—Ga—Zn oxide whose atomic ratio of In to Ga and Zn is 1:1:1, 2:1:3, 5:5:6, 5:1:7, 3:1:2, or the like can be used for the oxide semiconductor layer 130b. An In—Ga—Zn oxide whose atomic ratio of In to Ga and Zn is 4:2:4.1 or the like can be used for the oxide semiconductor layer 130c. In each of the oxide semiconductor layers 130a, 130b, and 130c, the proportion of each atom in the atomic ratio varies within a range of ±20% as an error.

The oxide semiconductor layer 130b of the oxide semiconductor layer 130 serves as a well, so that a channel is formed in the oxide semiconductor layer 130b in a transistor including the oxide semiconductor layer 130. A channel formed to have such a structure can also be referred to as a buried channel.

Note that trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

Thus, to reduce changes in the threshold voltage of the transistor, energy differences of at least certain values between the conduction band minimum of the oxide semiconductor layer 130b and the conduction band minimum of each of the oxide semiconductor layer 130a and the oxide semiconductor layer 130c are necessary. Each of the energy differences is preferably greater than or equal to 0.1 eV and further preferably greater than or equal to 0.15 eV.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, Sc, and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistors 105, 106, 111, and 112, for example, it is possible to use W for the conductive layer 141 and the conductive layer 151 and use a stack of Ti and Al for the conductive layer 142 and the conductive layer 152.

The above materials are capable of abstracting oxygen from an oxide semiconductor layer. Therefore, in a region of the oxide semiconductor layer that is in contact with any of the above materials, oxygen is released from the oxide semiconductor layer and oxygen vacancy is formed. Hydrogen slightly contained in the layer and the oxygen vacancy are bonded to each other, whereby the region is markedly changed to an n-type region. Accordingly, the n-type region can serve as a source or a drain of the transistor.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain lanthanum (La), nitrogen, or zirconium (Zr) as an impurity.

The insulating layer 160 may have a function of supplying oxygen to the oxide semiconductor layer 130. For this reason, the insulating layer 160 is preferably an insulating film containing oxygen and further preferably, an insulating film including a region containing oxygen more than its stoichiometric composition. For example, the insulating layer 160 is preferably a film in which the amount of released oxygen converted into oxygen atoms is $1.0 \times 10^{19}$ atoms/cm$^3$ or more in thermal desorption spectroscopy (TDS) analysis performed such that the surface temperature is higher than or equal to 100° C. and lower than or equal to 700° C., preferably higher than or equal to 100° C. and lower than or equal to 500° C. Note that the top surface of the insulating layer 160 may be removed such that the concentration of a rare gas which is an impurity is less than or equal to $1 \times 10^{19}$ atoms/cm$^3$, preferably less than $7 \times 10^{18}$ atoms/cm$^3$ in the insulating layer 160.

An example of a stacked-layer structure of the insulating layer 160 is described. The insulating layer 160 includes, for example, oxygen, nitrogen, silicon, hafnium, or the like. Specifically, the insulating layer 160 preferably includes hafnium oxide, and silicon oxide or silicon oxynitride.

Hafnium oxide and aluminum oxide have higher dielectric constant than silicon oxide and silicon oxynitride. Therefore, the thickness of the insulating layer 160 can be made large as compared with the case where silicon oxide is used; thus, leakage current due to tunnel current can be reduced. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. In order to reduce the influence of the interface state, it is in some cases preferable to separate the channel region of the transistor and the hafnium oxide from each other by providing another film therebetween. The film has a buffer function. The film having a buffer function may be included in the insulating layer 160 or included in the oxide semiconductor film. That is, the film having a buffer function can be formed using silicon oxide, silicon oxynitride, an oxide semiconductor, or the like. The film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region.

Further alternatively, the film having a buffer function is formed using, for example, a semiconductor or an insulator having higher ionization energy than a semiconductor to be the channel region.

Meanwhile, charge is trapped by the interface states (trap centers) of the hafnium oxide having a crystal structure, whereby the threshold voltage of the transistor may be controlled. In order to make the electric charge exist stably, for example, a semiconductor or an insulator having a larger energy gap than hafnium oxide may be provided between the channel region and the hafnium oxide. Alternatively, a semiconductor or an insulator having smaller electron affinity than the hafnium oxide is provided. The film having a buffer function is formed using a semiconductor or an insulator having higher ionization energy than hafnium oxide. Use of such a semiconductor or an insulator inhibits discharge of the charge trapped by the interface states, so that the charge can be retained for a long time.

Examples of such an insulator include silicon oxide and silicon oxynitride. An electric charge can be trapped at the interface state in the insulating layer 160 by transferring electron from the oxide semiconductor layer 130 toward the gate electrode layer (conductive layer 170). As a specific example, the potential of the gate electrode layer (conductive layer 170) is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the insulating layer 160 or the like shifts in the positive direction. The amount of electrons to be trapped (the amount of change in threshold voltage) can be controlled by adjusting a voltage of the gate electrode layer (conductive layer 170) or time in which the voltage is applied. Note that a location in which charge is trapped is not necessarily limited to the inside of the insulating layer 160 as long as charge can be trapped therein. A stacked-layer film having a similar structure may be used for another insulating layer.

The insulating layer 120 and the insulating layer 160 in contact with the oxide semiconductor layer 130 may include a region with a low density of states caused by nitrogen oxide. The density of states caused by nitrogen oxide can be formed in the energy gap of the oxide semiconductor. As the oxide insulating layer, a silicon oxynitride film that releases less nitrogen oxide, an aluminum oxynitride film that releases less nitrogen oxide, or the like can be used.

Note that a silicon oxynitride film that releases less nitrogen oxide is a film which releases ammonia more than nitrogen oxide in IDS analysis; the amount of released ammonia is typically greater than or equal to $1\times10^{18}/cm^3$ and less than or equal to $5\times10^{19}/cm^3$. Note that the amount of released ammonia is the amount of ammonia released by heat treatment at the film surface temperature higher than or equal to 50° C. and lower than or equal to 700° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to a small change in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 1, using an insulating film containing hydrogen as the insulating layer 175 allows the oxide semiconductor layer to be partly changed to n-type. In addition, a nitride insulating film such as a silicon nitride film or an aluminum nitride film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 1. The aluminum oxide film has a high blocking effect of preventing permeation of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing release of oxygen from the insulating layer 120. Further, oxygen contained in the aluminum oxide film can be diffused into the oxide semiconductor layer.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancy formed in the channel formation region can be filled with the oxygen. In this manner, stable electrical characteristics of the transistor can be achieved.

High integration of a semiconductor device requires miniaturization of a transistor. However, it is known that miniaturization of a transistor causes degradation of the electrical characteristics of the transistor. In particular, a decrease in channel width causes a reduction in on-state current.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in the side surface direction in addition to the top surface direction. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, the formation of an interface state is effectively inhibited. In the transistor of one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b is effectively eliminated as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. Further, since the threshold voltage of the transistor is stabilized, long-term reliability of the semiconductor device can be improved. In addition, the transistor of one embodiment of the present invention is suitable for a highly integrated semiconductor device because deterioration of electrical characteristics due to miniaturization can be reduced.

This embodiment can be combined as appropriate with any of the other embodiments and examples in this specification.

Embodiment 3

In this embodiment, methods for manufacturing the transistors 101 and 107 described in Embodiment 1 will be described.

<Method 1 for Manufacturing Transistor>

A method for manufacturing the transistor 101 is described with reference to FIGS. 24A to 24C, FIGS. 25A to 25C, FIGS. 26A to 26C, FIGS. 27A to 27C, and FIGS. 28A to 28C. A cross section of the transistor in the channel length direction is shown on the left side, and a cross section of the transistor in the channel width direction is shown on the right side.

First, the insulating layer 120 is formed over the substrate 100. Embodiment 2 can be referred to for description of the kinds of the substrate 100 and a material used for the insulating layer 120. For example, as the insulating layer 120, a silicon oxide film is formed by oxidation of a surface of the substrate by heat treatment. After the silicon oxide film is formed, a surface of the silicon oxide film may be nitrided by nitriding treatment. The insulating layer 120 can be formed by a sputtering method, a chemical vapor deposition (CVD) method, a molecular beam epitaxy (MBE) method, or the like (see FIG. 24A).

Figure 24A:
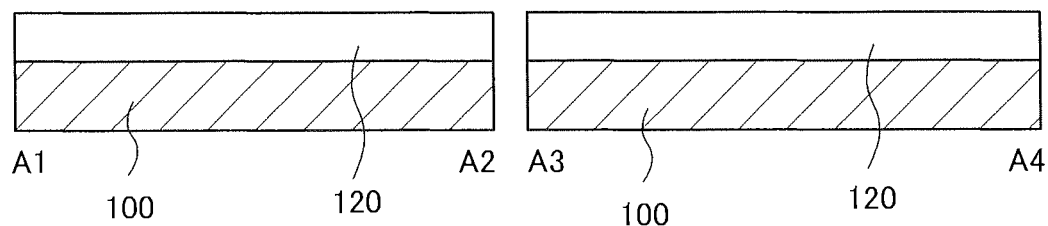
FIGS. 24A to 24C are cross-sectional views illustrating an example of a manufacturing process of a semiconductor device.
Figure 24B:
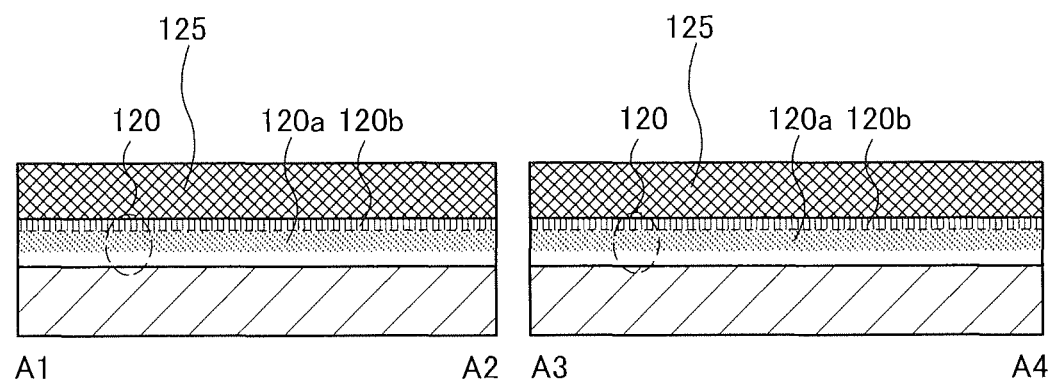
Figure 24C:
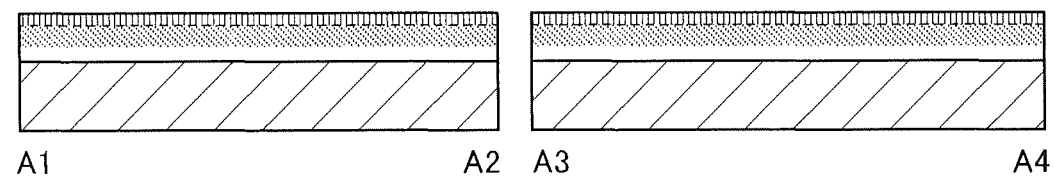

Next, an oxygen-excess region 120a is formed by taking oxygen into the insulating layer 120 (see FIG. 24B). Note that although the oxygen-excess region 120a is illustrated in a layered shape in FIG. 24B, the oxygen-excess region 120a is not necessarily formed in a layered shape. The insulating layer 120 includes the oxygen-excess region 120a, whereby oxygen can be easily supplied from the insulating layer 120 to the oxide semiconductor layer 130.

The oxygen-excess region 120a is preferred to be formed in the insulating layer 120 in such a manner that oxygen is taken into the insulating layer 120 after the deposition. For example, one way to take oxygen is to form oxide 125 over the insulating layer 120 by a sputtering method so that the insulating layer 120 can take oxygen therefrom.

Figure 31A:
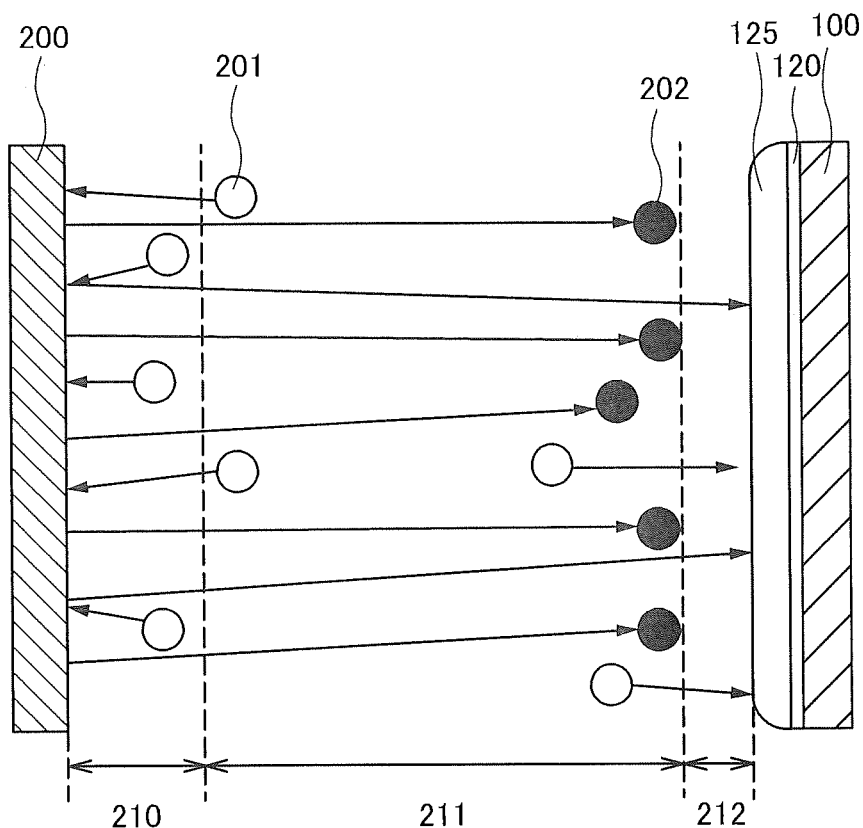
FIGS. 31A and 31B illustrate incorporation of oxygen into a film by a sputtering method.

Behavior of oxygen ions or the like by a sputtering method is described below with reference to FIGS. 31A and 31B. As illustrated in FIG. 31A, ions 201 and sputtered particles 202 exist between a target 200 and the substrate 100. Here, in a region between the substrate 100 and the target 200, a region 210 is a region in the vicinity of the target 200, a region 212 is a region in the vicinity of the substrate 100, and a region 211 is a region between the region 210 and the region 212.

Figure 31B:
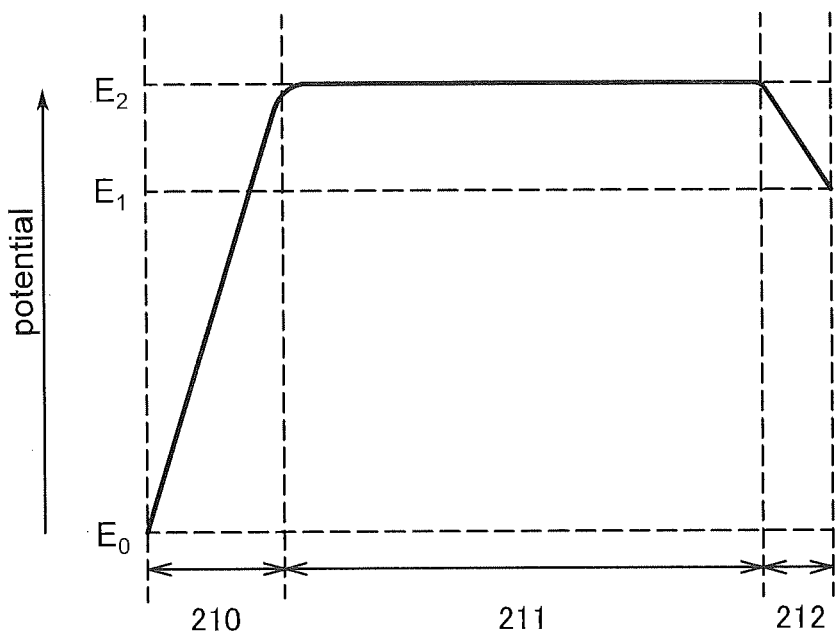

FIG. 31B illustrates potentials of the regions between the substrate 100 and the target 200. A potential $E_0$ is supplied to the target 200 side, to which a power source is connected. A potential $E_1$ such as a ground potential is supplied to the substrate 100 side. Note that the substrate 100 side may be electrically floating. A potential $E_2$ is supplied to the region 211. Note that the potential relationship is $E_2 > E_1 > E_0$.

The ions 201 in plasma are accelerated in the region 210 by a potential difference ($E_2 - E_0$) and collide with the target 200; accordingly, the sputtered particles 202 are ejected from the target 200. Attachment of these sputtered particles 202 to a deposition surface forms of the oxide 125. Here, some ions 201 recoil by the target 200 and might be taken into the insulating layer 120 as recoil ions through the oxide 125.

The ions 201 in the plasma are accelerated by a potential difference ($E_2 - E_1$) generated in the region 212 and collide with the deposition surface. Consequently, some ions 201 reach the inside of the formed oxide 125 and further the inside of the insulating layer 120 which is formed below the oxide 125 through the oxide 125.

The ions 201 are taken into the insulating layer 120; accordingly, a region into which the ions 201 are taken is formed in the insulating layer 120. That is, the oxygen-excess region 120a is formed in the insulating layer 120 in the case where the ions 201 include oxygen.

Note that as the densities of the oxide 125 and the insulating layer 120 are low, the amount of oxygen taken into the insulating layer 120 is readily increased. For example, the oxygen-excess region 120a is formed down to a depth of approximately 100 nm from the interface between the oxide 125 and the insulating layer 120 in the case where the oxide 125 is formed using an aluminum oxide layer at a density of 3.0 g/cm³ and the insulating layer 120 is formed using a silicon oxynitride layer at a density of 2.3 g/cm³.

Thus, when the density of the oxide 125 is set to be lower than or equal to 5.0 g/cm³, preferably lower than or equal to 4.0 g/cm³ and further preferably lower than or equal to 3.2 g/cm³, the amount of oxygen taken into the insulating layer 120 can be increased. Moreover, when the density of the insulating layer 120 is set to be lower than or equal to 5.0 g/cm³, preferably lower than or equal to 3.2 g/cm³ and further preferably lower than or equal to 2.4 g/cm³, the amount of oxygen taken into the insulating layer 120 can be increased.

In addition, in the case where a deposition gas includes a rare gas (typically, argon), the rare gas is taken into the insulating layer 120. An ion of the rare gas reaches the inside of the insulating layer 120; accordingly, a rare gas region 120b is formed in the insulating layer 120. At the same time as when the rare gas is taken into the insulating layer 120, the oxide 125 and the insulating layer 120 might be damaged. The ion easily passes through a damaged region because of a decrease in density or the like. That is, when the deposition gas includes a rare gas, an oxygen ion can be taken into a deeper region of the insulating layer 120 from the interface with the oxide 125; thus, the amount of the oxygen taken into the insulating layer 120 when the oxide 125 is formed once can be increased.

Accordingly, to increase the amount of oxygen taken into the insulating layer 120, the proportion of the rare gas in the deposition gas is 1 vol % or more, preferably 3 vol % or more, further preferably 10 vol % or more, and still further preferably 20 vol % or more.

Note that the rare gas region is formed in a region at least down to a depth of 5 nm or more and 10 nm or less from the interface between the oxide 125 and the insulating layer 120. In the case where the flow rate of the rare gas in the deposition gas is high, the rare gas region might be formed down to a depth of approximately 15 nm.

That is, in the insulating layer 120, the rare gas region 120b is formed in a region close to the interface with the oxide 125, and the oxygen-excess region 120a is formed in a region more distant from the interface than the rare gas region 120b is. Note that although the oxygen-excess region 120a and the rare gas region 120b are illustrated in layered shapes in FIG. 24B, they are not necessarily formed in layered shapes. Although a dotted line is drawn at the interface between the oxygen-excess region and the rare gas region in FIG. 24B, the interface is not necessarily clear.

For example, the oxide 125 can be formed using an oxide insulating film including aluminum oxide, aluminum oxynitride, aluminum silicate, aluminum hafnium oxide, aluminum titanium oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride oxide insulating film including silicon nitride oxide, aluminum nitride oxide, or the like, or a mixed material of any of these. It is preferable that the oxide 125 be a substance having higher density than the insulating layer 120 to prevent release of oxygen from the insulating layer 120. Note that a sputtering method, a CVD method, an MBE method, or the like can be used for the formation of the oxide 125.

In the case where the amount of oxygen taken into the insulating layer 120 when the oxide is formed once is small, a larger amount of oxygen can be taken into the insulating layer 120 by forming oxide 126 after the oxide 125 is removed. In that case, the removal can be performed easily when substances whose etching rates are different from that of the insulating layer 120 are used for the oxide 125 and the oxide 126. Note that the amount of oxygen taken into the insulating layer 120 can be adjusted to a desired amount of oxygen by repeating formation and removal of oxide (see FIGS. 24C and 25A).

In order that oxygen may be efficiently taken into the insulating layer 120, the number of repetitions of a step of forming and then removing oxide and the thickness of the oxide are decided as appropriate depending on the kind of oxide to be formed. For example, in the case where an aluminum oxide film is used as oxide, the aluminum oxide film is formed to have a thickness greater than or equal to 4 nm and less than or equal to 20 nm.

In the case of taking oxygen into the insulating layer 120, the rare gas region 120b is formed closer to the oxide semiconductor layer 130 than the oxygen-excess region 120a is. Thus, the oxide and the rare gas region 120b formed in the insulating layer 120 are preferred to be removed. Since the rare gas region 120b is formed to a thickness of approximately 5 nm to 15 nm, a region of the insulating layer 120 which is down to a depth of 10 nm or more and less than 20 nm from the surface (the interface with the oxide 126) is removed. Note that the oxygen-excess region 120a is formed down to a depth of approximately 100 nm from the surface of the insulating layer 120 (the interface with the oxide 126), and a region having a thickness of 20 nm or more may be removed as long as the oxygen-excess region 120a remains.

The oxide 126 and the rare gas region 120b can be removed by etching. At removal of the oxide 126 and the rare gas region 120b, a CMP method is preferably employed so as to serve also as planarization, in which case disconnection of the oxide semiconductor layer 130, the conductive layer 140, the conductive layer 150, and the like that are formed over the insulating layer 120 can be prevented (see FIG. 25B). Note that although the oxygen-excess region 120a in the insulating layer 120 is not illustrated in the steps in and after FIG. 25C to avoid complexity, the oxygen-excess region 120a is formed in practice.

Figure 25A:
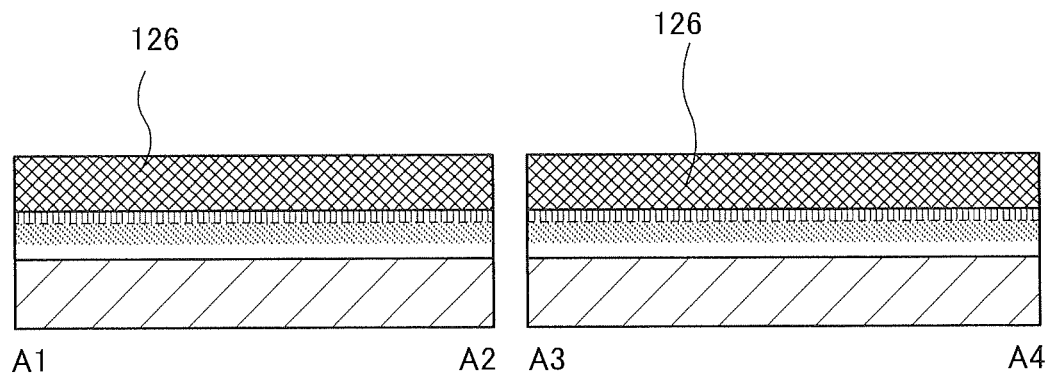
FIGS. 25A to 25C are cross-sectional views illustrating an example of a manufacturing process of a semiconductor device.
Figure 25B:
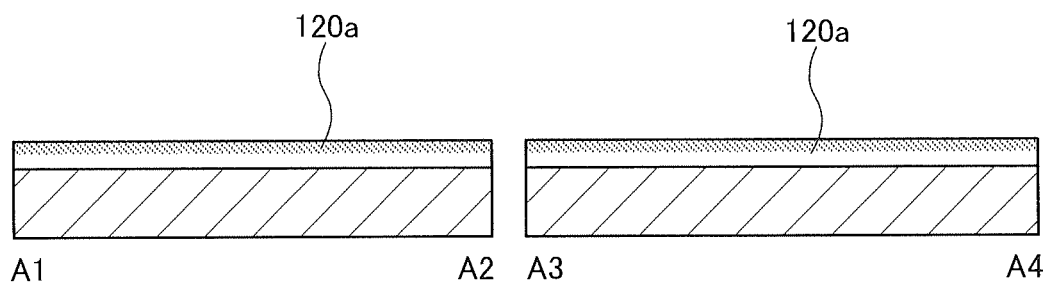
Figure 25C:
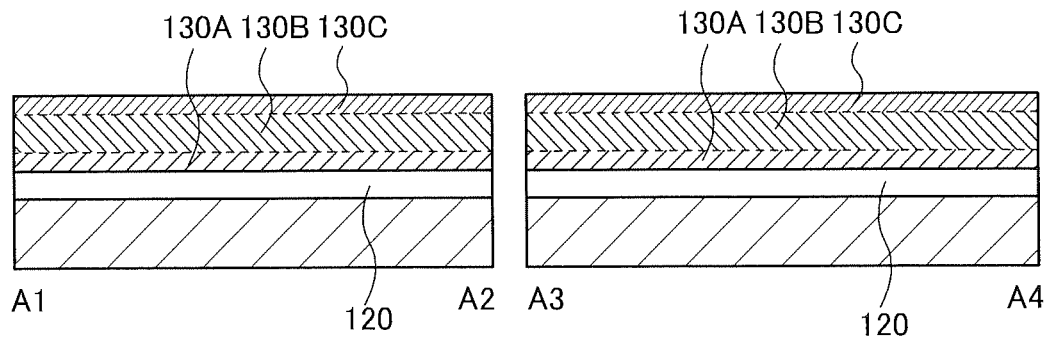

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by a sputtering method, a CVD method, an MBE method, or the like (see FIG. 25C).

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, the oxide semiconductor layer 130a and the oxide semiconductor layer 130b are used. In the case where the oxide semiconductor layer 130 has a single-layer structure, the oxide semiconductor layer 130b is used.

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate to 100° C. or higher, preferably 500° C. or higher, so that water and the like acting as impurities of an oxide semiconductor are removed as much as possible. A combination of a turbo molecular pump and a cold trap is preferably used to prevent back-flow of a gas containing a carbon component, moisture, or the like from an exhaust system into the chamber. A combination of a turbo molecular pump and a cryopump may be used as an exhaust system.

An oxide semiconductor layer having a low impurity concentration and a low density of defect states (the amount of oxygen vacancy is small) can have low carrier density. Therefore, such an oxide semiconductor layer is referred to as a highly purified intrinsic or substantially highly purified intrinsic oxide semiconductor layer. Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower and further preferably −100° C. or lower, is used, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 2 can be used. For example, an In—Ga—Zn oxide whose atomic ratio of In to Ga and Zn is 1:3:6, 1:3:4, 1:3:3, or 1:3:2 can be used for the oxide semiconductor film 130A. An In—Ga—Zn oxide whose atomic ratio of In to Ga and Zn is 1:1:1, 3:1:2, or 5:5:6 can be used for the oxide semiconductor film 130B. An In—Ga—Zn oxide whose atomic ratio of In to Ga and Zn is 1:3:6, 1:3:4, 1:3:3, or 1:3:2 can be used for the oxide semiconductor film 130C. For the oxide semiconductor film 130A and the oxide semiconductor film 130C, an oxide semiconductor like gallium oxide may be used. In each of the oxide semiconductor films 130A, 130B, and 130C, the proportion of each atom in the atomic ratio varies within a range of ±20% as an error. In the case where a sputtering method is used for deposition, the above material can be used as a target.

Note that as described in detail in Embodiment 2, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment allows oxygen to be taken from the insulating layer 120 into the oxide semiconductor film 130A, the oxide semiconductor film 130B, and the oxide semiconductor film 130C and allows the oxygen which is taken to be diffused into the entire oxide semiconductor films 130A to 130C.

The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130C. The first conductive layer can be, for example, formed by the following method.

First, a first conductive film is formed over the oxide semiconductor film 130C. As the first conductive film, a single layer or a stacked layer can be formed using a material selected from Al, Cr, Cu, Ta, Ti, Mo, W, Ni, Mn, Nd, and Sc and alloys of any of these metal materials.

Next, a resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography Then, the first conductive film is selectively etched using the first resist mask, and the first resist mask is removed by ashing; thus, the first conductive layer is formed.

Figure 26A:
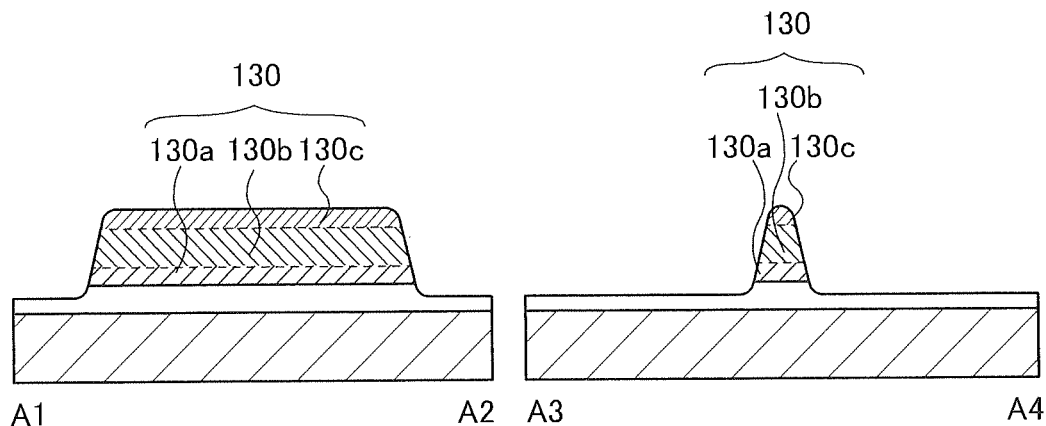
FIGS. 26A to 26C are cross-sectional views illustrating an example of a manufacturing process of a semiconductor device.
Figure 26B:
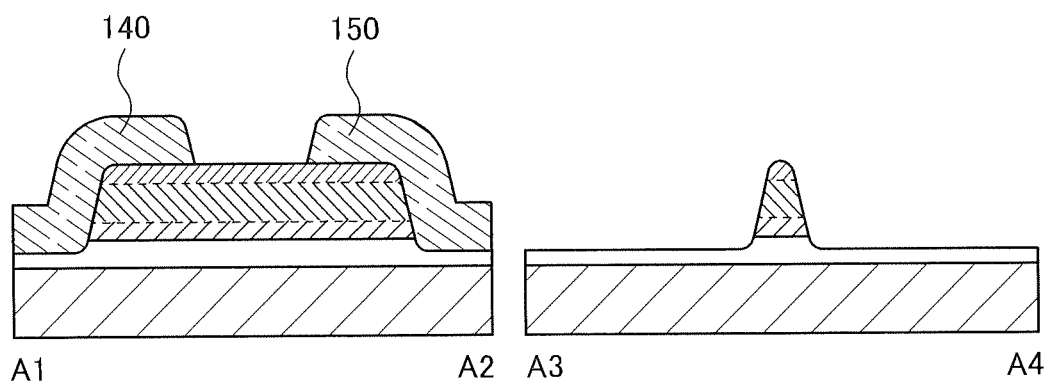

Next, the oxide semiconductor film 130A, the oxide semiconductor film 130B, and the oxide semiconductor film 130C are selectively etched using the first conductive layer as a hard mask, and the first conductive layer is removed; thus, the oxide semiconductor layer 130 including a stack of the oxide semiconductor layer 130a, the oxide semiconductor layer 130b, and the oxide semiconductor layer 130c is formed (see FIG. 26A). It is also possible to form the oxide semiconductor layer 130 using the first resist mask without forming the first conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 2. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 26B).

Next, an insulating film 160A serving as the insulating layer 160 is formed over the oxide semiconductor layer 130, the conductive layer 140, and the conductive layer 150. The insulating film 160A can be formed using a material that can be used for the insulating layer 160 described in Embodiment 2. A sputtering method, a CVD method, an MBE method, or the like can be used for the formation of the insulating film 160A.

Next, an oxygen-excess region is formed by adding oxygen to the insulating film 160A. The insulating film 160A includes the oxygen-excess region, whereby oxygen can be easily supplied from the insulating film 160A to the oxide semiconductor layer 130.

Figure 26C:
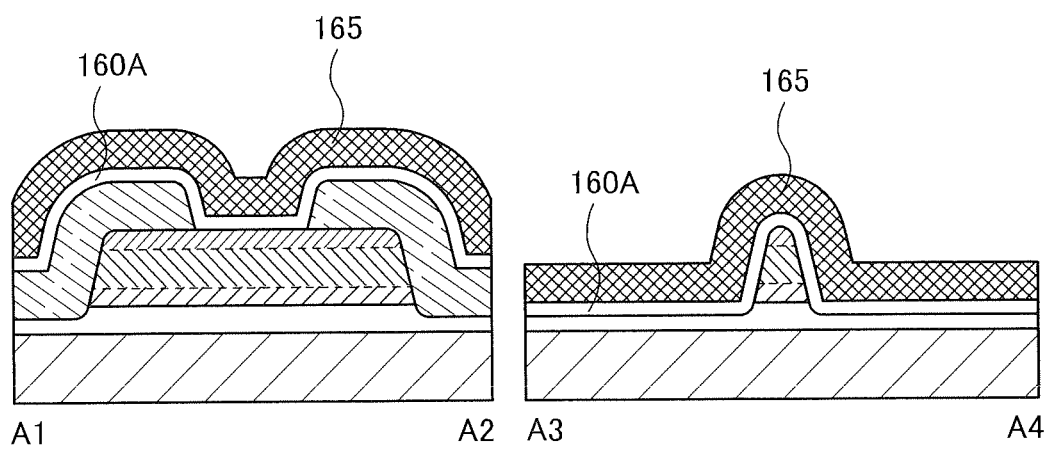
Figure 27A:
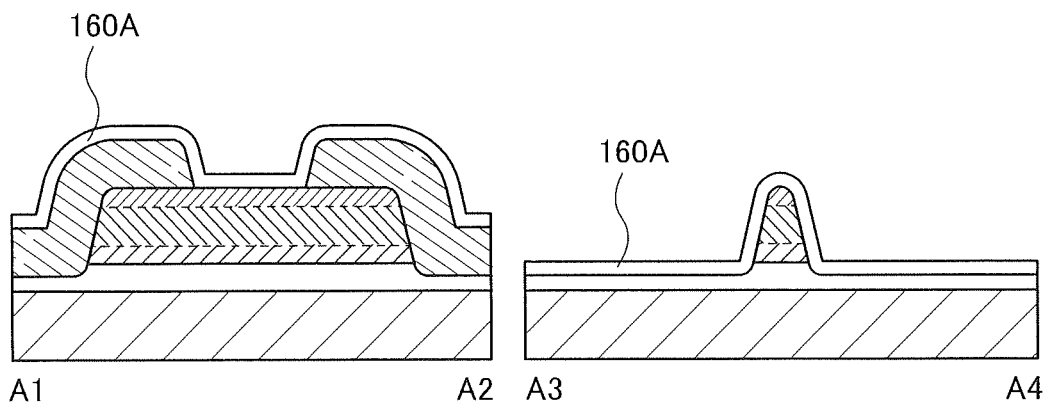
FIGS. 27A to 27C are cross-sectional views illustrating an example of a manufacturing process of a semiconductor device.
Figure 27B:
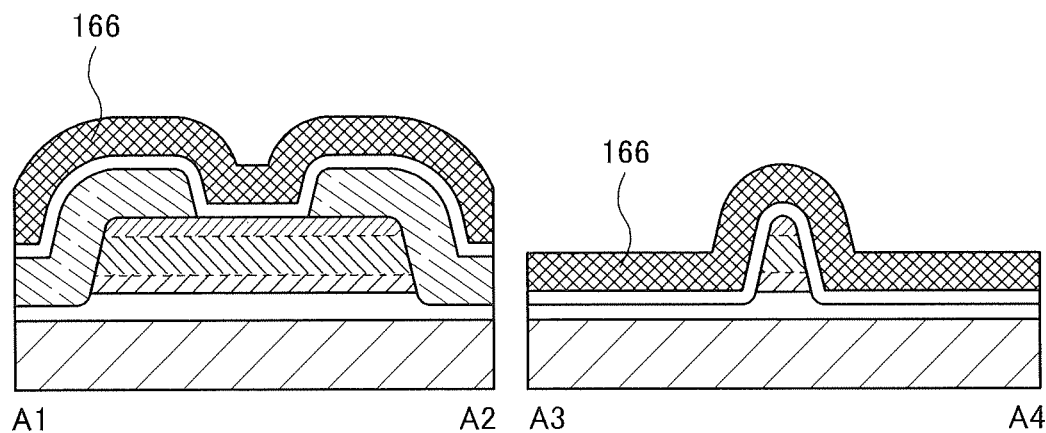
Figure 27C:
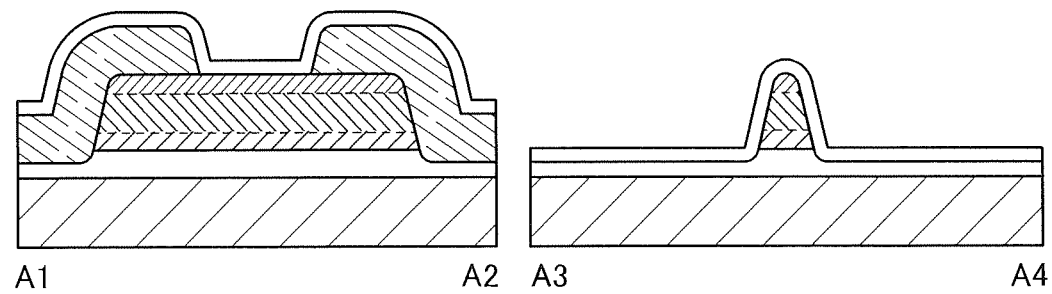

To provide the oxygen-excess region in the insulating film 160A, oxygen is taken into the insulating film 160A and an oxygen-excess region can be formed in the insulating film 160A by the formation of oxide 165 over the insulating film 160A in a manner similar to that of the insulating layer 120 (see FIG. 26C). A rare gas (typically, argon) contained in a deposition atmosphere is taken at the same time as when oxygen is taken into the insulating film 160A; accordingly, a rare gas region is formed in the insulating film 160A.

In the insulating film 160A, the rare gas forms the rare gas region in a shallow region near the interface with the oxide 165, and oxygen forms the oxygen-excess region in a deeper region than the rare gas region. Thus, the oxygen-excess region is formed closer to the oxide semiconductor layer 130 than the rare gas region is. Therefore, although oxide 166 which is formed later may be removed before the formation of the conductive layer 170, there is no problem even if it is left as part of the gate insulating layer. In that case, because the oxide 166 also functions as a protective film, impurity diffusion to the oxide semiconductor layer 130 and release of oxygen from the upper part of the insulating film 160A are prevented; therefore, oxygen in the insulating film 160A can be efficiently supplied to the oxide semiconductor layer 130 (the oxide 166 is not illustrated in subsequent steps).

For example, the oxide 165 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride oxide insulating film including silicon nitride oxide, aluminum nitride oxide, or the like, or a mixed material of any of these. It is preferable that the oxide 165 be formed using a substance having higher density than the insulating film 160A to prevent release of oxygen from the insulating film 160A. Note that a sputtering method, a CVD method, an MBE method, or the like can be used for the formation of the oxide 165.

In the case where the amount of oxygen taken into the insulating film 160A when the oxide is formed once is small, a larger amount of oxygen can be taken into the insulating film 160A by forming oxide 166 after the oxide 165 is removed. In that case, the removal can be performed easily when a substance whose etching rate is different from that of the insulating film 160A is used for the oxide 165. Note that the amount of oxygen taken into the insulating film 160A can be adjusted to a desired amount of oxygen by repeating formation and removal of oxide (see FIGS. 27A to 27C).

After that, second heat treatment may be performed. The second heat treatment can be performed under a condition similar to that of the first heat treatment. The second heat treatment allows oxygen to be taken from the insulating film 160A and the insulating layer 120 into the oxide semiconductor layer 130 and allows the oxygen which is taken to be diffused into the entire oxide semiconductor layer 130. Note that it is possible to obtain this effect by third heat treatment without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 2. A sputtering method, a CVD method, an MBE method, or the like can be used for the formation of the third conductive film 171A and the fourth conductive film 172A.

Figure 28A:
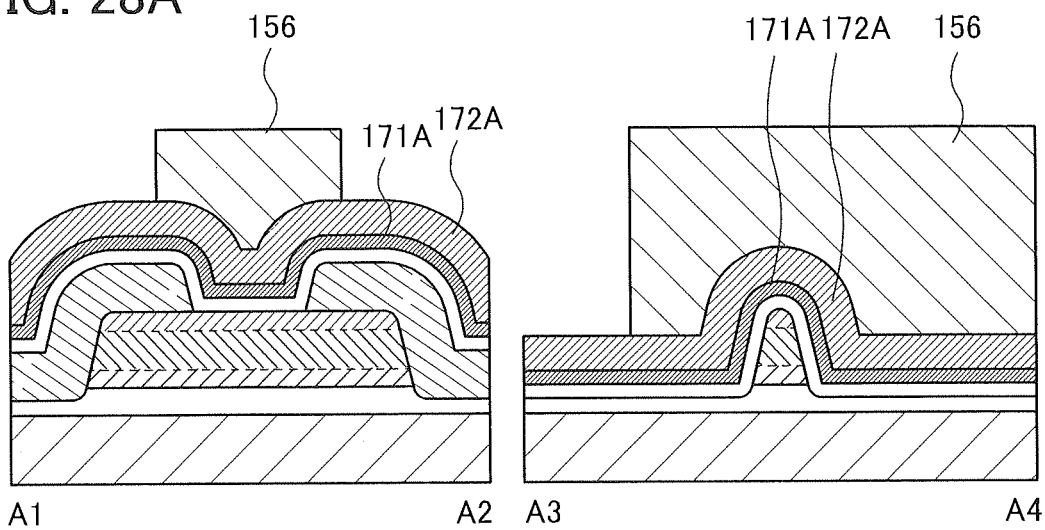
FIGS. 28A to 28C are cross-sectional views illustrating an example of a manufacturing process of a semiconductor device.
Figure 28B:
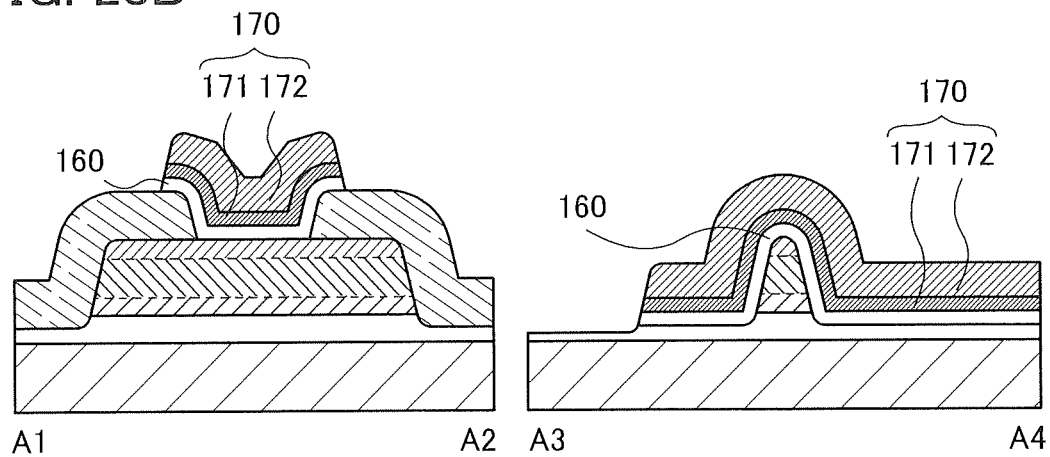

Next, a third resist mask 156 is formed over the fourth conductive film 172A (see FIG. 28A). The third conductive film 171A, the fourth conductive film 172A, and the insulating film 160A are selectively etched using the resist mask, whereby the conductive layer 170 including the conductive layer 171 and the conductive layer 172 and the insulating layer 160 are formed (see FIG. 28B).

After that, the insulating layer 175 is formed over the oxide semiconductor layer 130, the conductive layer 140, the conductive layer 150, the insulating layer 160, and the conductive layer 170. Embodiment 2 can be referred to for a material used for the insulating layer 175. In the transistor 101, an aluminum oxide film is preferably used. The insulating layer 175 can be formed by a sputtering method, a CVD method, an MBE method, or the like.

Figure 28C:
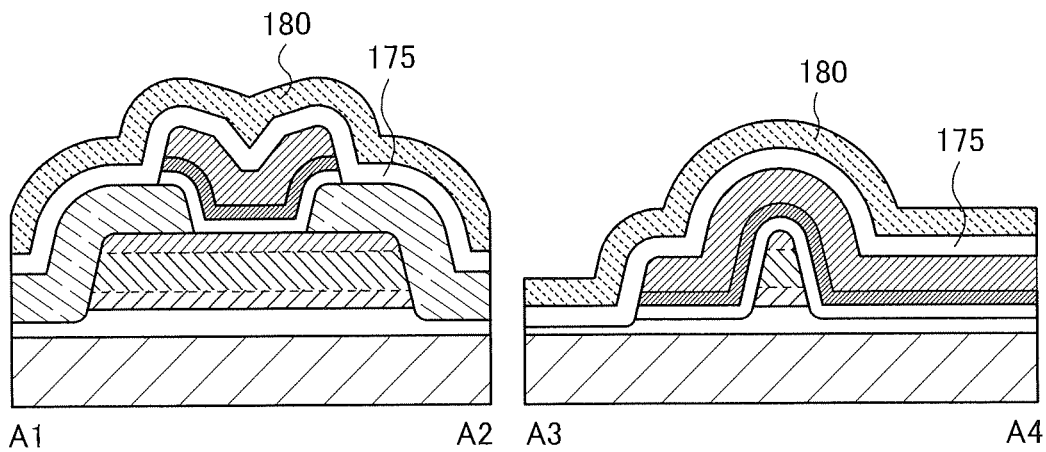

Next, the insulating layer 180 is formed over the insulating layer 175 (see FIG. 28C). Embodiment 2 can be referred to for a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed under a condition similar to that of the first heat treatment. By the third heat treatment, excess oxygen is easily released from the insulating layer 120, the insulating layer 175, and the insulating layer 180, so that oxygen vacancy in the oxide semiconductor layer 130 can be reduced.

Although the variety of films such as the metal films, the semiconductor films, and the inorganic insulating films which are described in this embodiment typically can be formed by a sputtering method or a plasma CVD method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. The chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor (hafnium alkoxide and a hafnium amide such as hafnium tetrakis(dimethylamide) hafnium (TDMAH) are used. Specifically, a raw material containing hafnium amide such as tetrakis(dimethylamide) hafnium (TDMAH; chemical formula: $Hf[N(CH_3)_2]_4$) or tetrakis(ethylmethylamide)hafnium can be used.

For example, in the case where an aluminum oxide film is formed using a deposition apparatus employing ALD, two kinds of gases, i.e., $H_2O$ as an oxidizer and a source gas which is obtained by vaporizing liquid containing a solvent and an aluminum precursor (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced to form an initial tungsten film, and then a $WF_6$ gas and an $H_2$ gas are sequentially introduced, so that a tungsten film is formed. Note that an $SiH_4$ gas may be used instead of a $B_2H_6$ gas.

For example, in the case where an oxide semiconductor film, for example, an In—Ga—Zn oxide film is formed using a deposition apparatus employing ALD, an $In(CH_3)_3$ gas and an $O_3$ gas) are sequentially introduced to form an In—O layer, a $Ga(CH_3)_3$ gas and an $O_3$ gas are sequentially introduced to form a GaO layer, and then a $Zn(CH_3)_2$ gas and an $O_3$ gas) are sequentially introduced to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas), it is preferable to use an $O_3$ gas, which does not contain H. Further, instead of an In $(CH_3)_3$ gas, an In $(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Method 2 for Manufacturing Transistor>

A method for manufacturing the transistor 107 is described with reference to FIGS. 29A to 29C and FIGS. 30A to 30C. Note that detailed description of steps similar to those for manufacturing the transistor 101 described above is omitted.

Figure 29A:
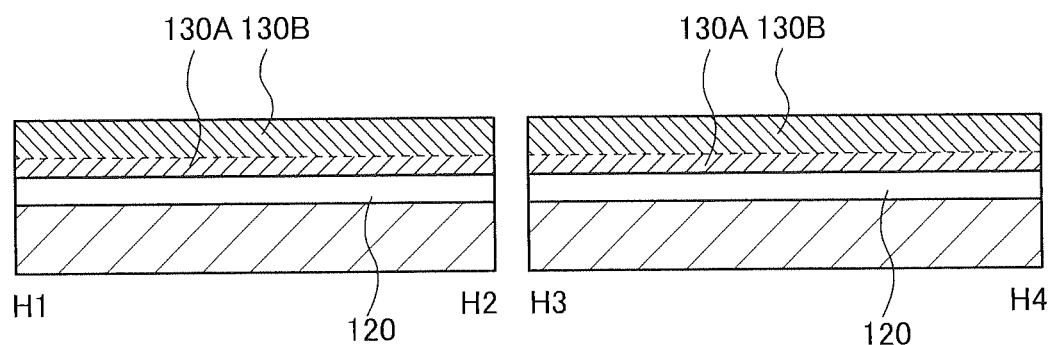
FIGS. 29A to 29C are cross-sectional views illustrating an example of a manufacturing process of a semiconductor device.
Figure 29B:
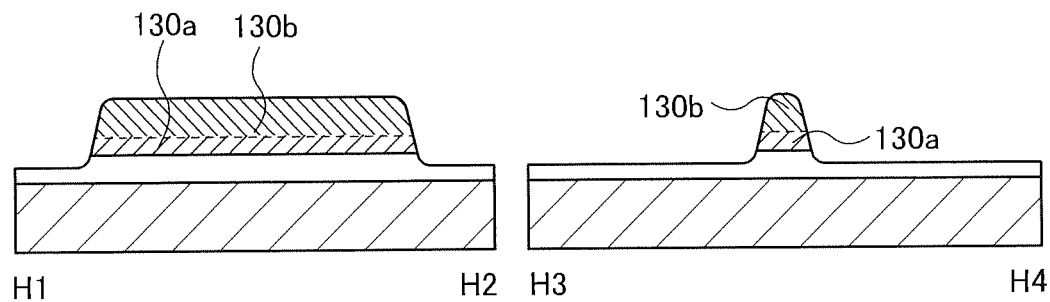
Figure 29C:
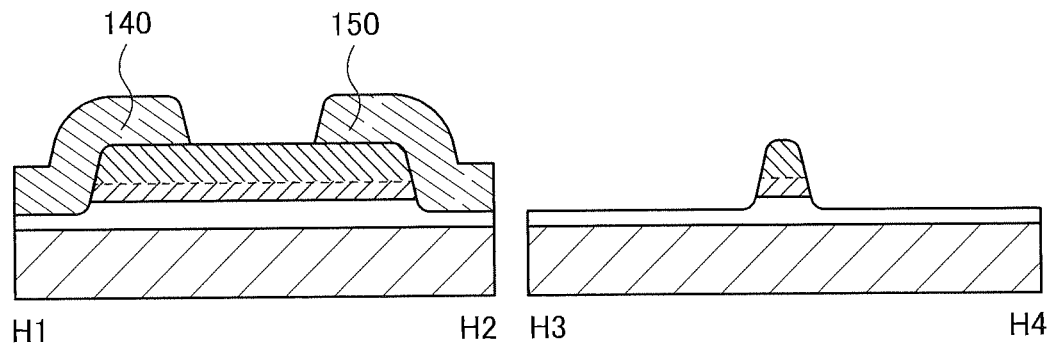

The insulating layer 120 is formed over the substrate 100, and the oxide semiconductor film 130A to be the oxide semiconductor layer 130*a* and the oxide semiconductor film 130B to be the oxide semiconductor layer 130*b* are formed over the insulating layer by a sputtering method, a CVD method, an MBE method, or the like (see FIG. 29A).

Next, the first conductive film is formed over the oxide semiconductor film 130B, and the conductive layer is formed using the first resist mask in the above-described manner. Then, the oxide semiconductor film 130A and the oxide semiconductor film 130B are selectively etched using the conductive layer as a hard mask, and the conductive layer is removed, whereby a stack of the oxide semiconductor layer 130*a* and the oxide semiconductor layer 130*b* is formed (see FIG. 29B). It is also possible to form the stack using the first resist mask without forming the hard mask. Here, oxygen ions may be implanted into the oxide semiconductor layer 130.

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 29C).

After that, the oxide semiconductor film 130C to be the oxide semiconductor layer 130*c* is formed over the stack of the oxide semiconductor layer 130*a* and the oxide semiconductor layer 130*b*, the conductive layer 140, and the conductive layer 150. Furthermore, the insulating film 160A serving as a gate insulating film, and the third conductive film 171A and the fourth conductive film 172A serving as the conductive layer 170 are formed over the oxide semiconductor film 130C.

Figure 30A:
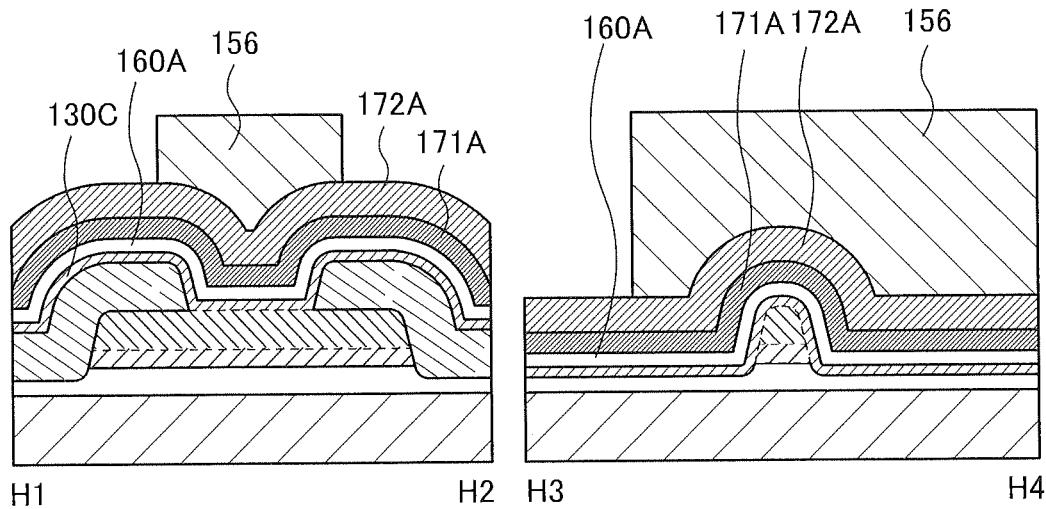
FIGS. 30A to 30C are cross-sectional views illustrating an example of a manufacturing process of a semiconductor device.
Figure 30B:
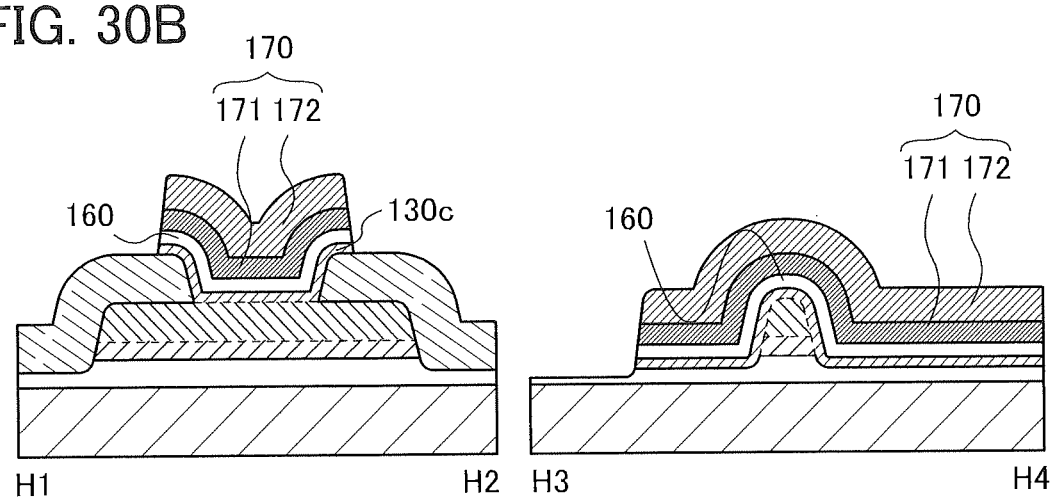

Then, the third resist mask 156 is formed over the fourth conductive film 172A (see FIG. 30A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130*c* are formed (see FIG. 30B). Note that if the insulating film 160A and the oxide semiconductor film 130C are etched using a fourth resist mask, the transistor 107 can be manufactured.

Figure 30C:
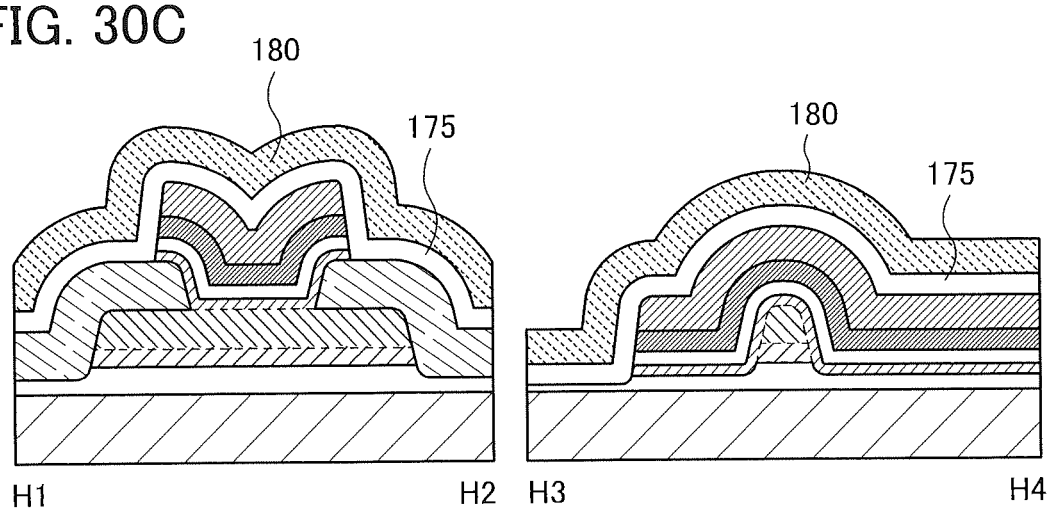

Next, the insulating layer 175 and the insulating layer 180 are formed over the insulating layer 120, the oxide semiconductor layer 130 (the oxide semiconductor layer 130*a*, the oxide semiconductor layer 130*b*, and the oxide semiconductor layer 130*c*), the conductive layer 140, the conductive layer 150, the insulating layer 160, and the conductive layer 170 (see FIG. 30C).

Through the above steps, the transistor 107 can be manufactured.

This embodiment can be combined as appropriate with any of the other embodiments and examples in this specification.

Embodiment 4

<Structure of Oxide Semiconductor Layer>

In this embodiment, a structure of an oxide semiconductor layer applicable to the semiconductor layer such as the oxide semiconductor layer 130 and the oxide semiconductor layers 130*a* to 130*c* will be described.

An oxide semiconductor layer is classified into a single crystal oxide semiconductor layer and a non-single-crystal oxide semiconductor layer.

Examples of a non-single-crystal oxide semiconductor layer include a c-axis aligned crystalline oxide semiconductor (CAAC-OS) layer, a polycrystalline oxide semiconductor layer, a microcrystalline oxide semiconductor layer, and an amorphous oxide semiconductor layer.

From another perspective, an oxide semiconductor layer is classified into an amorphous oxide semiconductor layer and a crystalline oxide semiconductor layer. In addition, examples of a crystalline oxide semiconductor layer include a single crystal oxide semiconductor layer, a CAAC-OS layer, a polycrystalline oxide semiconductor layer, and a microcrystalline oxide semiconductor layer.

<Caac-Os Layer>

First, a CAAC-OS layer is described. Note that a CAAC-OS can be referred to as an oxide semiconductor including c-axis aligned nanocrystals (CANC).

A CAAC-OS layer is one of oxide semiconductor layers having a plurality of c-axis aligned crystal parts (also referred to as nanocrystal (nc)).

In a combined analysis image (also referred to as a high-resolution TEM image) of a bright-field image and a diffraction pattern of a CAAC-OS layer, which is obtained using a transmission electron microscope (TEM), a plurality of nanocrystals can be observed. However, in the high-resolution TEM image, a boundary between nanocrystals, that is, a grain boundary is not clearly observed. Thus, in the CAAC-OS layer, a reduction in electron mobility due to the grain boundary is less likely to occur.

Figure 32A:
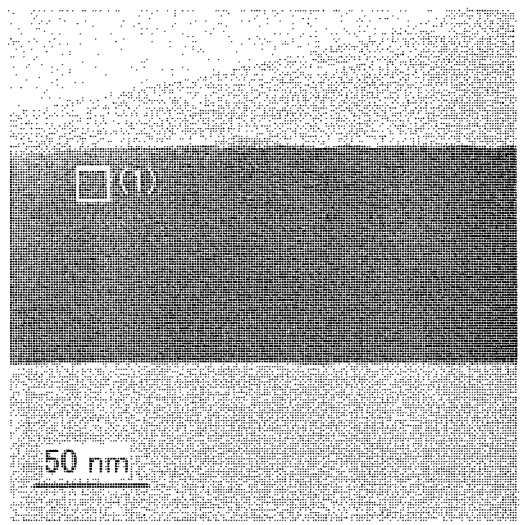
FIGS. 32A to 32D are Cs-corrected high-resolution TEM images of a cross section of a CAAC-OS layer and a cross-sectional schematic view of the CAAC-OS layer.

The CAAC-OS layer observed with a TEM is described below. FIG. 32A shows a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 32B:
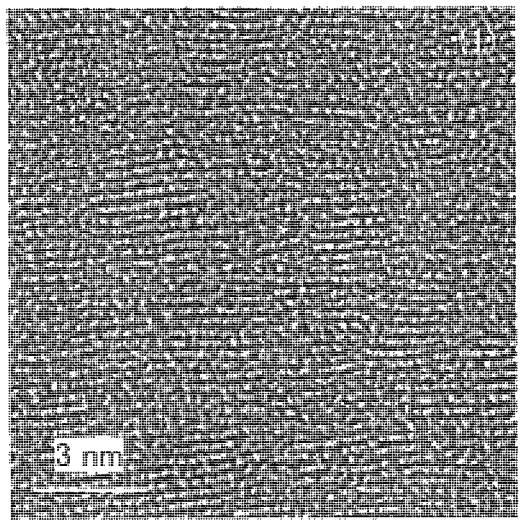

FIG. 32B is an enlarged Cs-corrected high-resolution TEM image of a region (1) in FIG. 32A. FIG. 32B shows that metal atoms are arranged in a layered manner in a nanocrystal. Each metal atom layer has a configuration reflecting unevenness of a surface over which a CAAC-OS layer is formed (hereinafter, the surface is referred to as a formation surface) or a top surface of the CAAC-OS layer, and is arranged parallel to the formation surface or the top surface of the CAAC-OS layer.

Figure 32C:
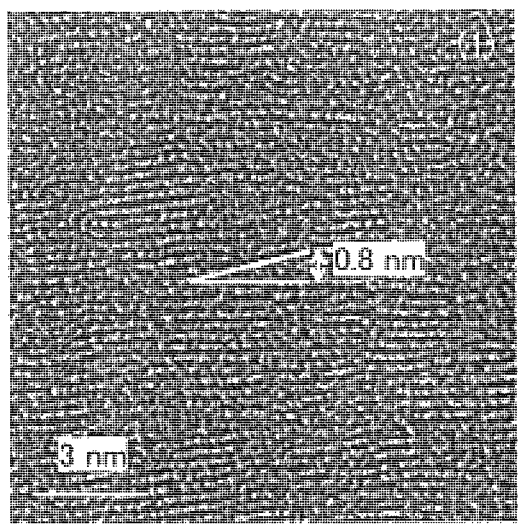

As shown in FIG. 32B, the CAAC-OS layer has a characteristic atomic arrangement. The characteristic atomic arrangement is denoted by an auxiliary line in FIG. 32C. FIGS. 32B and 32C prove that the size of a nanocrystal is approximately 1 nm to 3 nm, and the size of a space caused by tilt of the nanocrystals is approximately 0.8 nm.

Figure 32D:
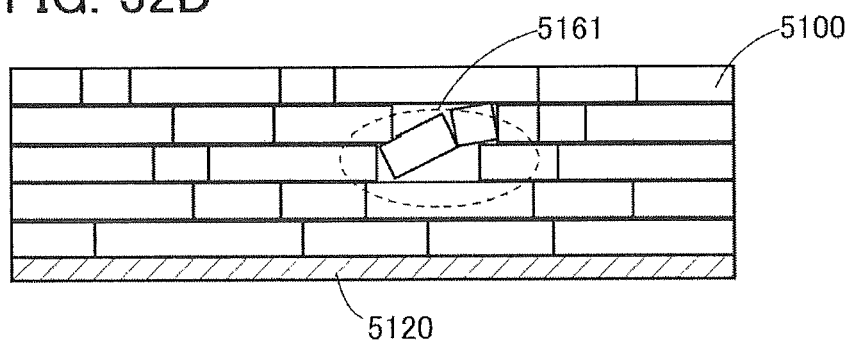

Here, according to the Cs-corrected high-resolution TEM images, the schematic arrangement of nanocrystals 5100 of a CAAC-OS layer over a substrate 5120 is illustrated by such a structure in which bricks or blocks are stacked (see FIG. 32D). The part in which the nanocrystals are tilted as observed in FIG. 32C corresponds to a region 5161 shown in FIG. 32D.

Figure 33A:
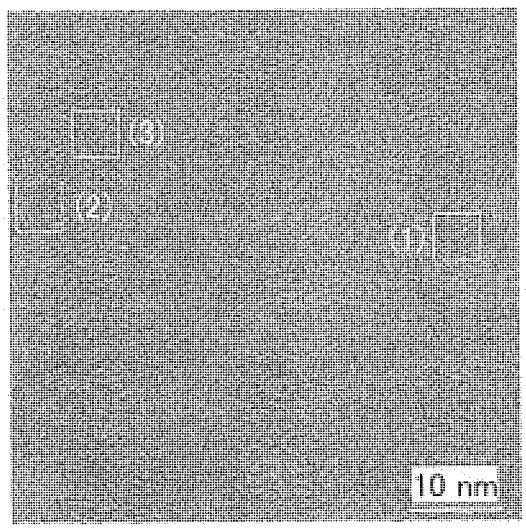
FIGS. 33A to 33D are Cs-corrected high-resolution TEM images of a plane of a CAAC-OS layer.
Figure 33B:
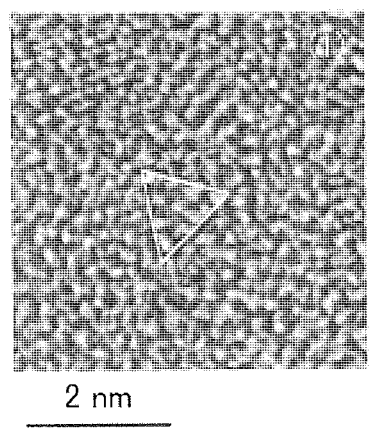
Figure 33C:
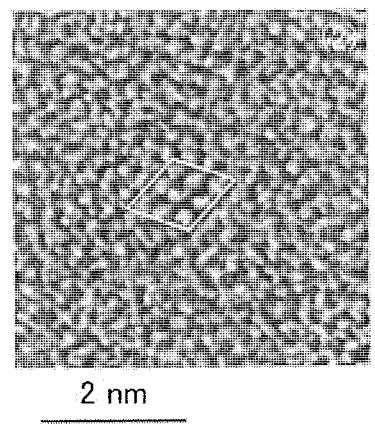
Figure 33D:
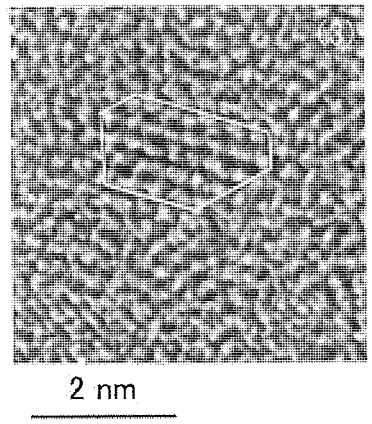

FIG. 33A shows a Cs-corrected high-resolution TEM image of a plane of the CAAC-OS layer observed from a direction substantially perpendicular to the sample surface. FIGS. 33B, 33C, and 33D are enlarged Cs-corrected high-resolution TEM images of regions (1), (2), and (3) in FIG. 33A, respectively. FIGS. 33B, 33C, and 33D indicate that metal atoms are arranged in a triangular, quadrangular, or hexagonal configuration in a nanocrystal. However, there is no regularity of arrangement of metal atoms between different nanocrystals.

Figure 34A:
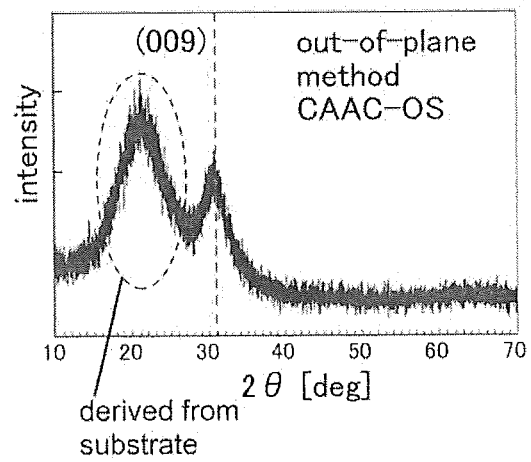
FIGS. 34A to 34C show structural analysis of a CAAC-OS layer and a single crystal oxide semiconductor by XRD.

Next, a CAAC-OS layer analyzed by X-ray diffraction (XRD) is described. For example, when the structure of a CAAC-OS layer including an $InGaZnO_4$ crystal is analyzed by an out-of-plane method, a peak appears at a diffraction angle ($2\theta$) of around 31° as shown in FIG. 34A. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

Note that in structural analysis of the CAAC-OS layer by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS layer. It is preferable that in the CAAC-OS layer analyzed by an out-of-plane method, a peak appear when $2\theta$ is around 31° and that a peak not appear when $2\theta$ is around 36°.

Figure 34B:
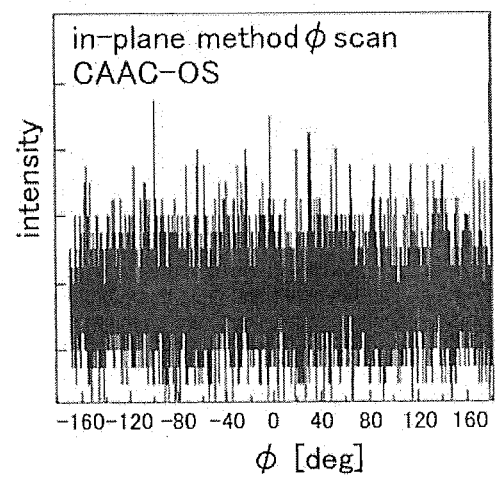
Figure 34C:
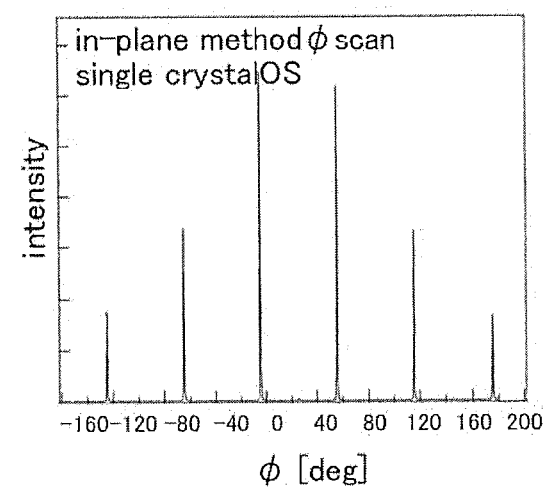

On the other hand, in structural analysis of the CAAC-OS layer by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS layer, when analysis ($\phi$ scan) is performed with $2\theta$ fixed at around 56° and with the sample rotated using a normal vector of the sample surface as an axis ($\phi$ axis), as shown in FIG. 34B, a peak is not clearly observed. In contrast, in the case of a single crystal oxide semiconductor of $InGaZnO_4$, when $\phi$ scan is performed with $2\theta$ fixed at around 56°, as shown in FIG. 34C, six peaks which are derived from crystal planes equivalent to the (110) plane are observed. Accordingly, the structural analysis using XRD shows that the directions of a-axes and b-axes are irregularly oriented in the CAAC-OS layer.

Figure 35A:
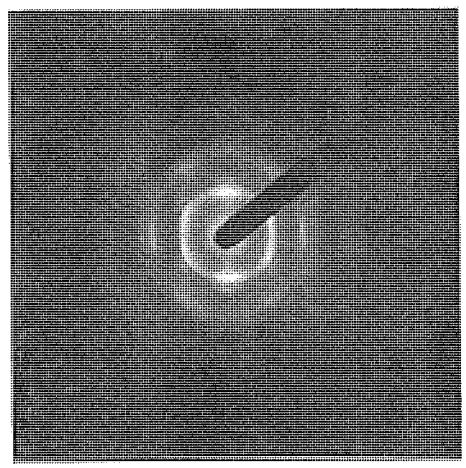
FIGS. 35A and 35B show electron diffraction patterns of a CAAC-OS layer.
Figure 35B:
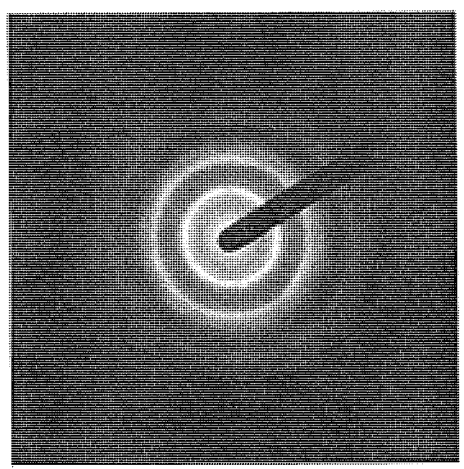

Next, a CAAC-OS layer analyzed by electron diffraction is described. For example, when an electron beam with a probe diameter of 300 nm is incident on a CAAC-OS layer including an $InGaZnO_4$ crystal in a direction parallel to the sample surface, a diffraction pattern (also referred to as a selected-area transmission electron diffraction pattern) shown in FIG. 35A can be obtained. In this diffraction pattern, spots derived from the (009) plane of an $InGaZnO_4$ crystal are included. Thus, the electron diffraction also indicates that nanocrystals included in the CAAC-OS layer have c-axis alignment and that the c-axes are aligned in a direction substantially perpendicular to the formation surface or the top surface of the CAAC-OS layer. Meanwhile, FIG. 35B shows a diffraction pattern obtained in such a manner that an electron beam with a probe diameter of 300 nm is incident on the same sample in a direction perpendicular to the sample surface. As shown in FIG. 35B, a ring-like diffraction pattern is observed. Thus, the electron diffraction also indicates that the a-axes and b-axes of the nanocrystals included in the CAAC-OS layer do not have regular alignment. The first ring in FIG. 35B is considered to be derived from the (010) plane, the (100) plane, and the like of the $InGaZnO_4$ crystal. Furthermore, it is supposed that the second ring in FIG. 35B is derived from the (110) plane and the like.

The CAAC-OS layer is an oxide semiconductor layer having a low density of defect states. Defects in the oxide semiconductor layer are, for example, a defect due to impurity and oxygen vacancy. Therefore, the CAAC-OS layer can be regarded as an oxide semiconductor layer with a low impurity concentration, or an oxide semiconductor layer having a small amount of oxygen vacancy.

Impurities contained in the oxide semiconductor layer might serve as carrier traps or carrier generation sources. Furthermore, an oxygen vacancy in the oxide semiconductor layer serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor layer, which results in disorder of the atomic arrangement and reduced crystallinity of the oxide semiconductor layer. A heavy metal such as iron or nickel, argon, carbon dioxide, or the like has a large atomic radius (or molecular radius), and thus disturbs the atomic arrangement of the oxide semiconductor layer and decreases crystallinity.

An oxide semiconductor layer having a low density of defect states (the amount of oxygen vacancy is small) can have low carrier density. Therefore, such an oxide semiconductor layer is referred to as a highly purified intrinsic or substantially highly purified intrinsic oxide semiconductor layer. A CAAC-OS layer has a low impurity concentration and a low density of defect states. That is, a CAAC-OS layer is likely to be highly purified intrinsic or substantially highly purified intrinsic oxide semiconductor layer. Thus, a transistor including a CAAC-OS layer rarely has negative threshold voltage (is rarely normally on). The highly purified intrinsic or substantially highly purified intrinsic oxide semiconductor layer has few carrier traps. An electric charge trapped by the carrier traps in the oxide semiconductor layer takes a long time to be released. The trapped electric charge may behave like a fixed electric charge. Thus, the transistor including the oxide semiconductor layer with a high impurity concentration and a high density of defect states has unstable electrical characteristics in some cases. However, a transistor including a CAAC-OS layer has small variation in electrical characteristics and high reliability.

Since the CAAC-OS layer has a low density of defect states, carriers generated by light irradiation are less likely to be trapped in defect states. Therefore, in a transistor including the CAAC-OS layer, change in electrical characteristics due to irradiation with visible light or ultraviolet light is small.

<Microcrystalline Oxide Semiconductor Layer>

Next, a microcrystalline oxide semiconductor layer is described.

A microcrystalline oxide semiconductor layer has a region in which a crystal part is observed and a region in which a crystal part is not clearly observed in a high-resolution TEM image. In most cases, the size of a crystal part included in the microcrystalline oxide semiconductor layer is greater than or equal to 1 nm and less than or equal to 100 nm, or greater than or equal to 1 nm and less than or equal to 10 nm. An oxide semiconductor layer including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) layer. In a high-resolution TEM image of the nc-OS layer, for example, a grain boundary is not clearly observed in some cases. Note that there is a possibility that the origin of the nanocrystal is the same as that of a nanocrystal in a CAAC-OS layer. Therefore, a crystal part of the nc-OS layer may be referred to as a nanocrystal in the following description.

In the nc-OS layer, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS layer. Thus, the orientation of the whole film is not observed. Accordingly, the nc-OS layer cannot be distinguished from an amorphous oxide semiconductor layer, depending on an analysis method. For example, when the nc-OS layer is subjected to structural analysis by an out-of-plane method with an XRD apparatus using an X-ray beam having a diameter larger than the size of a nanocrystal, a peak which shows a crystal plane does not appear. Furthermore, a diffraction pattern like a halo pattern is observed when the nc-OS layer is subjected to electron diffraction using an electron beam with a probe diameter (e.g., 50 nm or larger) that is larger than the size of a nanocrystal (the electron diffraction is also referred to as selected-area electron diffraction). Meanwhile, spots appear in a nanobeam electron diffraction pattern of the nc-OS layer when an electron beam having a probe diameter close to or smaller than the size of a nanocrystal is applied. Moreover, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since there is no regularity of crystal orientation between the nanocrystals as mentioned above, the nc-OS layer can also be referred to as an oxide semiconductor layer including random aligned nanocrystals (RANC) or an oxide semiconductor layer including non-aligned nanocrystals (NANC).

The nc-OS layer is an oxide semiconductor layer that has high regularity as compared with an amorphous oxide semiconductor layer. Therefore, the nc-OS layer is likely to have a lower density of defect states than an amorphous oxide semiconductor layer. Note that there is no regularity of crystal orientation between different nanocrystals in the nc-OS layer. Therefore, the nc-OS layer has a higher density of defect states than the CAAC-OS layer.

<Amorphous Oxide Semiconductor Layer>

Next, an amorphous oxide semiconductor layer is described.

The amorphous oxide semiconductor layer is an oxide semiconductor layer having disordered atomic arrangement and no crystal part and exemplified by an oxide semiconductor layer that exists in an amorphous state, such as quartz.

In a high-resolution TEM image of the amorphous oxide semiconductor layer, crystal parts cannot be found.

When the amorphous oxide semiconductor layer is subjected to structural analysis by an out-of-plane method with an XRD apparatus, a peak that shows a crystal plane does not appear. A halo pattern is observed when the amorphous oxide semiconductor layer is subjected to electron diffraction. Furthermore, a spot is not observed and a halo pattern appears when the amorphous oxide semiconductor layer is subjected to nanobeam electron diffraction.

There are various understandings of an amorphous structure. For example, a structure whose atomic arrangement does not have ordering at all may be called a completely amorphous structure. Meanwhile, a structure that has ordering within the nearest neighbor atomic distance or the second-nearest neighbor atomic distance but does not have long-range ordering is also called an amorphous structure.

Therefore, the strictest definition does not permit an oxide semiconductor layer to be called an amorphous oxide semiconductor layer as long as even a negligible degree of ordering is present in an atomic arrangement. At least an oxide semiconductor layer having long-term ordering cannot be called an amorphous oxide semiconductor layer. Accordingly, because of the presence of crystal part, for example, a CAAC-OS layer and an nc-OS layer cannot be called an amorphous oxide semiconductor layer or a completely amorphous oxide semiconductor layer.

<Amorphous-Like Oxide Semiconductor Layer>

Note that an oxide semiconductor layer may have a structure having physical properties between the nc-OS layer and the amorphous oxide semiconductor layer. The oxide semiconductor layer having such a structure is specifically referred to as an amorphous-like oxide semiconductor (a-like OS) layer.

In a high-resolution TEM image of the a-like OS layer, a void may be observed. Furthermore, in the high-resolution TEM image, there are a region where a crystal part is clearly observed and a region where a crystal part is not observed.

The a-like OS layer has an unstable structure because it contains a void. To verify that an a-like OS layer has an unstable structure as compared with a CAAC-OS layer and an nc-OS layer, a change in structure caused by electron irradiation is described below.

An a-like OS layer, an nc-OS layer, and a CAAC-OS layer are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 36:
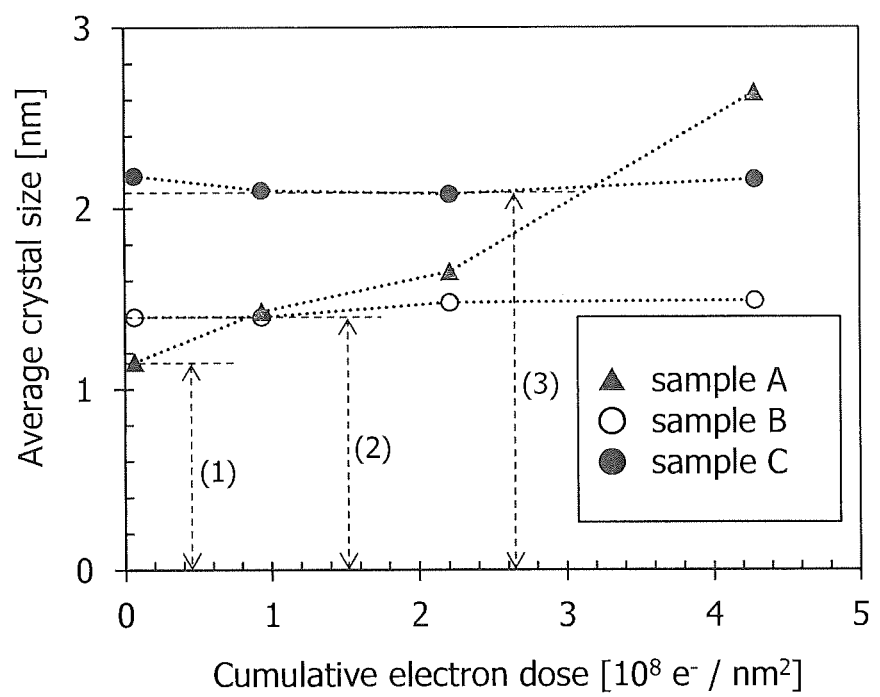
FIG. 36 shows a change of crystal parts of an In—Ga—Zn oxide owing to electron irradiation.

FIG. 36 shows change in the average size of crystal parts (at 22 points to 45 points) in each sample. Note that the crystal part size corresponds to the length of a lattice fringe. FIG. 36 indicates that the crystal part size in the a-like OS layer (sample A) increases with an increase in the cumulative electron dose. Specifically, as shown by (1) in FIG. 36, a crystal part of approximately 1.2 nm at the start of TEM observation (the crystal part is also referred to as an initial nucleus) grows to a size of approximately 2.6 nm at a cumulative electron dose of $4.2 \times 10^8$ e$^+$/nm$^2$. In contrast, the crystal part size in the nc-OS layer (sample B) and the CAAC-OS layer (sample C) shows little change from the start of electron irradiation to a cumulative electron dose of $4.2 \times 10^8$ e$^-$/nm$^2$. Specifically, as shown by (2) and (3) in FIG. 36, the average crystal sizes in an nc-OS layer and a CAAC-OS layer are approximately 1.4 nm and approximately 2.1 nm, respectively, regardless of the cumulative electron dose.

In this manner, growth of the crystal part in the a-like OS layer is induced by electron irradiation. In contrast, in the nc-OS layer and the CAAC-OS layer, growth of the crystal part is hardly induced by electron irradiation. Therefore, the a-like OS layer has an unstable structure as compared with the nc-OS layer and the CAAC-OS layer.

The a-like OS layer has a lower density than the nc-OS layer and the CAAC-OS layer because it contains a void. Specifically, the density of the a-like OS layer is higher than or equal to 78.6% and lower than 92.3% of the density of the single crystal oxide semiconductor having the same composition. The density of each of the nc-OS layer and the CAAC-OS layer is higher than or equal to 92.3% and lower than 100% of the density of the single crystal oxide semiconductor layer having the same composition. Note that it is difficult to deposit an oxide semiconductor layer having a density of lower than 78% of the density of the single crystal oxide semiconductor layer.

For example, in the case of an oxide semiconductor layer having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor layer having an atomic ratio of In:Ga:Zn=1:1:1, the density of the a-like OS layer is higher than or equal to 5.0 g/cm$^3$ and lower than 5.9 g/cm$^3$. For example, in the case of the oxide semiconductor layer having an atomic ratio of In:Ga:Zn=1:1:1, the density of each of the nc-OS layer and the CAAC-OS layer is higher than or equal to 5.9 g/cm$^3$ and lower than 6.3 g/cm$^3$.

Note that there is a possibility that an oxide semiconductor layer having a certain composition cannot exist in a single crystal structure. In that case, single crystal oxide semiconductor layers with different compositions are combined at a desired ratio, which makes it possible to calculate density equivalent to that of a single crystal oxide semiconductor layer with the desired composition. The density of a single crystal oxide semiconductor layer having the desired composition can be calculated using a weighted average according to the combination ratio of the single crystal oxide semiconductor layers with different compositions. Note that it is preferable to use as few kinds of single crystal oxide semiconductor layers as possible to calculate the density.

As described above, oxide semiconductor layers have various structures and various properties. Note that an oxide semiconductor layer may be a stacked layer including two or more of an amorphous oxide semiconductor layer, an a-like OS layer, a microcrystalline oxide semiconductor layer, and a CAAC-OS layer, for example.

Embodiment 5

In this embodiment, a structural example of a semiconductor device including the transistor of one embodiment of the present invention will be described with reference to drawings.

[Cross-Sectional Structure]

Figure 37A:
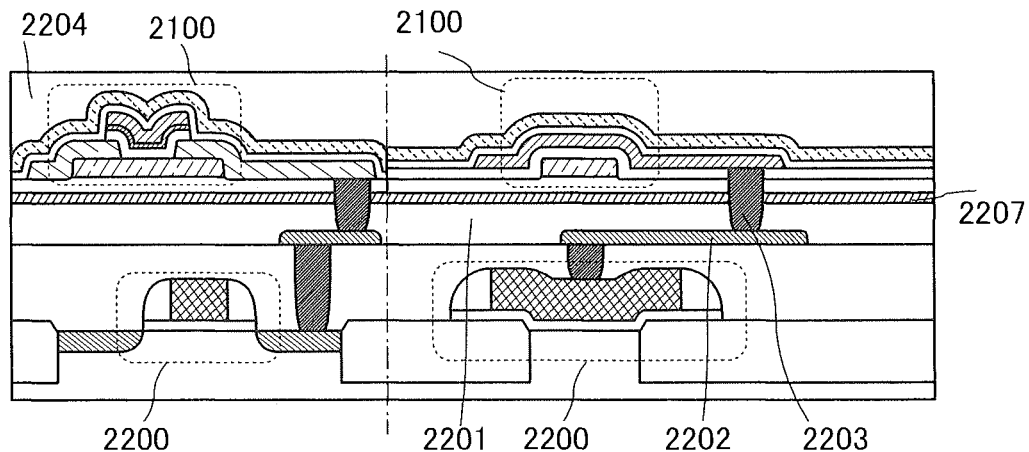
FIGS. 37A to 37D are cross-sectional views and circuit diagrams illustrating one embodiment of a semiconductor device.

FIG. 37A is a cross-sectional view of a semiconductor device of one embodiment of the present invention. The semiconductor device illustrated in FIG. 37A includes a transistor 2200 including a first semiconductor material in a lower portion and a transistor 2100 including a second semiconductor material in an upper portion. As the transistor 2100, any of the transistors described in the above embodiments can be used, and in FIG. 37A, an example in which the transistor 101 in the above embodiment is used as the transistor 2100 is shown. A cross-sectional view of the transistors in the channel length direction is on the left side of a dashed-dotted line, and a cross-sectional view of the transistors in the channel width direction is on the right side of the dashed-dotted line.

Note that the transistor 2100 may be provided with a back gate.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention that includes an oxide semiconductor.

FIG. 37A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An interlayer insulating film 2204 covering the transistor 2100 is provided.

Since the two kinds of transistors are stacked, the area occupied by the circuit can be reduced, allowing a plurality of circuits to be arranged at high density Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be formed using, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Furthermore, a blocking film having a function of preventing entry of hydrogen may be formed over the transistor 2100 to cover the transistor 2100 including an oxide semiconductor film. For the blocking film, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented.

Note that the transistor 2200 can be any of transistors of various types without being limited to a planar type transistor. For example, the transistor 2200 can be a fin-type transistor, a tri-gate transistor, or the like. An example of a cross-sectional view in such a case is shown in FIG. 37D. An insulating film 2212 is provided over a semiconductor substrate 2211. The semiconductor substrate 2211 has a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Although the gate electrode 2213 has a single-layer structure in this embodiment, one embodiment of the present invention is not limited to this example, and the gate electrode 2213 may have a stacked-layer structure of two or more layers. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

[Circuit Configuration Example]

In the above structure, electrodes of the transistors 2100 and 2200 can be connected in a variety of ways; thus, a variety of circuits can be configured. Examples of circuit configurations that can be achieved by using the semiconductor device of one embodiment of the present invention is described below.

Figure 37B:
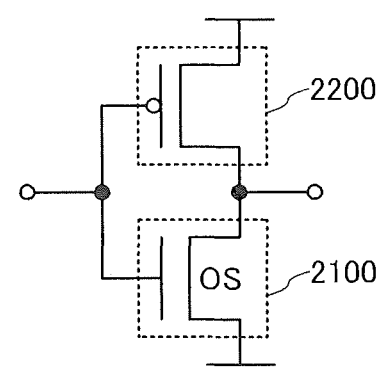

A circuit diagram in FIG. 37B shows a configuration of what is called a CMOS circuit in which the p-channel transistor 2200 and the n-channel transistor 2100 are connected to each other in series and in which gates of them are connected to each other.

Figure 37C:
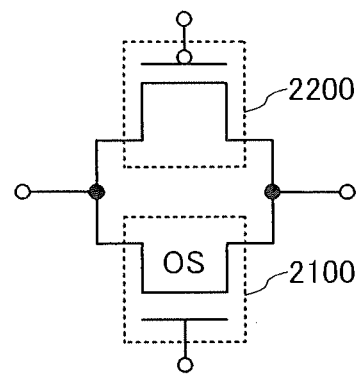
Figure 37D:
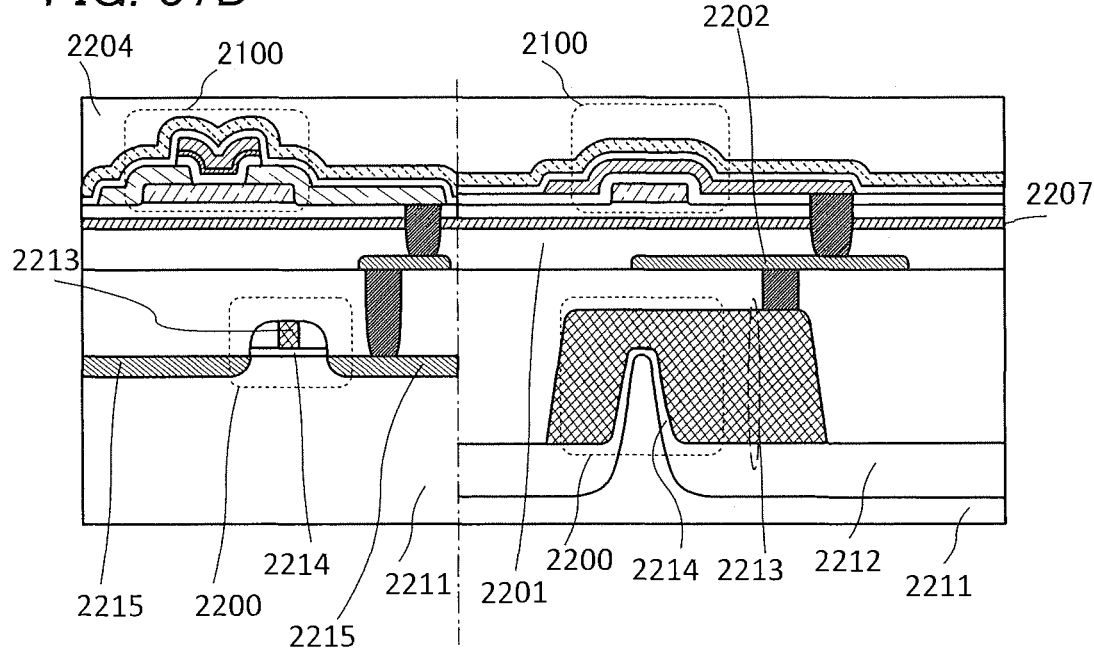

A circuit diagram in FIG. 37C shows a configuration in which sources of the transistors 2100 and 2200 are connected to each other and drains of the transistors 2100 and 2200 are connected to each other. With such a configuration, the transistors can function as what is called an analog switch.

Figure 38:
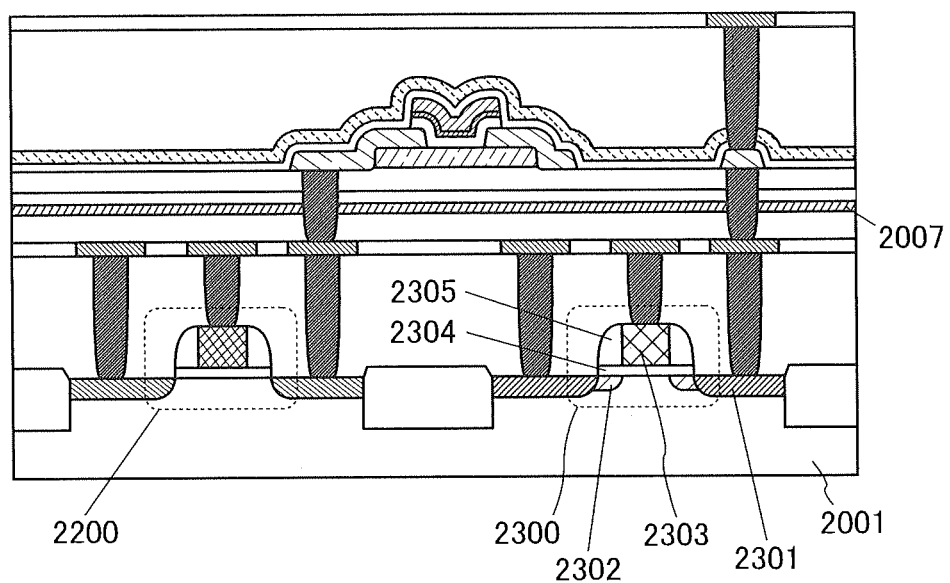
FIG. 38 is a cross-sectional view illustrating one embodiment of a semiconductor device.

FIG. 38 is a cross-sectional view of a semiconductor device in which a CMOS circuit includes a transistor 2200 and a transistor 2300 each having a channel formed using a first semiconductor material.

The transistor 2300 includes impurity regions 2301 serving as a source region or a drain region, a gate electrode 2303, a gate insulating film 2304, and a sidewall insulating film 2305. The transistor 2300 may also include an impurity region 2302 serving as an LDD region under the sidewall insulating film 2305. The description for FIG. 37A can be referred to for the other components in FIG. 38.

The polarities of the transistor 2200 and the transistor 2300 are preferably different from each other. For example, when the transistor 2200 is a p-channel transistor, the transistor 2300 is preferably an n-channel transistor.

A photoelectric conversion element such as a photodiode may be provided in the semiconductor devices illustrated in FIG. 37A and FIG. 38.

The photodiode may be formed using a single crystal semiconductor or a polycrystalline semiconductor. A photodiode using a single crystal semiconductor or a polycrystalline semiconductor is preferable because of its high light detection sensitivity.

Figure 39A:
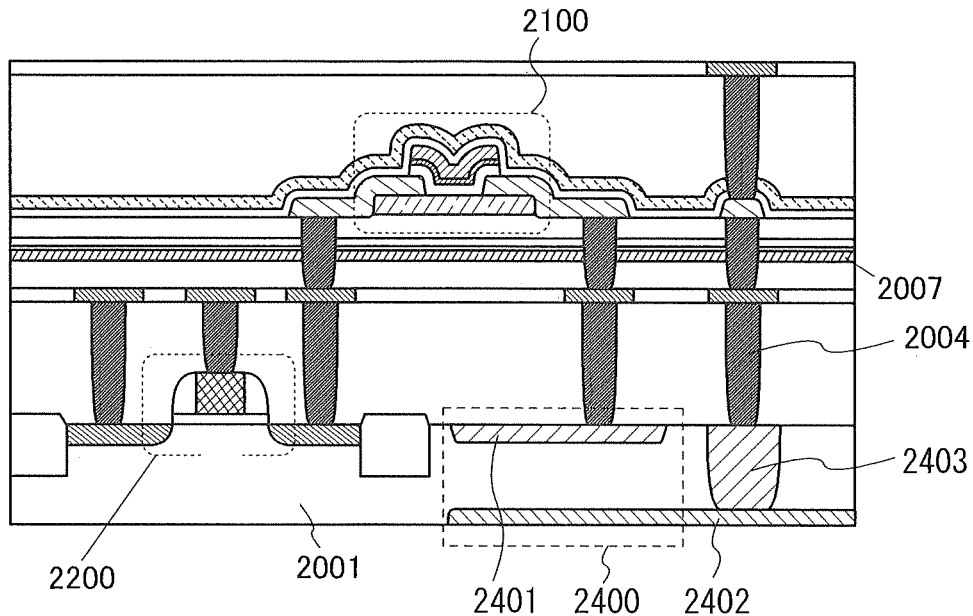
FIGS. 39A and 39B are cross-sectional views illustrating one embodiment of a semiconductor device.

FIG. 39A is a cross-sectional view of a semiconductor device where a substrate 2001 is provided with a photodiode 2400. The photodiode 2400 includes a conductive film 2401 having a function as one of an anode and a cathode, a conductive film 2402 having a function as the other of the anode and the cathode, and a conductive film 2403 electrically connecting the conductive film 2402 and a plug 2004. The conductive films 2401 to 2403 may be formed by injecting an impurity in the substrate 2001.

Although the photodiode 2400 is provided so that a current flows in the vertical direction with respect to the substrate 2001 in FIG. 39A, the photodiode 2400 may be provided so that a current flows in the lateral direction with respect to the substrate 2001.

Figure 39B:
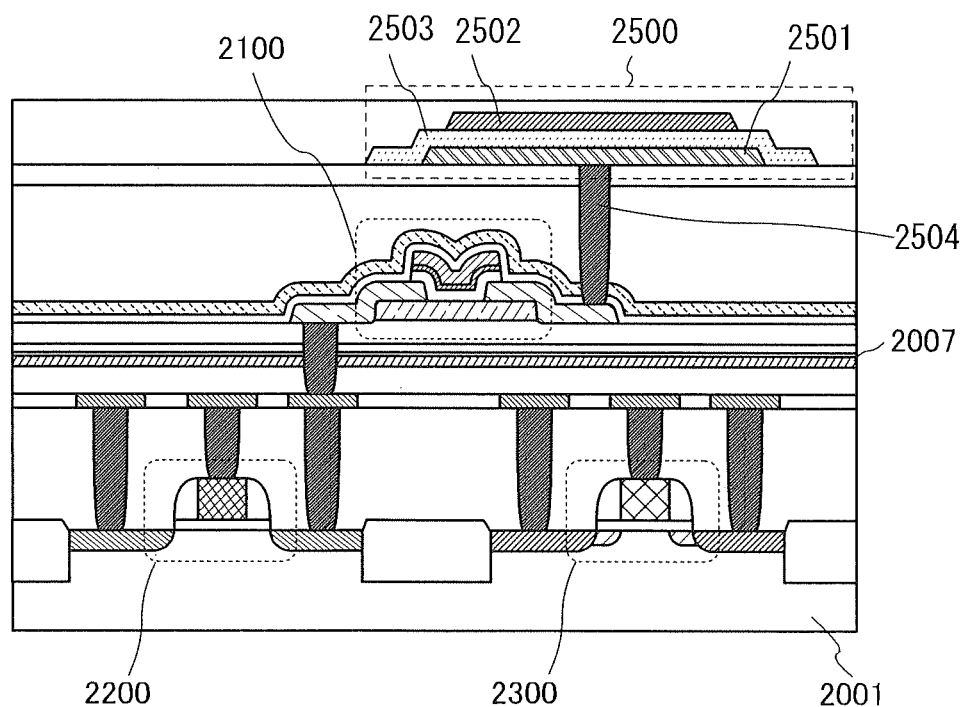

FIG. 39B is a cross-sectional view of a semiconductor device where a photodiode 2500 is provided above the transistor 2100. The photodiode 2500 includes a conductive film 2501 having a function as one of an anode and a cathode, a conductive film 2502 having a function as the other of the anode and the cathode, and a semiconductor layer 2503. Furthermore, the photodiode 2500 is electrically connected to the transistor 2100 through a plug 2504.

In FIG. 39B, the photodiode 2500 may be provided at the same level as the transistor 2100. Alternatively, the photodiode 2500 may be provided at the level between the transistor 2200 and the transistor 2100.

The description for FIG. 37A and FIG. 38 can be referred to for the details of other components in FIGS. 39A and 39B.

The photodiode 2400 or the photodiode 2500 may be formed using a material capable of generating charge by absorbing a radiation. Examples of the material capable of generating charge by absorbing a radiation include selenium, lead iodide, mercury iodine, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, X-rays, and gamma rays, for example.

<Memory Device>

Figure 40A:
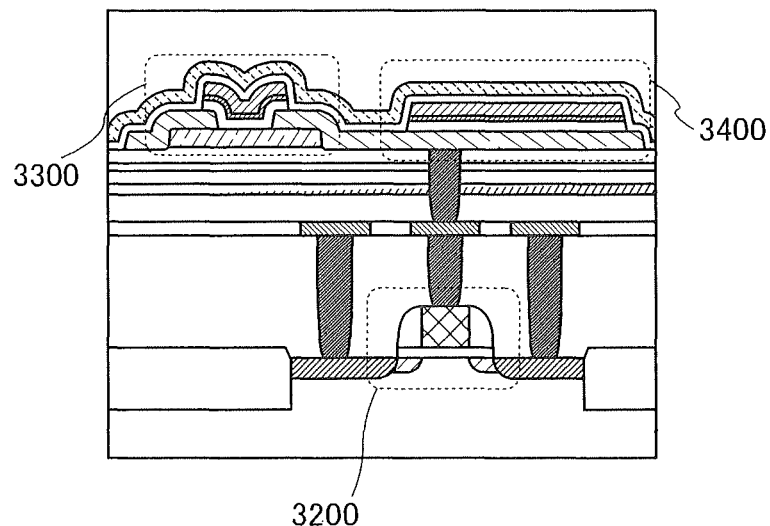
FIGS. 40A to 40C are a cross-sectional view and circuit diagrams illustrating one embodiment of a semiconductor device.
Figure 40B:
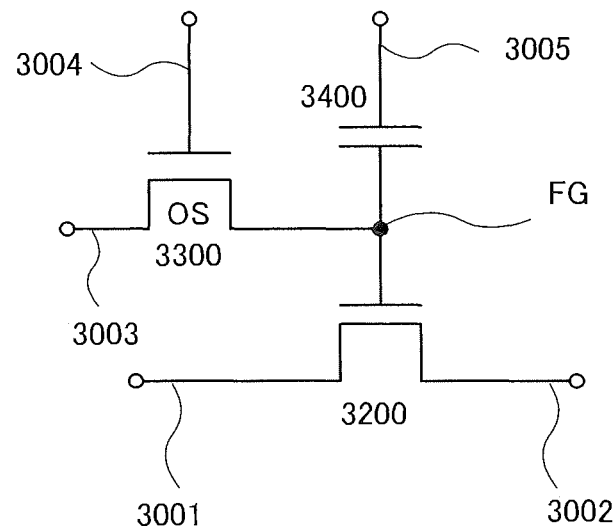
Figure 40C:
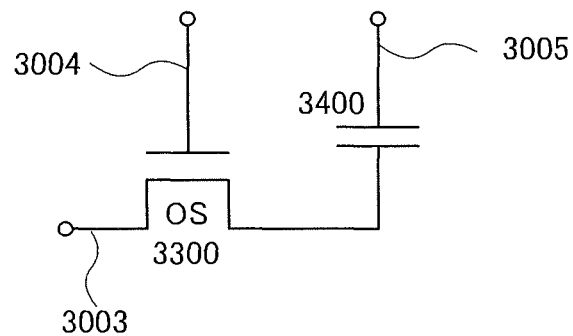

Examples of a semiconductor device (memory device) which includes the transistor of one embodiment of the present invention, which can retain stored data even when not powered, and which has an unlimited number of write cycles are shown in FIGS. 40A to 40C. Note that FIG. 40B is a circuit diagram of the structure in FIG. 40A.

The semiconductor device illustrated in FIGS. 40A and 40B includes a transistor 3200 including a first semiconductor material, a transistor 3300 including a second semiconductor material, and a capacitor 3400. Note that any of the above-described transistor described in Embodiment 1 can be used as the transistor 3300.

In the transistor 3300, a channel is formed in a semiconductor layer including an oxide semiconductor. Since the off-state current of the transistor 3300 is low, stored data can be retained for a long time. In other words, power consumption can be sufficiently reduced because a semiconductor memory device in which refresh operation is unnecessary or the frequency of refresh operation is extremely low can be provided.

In FIG. 40B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to a first terminal of the capacitor 3400. A fifth wiring 3005 is electrically connected to a second terminal of the capacitor 3400.

The semiconductor device in FIG. 40A has a feature that the potential of the gate electrode of the transistor 3200 can be retained, and thus enables writing, retaining, and reading of data as follows.

Writing and retaining of data is described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate of the transistor 3200 (writing). Here, one of two kinds of charge providing different potential levels (hereinafter referred to as low-level charge and high-level charge) is supplied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies in accordance with the amount of charge retained in the gate of the transistor 3200. This is because in general, when an n-channel transistor is used as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate of the transistor 3200 in writing and the potential of the fifth wiring 3005 is $V_0$ ($>V_{th\_H}$), the transistor 3200 is turned on. In the case where the low-level charge is supplied to the gate of the transistor 3200 in writing, the transistor 3200 remains off even when the potential of the fifth wiring 3005 is $V_0$ ($<V_{th\_L}$). Thus, the data retained in the gate of the transistor 3200 can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 40C is different from the semiconductor device illustrated in FIG. 40A in that the transistor 3200 is not provided. In this case, data writing and retaining operations can be performed in a manner similar to those of the semiconductor device illustrated in FIG. 40A.

Next, reading of data in the semiconductor device illustrated in FIG. 40C is described. When the transistor 3300 is turned on, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 depends on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 when the potential $V_1$ is retained ($=(C_B \times V_{B0} + C \times V_1)/(C_B + C)$) is higher than the potential of the third wiring 3003 when the potential $V_0$ is retained ($=(C_B \times V_{B0} C \times V_0)/(C_B + C)$).

Then, by comparing the potential of the third wiring 3003 with a predetermined potential, data can be read.

In this case, a transistor including the first semiconductor material may be used in a driver circuit for driving a memory cell, and a transistor including the second semiconductor material may be stacked as the transistor 3300 over the driver circuit.

When a transistor having a channel formation region formed using an oxide semiconductor and having an extremely low off-state current is used in the semiconductor device described in this embodiment, the semiconductor device can retain stored data for an extremely long time. In other words, refresh operation becomes unnecessary or the frequency of the refresh operation can be extremely low, leading to a sufficient reduction in power consumption. Moreover, stored data can be retained for a long time even when not powered (note that a potential is preferably fixed).

Furthermore, in the semiconductor device described in this embodiment, a high voltage is not needed for data writing and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Moreover, since data is written depending on the state of the transistor (on or off), high-speed operation can be easily achieved.

The memory device described in this embodiment can also be used in an LSI such as a central processing unit (CPU), a digital signal processor (DSP), a custom LSI, or a programmable logic device (PLD), for example.

The structures, methods, and the like described in this embodiment can be used in appropriate combination with the structures, methods, and the like described in any of the other embodiments.

Embodiment 6

In this embodiment, a CPU in which the transistor described in any of Embodiments 1 to 3 can be used and the memory device described in Embodiment 5 is included will be described.

Figure 41:
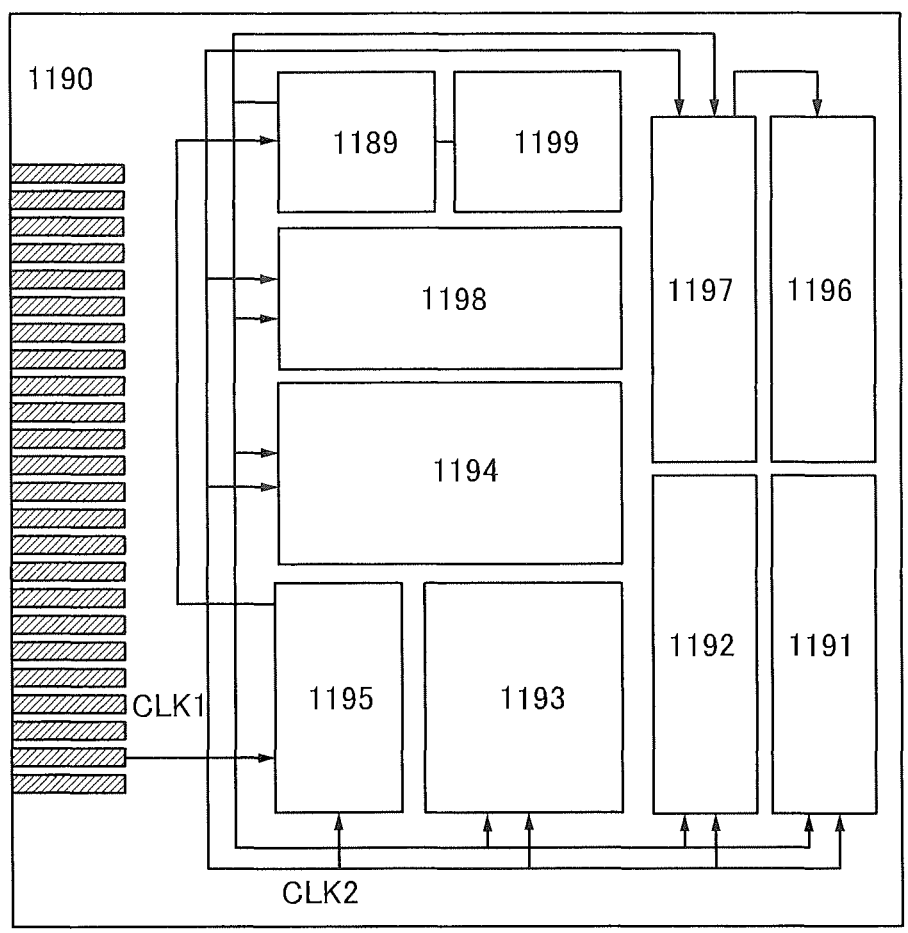
FIG. 41 is a block diagram illustrating a display device.

FIG. 41 is a block diagram illustrating a configuration example of a CPU at least partly including any of the transistors described in the above embodiments as a component.

The CPU illustrated in FIG. 41 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 41 is just an example in which the configuration is simplified, and an actual CPU may have a variety of configurations depending on the application. For example, the CPU may have the following configuration: a structure including the CPU illustrated in FIG. 41 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 41, a memory cell is provided in the register 1196. For the memory cell of the register 1196, the transistor described in Embodiment 1 or 2 or the memory device described in Embodiment 5 can be used.

In the CPU illustrated in FIG. 41, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

The structures, methods, and the like described in this embodiment can be used in appropriate combination with the structures, methods, and the like described in any of the other embodiments.

Embodiment 7

In this embodiment, configuration examples of a display device using the semiconductor device of one embodiment of the present invention will be described.

[Configuration Example]

Figure 42A:
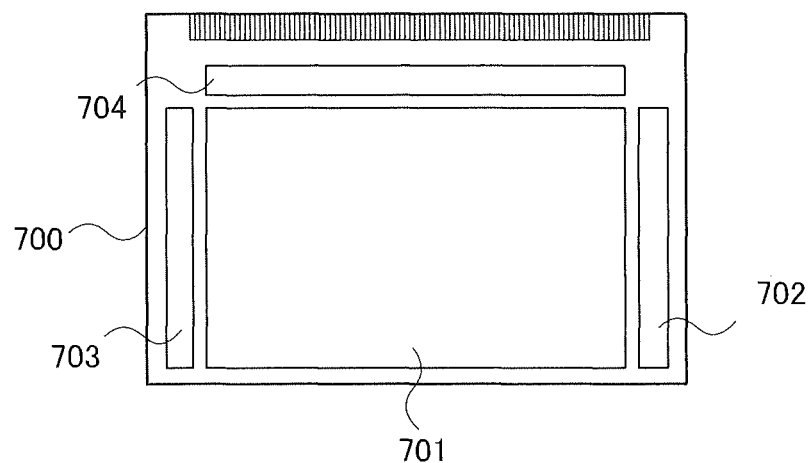
FIG. 42A illustrates a configuration example of a display device.
Figure 42B:
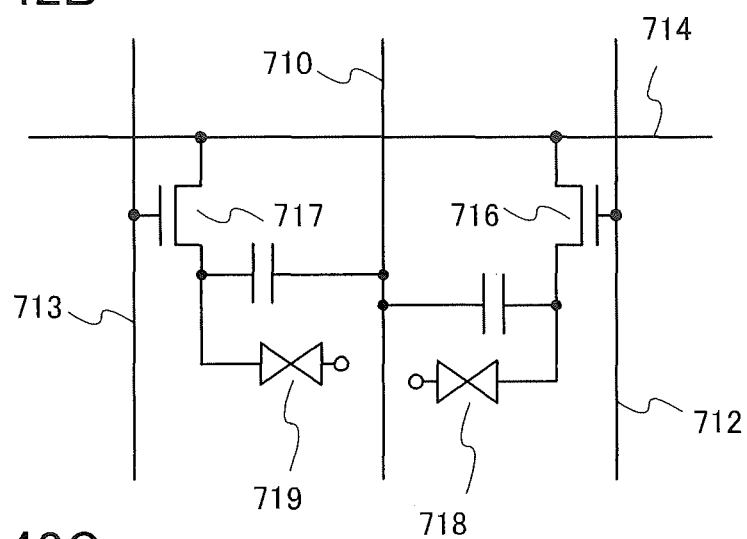
FIGS. 42B and 42C are circuit diagrams of pixels.
Figure 42C:
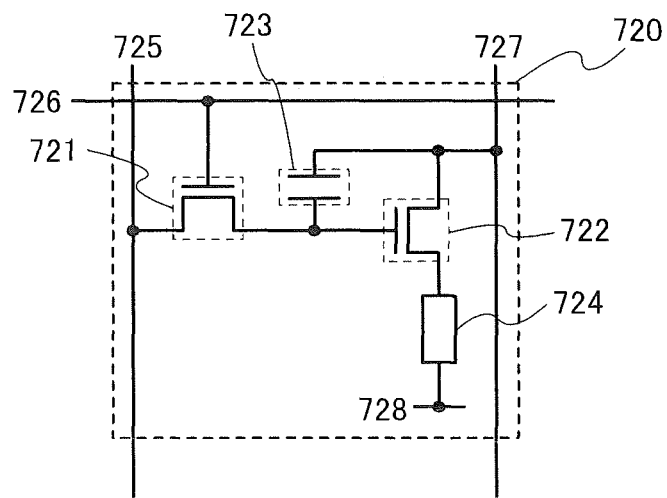

FIG. 42A is a top view of the display device using the semiconductor device of one embodiment of the present invention. FIG. 42B is a circuit diagram illustrating a pixel circuit that can be used in the case where a liquid crystal element is used in a pixel in the display device using the semiconductor device of one embodiment of the present invention. FIG. 42C is a circuit diagram illustrating a pixel circuit that can be used in the case where an organic EL element is used in a pixel in the display device using the semiconductor device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 42A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 42A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

[Liquid Crystal Display Device]

FIG. 42B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

A first pixel electrode is electrically connected to the transistor 716 and a second pixel electrode is electrically connected to the transistor 717. The first pixel electrode and the second pixel electrode are separated. Shapes of the first pixel electrode and the second pixel electrode are not especially limited. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 42B. For example, a switch, a resistor, a capacitor, a transistor, a sensor, a logic circuit, or the like may be added to the pixel circuit illustrated in FIG. 42B.

[Organic EL Display Device]

FIG. 42C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 42C illustrates an applicable example of a pixel circuit. Here, one pixel includes two n-channel transistors. Furthermore, digital time grayscale driving can be employed for the pixel circuit.

The configuration of the applicable pixel circuit and operation of a pixel employing digital time grayscale driving is described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 42C. For example, a switch, a resistor, a capacitor, a sensor, a transistor, a logic circuit, or the like may be added to the pixel circuit illustrated in FIG. 42C.

In the case where the transistor shown in any of the above embodiments is used for the circuit shown in FIGS. 42A to 42C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, for example, a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included.

Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be combined as appropriate with any of the other embodiments and examples in this specification.

Embodiment 8

In this embodiment, a display module using a semiconductor device of one embodiment of the present invention will be described with reference to FIG. 43.

In a display module 8000 in FIG. 43, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel function is added. An electrode for a touch sensor may be provided in each pixel of the display panel 8006 so that a capacitive touch panel function is added. A display module with a position input function may be used as the display panel 8006. Note that the position input function can be added by providing the display panel 8006 with the touch panel 8004.

The backlight unit 8007 includes a light source 8008. The light source 8008 may be provided at an end portion of the backlight unit 8007 and a light diffusing plate may be used.

The frame 8009 protects the display panel 8006 and also serves as an electromagnetic shield for blocking electromagnetic waves generated by the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

This embodiment can be combined as appropriate with any of the other embodiments and examples in this specification.

Embodiment 9

In this embodiment, application examples of an RF device that can be equipped with the semiconductor device of one embodiment of the present invention will be described with reference to FIGS. 45A to 45F. The RF device is widely used and can be provided for, for example, products such as bills, coins, securities, bearer bonds, documents (e.g., driver's licenses or resident's cards, see FIG. 45A), recording media (e.g., DVD or video tapes, see FIG. 45B), packaging containers (e.g., wrapping paper or bottles, see FIG. 45C), vehicles (e.g., bicycles, see FIG. 45D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 45E and 45F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF device can be preferably used for application in which data is not frequently written or read.

This embodiment can be combined as appropriate with any of the other embodiments and examples in this specification.

Embodiment 10

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 44A to 44F illustrate specific examples of these electronic devices.

Figure 44A:
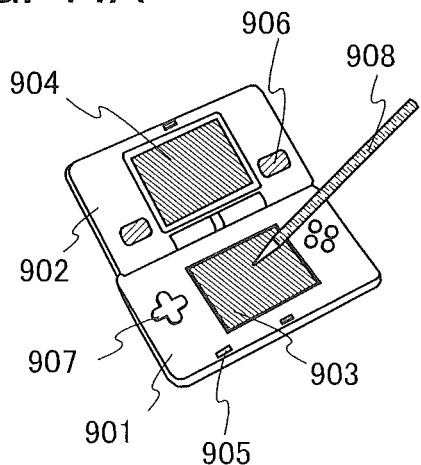
FIGS. 44A to 44F each illustrate an electronic appliance.

FIG. 44A illustrates a portable game machine including a housing 901, a housing 902, a display portion 903, a display portion 904, a microphone 905, a speaker 906, an operation key 907, a stylus 908, and the like. Although the portable game machine in FIG. 44A has the two display portions 903 and 904, the number of display portions included in a portable game machine is not limited to this.

Figure 44B:
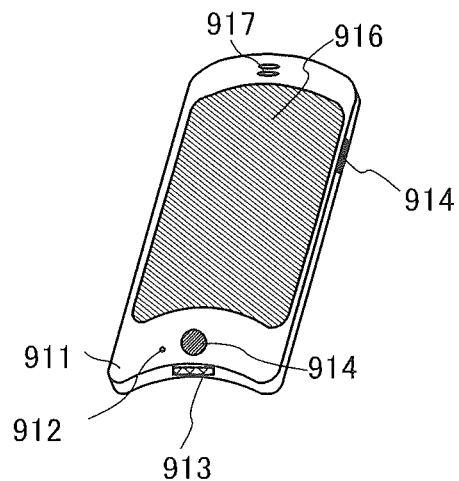

FIG. 44B illustrates a cellular phone including a housing 911, a display portion 916, operation buttons 914, an external connection port 913, a speaker 917, a microphone 912, and the like. When the display portion 916 of the cellular phone illustrated in FIG. 44B is touched with a finger or the like, data can be input. Furthermore, operations such as making a call and inputting a letter can be performed by touch on the display portion 916 with a finger or the like. With the operation buttons 914, power ON/OFF can be switched. In addition, types of images displayed on the display portion 916 can be switched; switching images from a mail creation screen to a main menu screen.

Figure 44C:
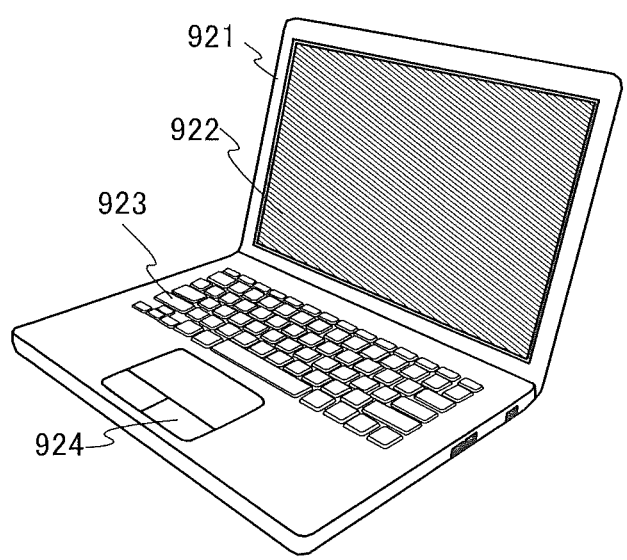

FIG. 44C illustrates a laptop personal computer including a housing 921, a display portion 922, a keyboard 923, a pointing device 924, and the like.

Figure 44D:
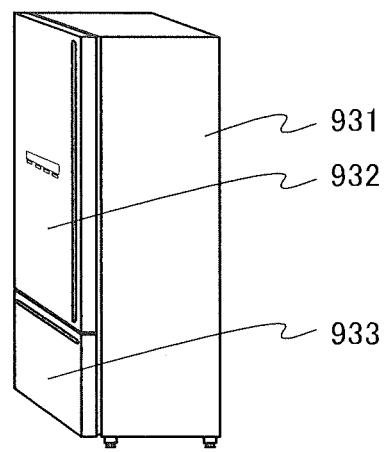

FIG. 44D illustrates an electric refrigerator-freezer including a housing 931, a refrigerator door 932, a freezer door 933, and the like.

Figure 44E:
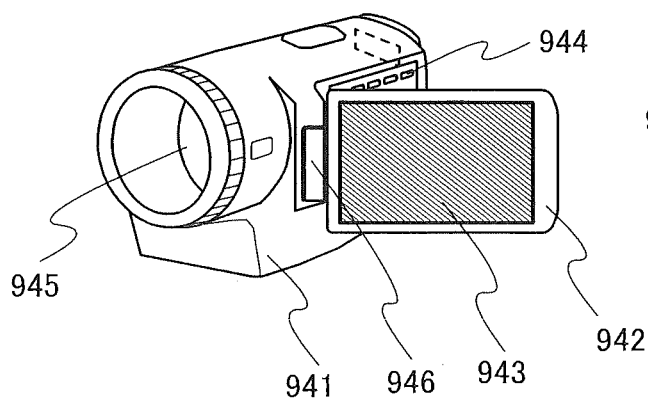

FIG. 44E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 44F:
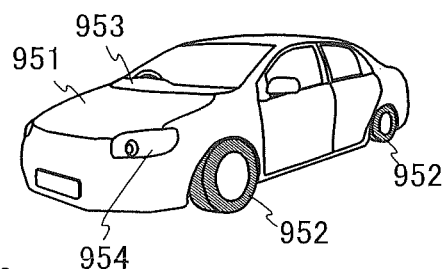
Figure 45A:
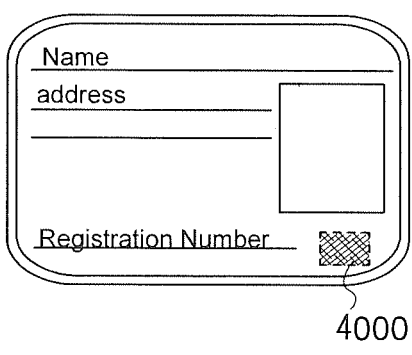
FIGS. 45A to 45F each illustrate an electronic appliance.
Figure 45B:
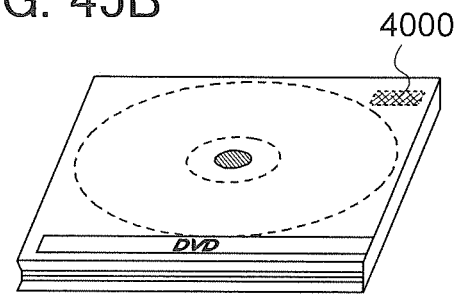
Figure 45C:
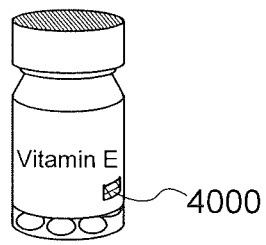
Figure 45D:
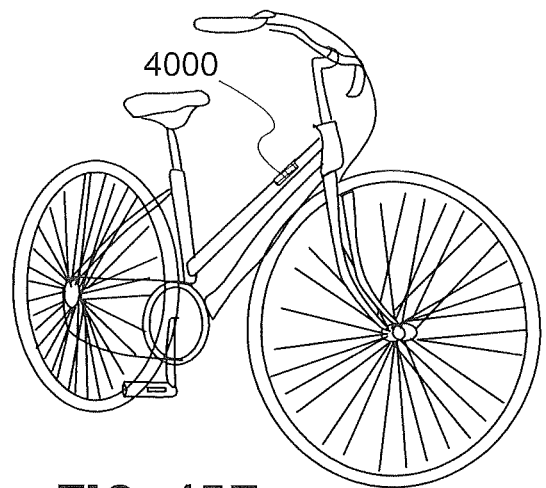
Figure 45E:
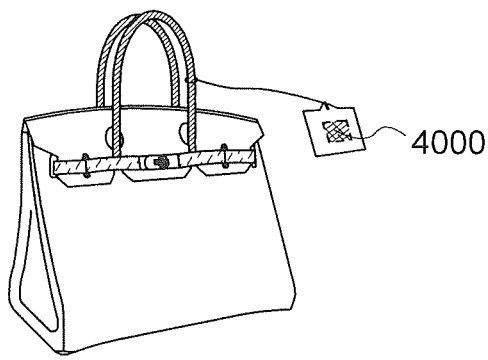
Figure 45F:
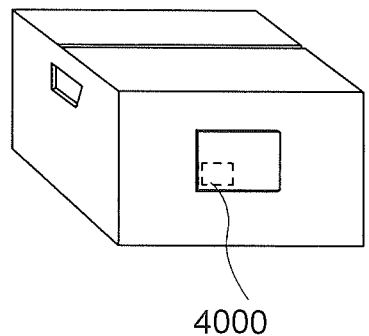

FIG. 44F illustrates an example of a car including a car body 951, wheels 952, a dashboard 953, lights 954, and the like.

This embodiment can be combined as appropriate with any of the other embodiments and examples in this specification.

Example 1

In Example 1, in the case of an aluminum oxide film formed over a silicon oxynitride film, diffusion of oxygen in the silicon oxynitride film was examined by secondary ion mass spectrometry (SIMS) measurement.

First, a method for fabricating a sample 1-a of Example 1 is described.

By thermal oxidation of a silicon wafer, a thermal oxide film was formed on a surface of the silicon wafer. The thermal oxidation film was formed to a thickness of 100 nm at 950° C. in an oxygen atmosphere containing HCl at 3 vol %.

Then, a 300-nm-thick silicon oxynitride film was formed over the thermal oxide film by a plasma CVD method using silane at a flow rate of 2.3 sccm and dinitrogen monoxide at a flow rate of 800 sccm as source gases under the conditions where the pressure in a reaction chamber was 40 Pa, the substrate temperature was 400° C., and a high frequency (RF) power of 50 W was applied.

Next, heat treatment was performed. The heat treatment was performed at 450° C. in a vacuum for 1 hour.

Then, an aluminum oxide film was formed over the silicon oxynitride film to a thickness of 70 nm by a sputtering method. As sputtering gases, oxygen and argon were supplied into a treatment chamber of a sputtering apparatus each at a flow rate of 25 sccm ($^{18}O_2$=50 vol % and Ar=50 vol %); the pressure in the treatment chamber was controlled to 0.4 Pa; and an RF power of 2.5 kW was supplied. Note that as the oxygen gas used as the sputtering gas, an oxygen gas whose oxygen molecule ($^{18}O_2$) includes oxygen atoms having a mass number of 18 was used. In addition, the aluminum oxide film was formed at a substrate temperature of 250° C. Moreover, the aluminum oxide film was formed using aluminum oxide ($Al_2O_3$) as a sputtering target.

Figure 46:
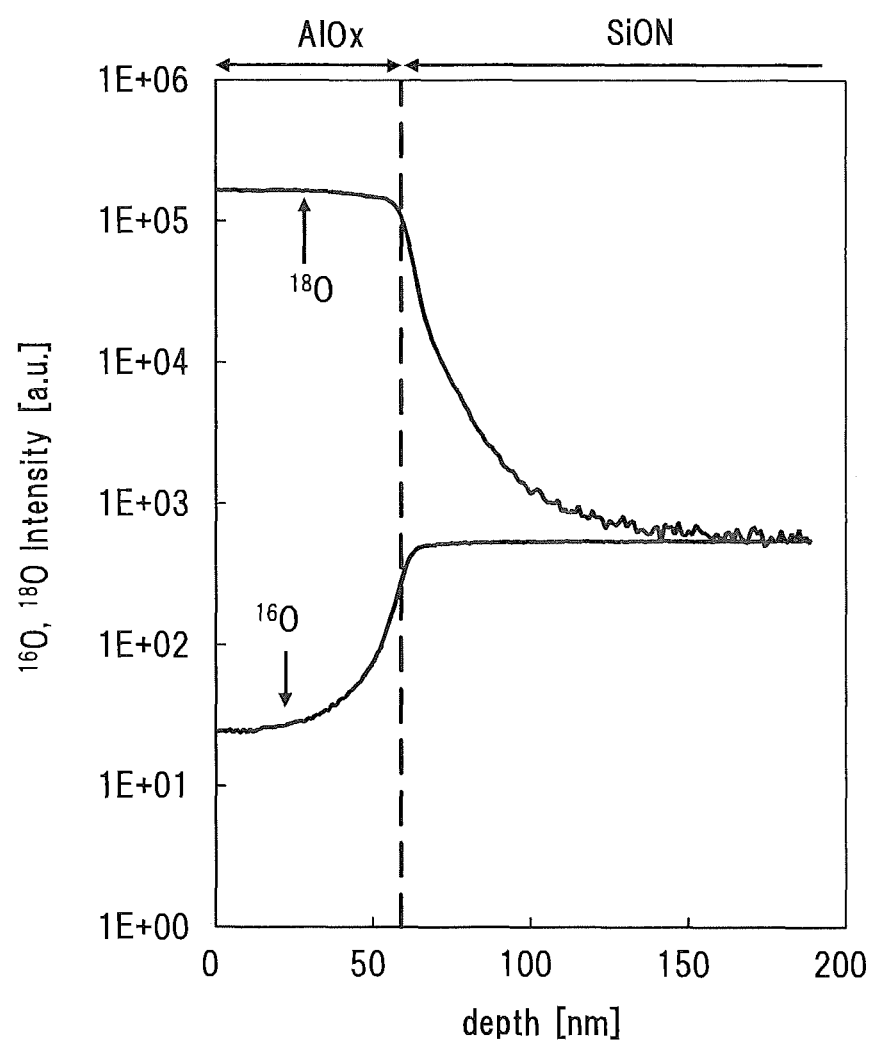
FIG. 46 shows SIMS measurement results of a sample in Example.

Next, diffusion of oxygen in the silicon oxynitride film in the fabricated sample was measured by SIMS, and the result is shown in FIG. 46. In FIG. 46, the vertical axis indicates intensity (arbitrary unit) [a.u.]. Note that in the case where $^{16}O$ and $^{18}O$ each exist at a proportion of a naturally-occurring oxygen isotope, ion intensity which is converted such that values of $^{16}O$ and $^{18}O$ overlap with each other is obtained as the arbitrary unit. The horizontal axis indicates depth [nm]. Note that SIMS measurement was performed by using an ADEPT-1010 quadrupole mass spectrometry instrument manufactured by ULVAC-PHI, Inc.

By formation of the aluminum oxide film over the silicon oxynitride film, in the silicon oxynitride film, oxygen was found to be diffused down to a depth of approximately 100 nm from the interface between the silicon oxynitride film and the aluminum oxide film.

Example 2

In Example 2, in the case of an aluminum oxide film formed over a silicon oxide film, diffusion of argon in the silicon oxide film was examined by SIMS measurement.

First, a method for fabricating samples 2-a and 2-b of Example 2 is described.

By thermal oxidation of a silicon wafer, a thermal oxide film was formed on a surface of the silicon wafer. The thermal oxidation film was formed to a thickness of 100 nm at 950° C. in an oxygen atmosphere containing HCl at 3 vol %.

Then, a silicon oxide film was formed over the thermal oxide film to a thickness of 300 nm by a sputtering method. As sputtering gases, oxygen and argon were supplied into a treatment chamber of a sputtering apparatus at a flow rate of 50 sccm and a flow rate of 0 sccm ($O_2$=100 vol % and Ar=0 vol %), respectively; the pressure in the treatment chamber was controlled to 0.4 Pa; and an RF power of 1.5 kW was supplied. Note that the silicon oxide film was formed at a substrate temperature of 100° C.

Next, an aluminum oxide film was formed over the silicon oxide film to a thickness of 70 nm by a sputtering method after the silicon oxide film was subjected to planarization treatment by a CMP method so as to have a flat surface. Sputtering gases were supplied to a treatment chamber of a sputtering apparatus, the pressure in the treatment chamber was controlled to be 0.4 Pa, and an RF power of 2.5 kW was supplied. Note that the aluminum oxide film was formed at a substrate temperature of 250° C. As sputtering gases of the sample 2-a, oxygen and argon were supplied at a flow rate of 0 sccm and a flow rate of 50 sccm ($O_2$=0 vol % and Ar=100 vol %), respectively. As sputtering gases of the sample 2-b, oxygen and argon were supplied at a flow rate of 50 sccm and a flow rate of 0 sccm ($O_2$=100 vol % and Ar=0 vol %), respectively.

Figure 47:
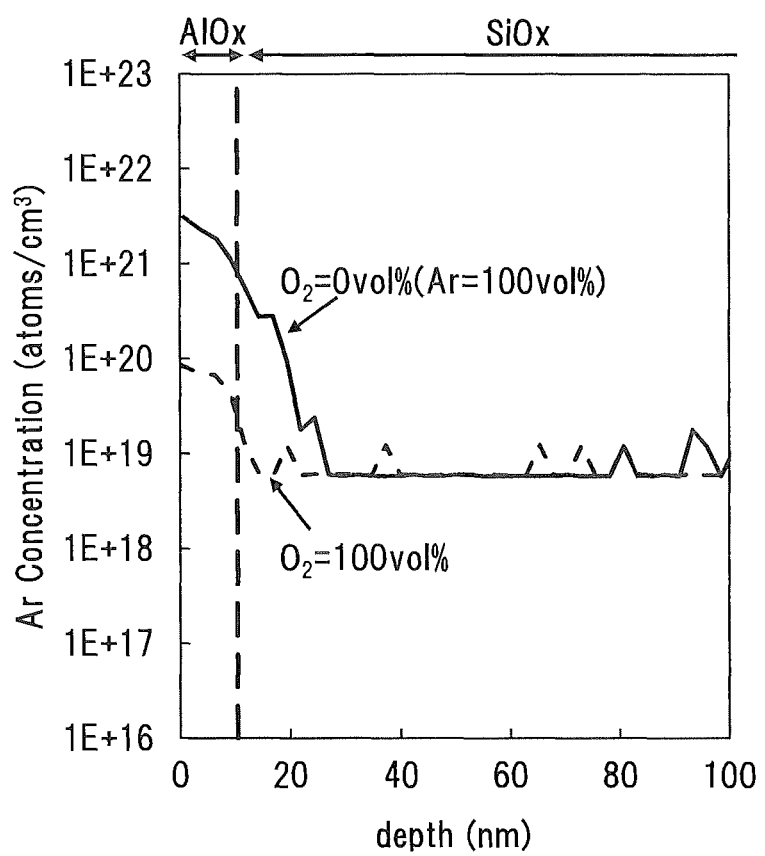
FIG. 47 shows SIMS measurement results of samples in Example.

Next, diffusion of argon in the silicon oxide film in the fabricated samples was examined by SIMS measurement, and the results are shown in FIG. 47. In FIG. 47, the vertical axis indicates concentration [atoms/cm$^3$] of argon, and the horizontal axis indicates depth [nm]. Note that SIMS measurement was performed by using an ADEPT-1010 quadrupole mass spectrometry instrument manufactured by ULVAC-PHI, Inc.

By the sputtering gases at the formation of the aluminum oxide film over the silicon oxide film, in the silicon oxide film, argon was found to be diffused down to a depth of approximately 5 nm to 15 nm from the surface (interface) of the silicon oxide film.

Example 3

In Example 3, in the case of an aluminum oxide film formed over a silicon oxide film, release of oxygen from the silicon oxide film was examined by thermal desorption spectroscopy (TDS) measurement. Here, dependence of the amount of oxygen taken into the silicon oxide film on partial pressure of oxygen at formation of the aluminum oxide film was examined.

First, a method for fabricating samples 3-a to 3-g of Example 3 is described.

First, as a structure common to the samples 3-a to 3-g, by thermal oxidation of a silicon wafer, a silicon oxide film was formed on a surface of the silicon wafer. The silicon oxide film was formed to a thickness of 100 nm at 950° C. in an oxygen atmosphere containing HCl at 3 vol %.

Then, an aluminum oxide film was formed over the silicon oxide film to a thickness of 70 nm by a sputtering method. Oxygen and argon were supplied into the treatment chamber of the sputtering apparatus; the pressure in the treatment chamber was controlled to 0.4 Pa; and an RF power of 2.5 kW was supplied. Note that the aluminum oxide film was formed at a substrate temperature of 250° C. As sputtering gases of the sample 3-a, oxygen and argon were supplied at a flow rate of 0 sccm and a flow rate of 50 sccm ($O_2$=0 vol % and Ar=100 vol %), respectively. As sputtering gases of the sample 3-b, oxygen and argon were supplied at a flow rate of 2 sccm and a flow rate of 48 sccm ($O_2$=4 vol % and Ar=96 vol %), respectively. As sputtering gases of the sample 3-c, oxygen and argon were supplied at a flow rate of 5 sccm and a flow rate of 45 sccm ($O_2$=10 vol % and Ar=90 vol %), respectively. As sputtering gases of the sample 3-d, oxygen and argon were supplied at a flow rate of 10 sccm and a flow rate of 40 sccm $O_2$=20 vol % and Ar=80 vol %), respectively. As sputtering gases of the sample 3-e, oxygen and argon were supplied each at a flow rate of 25 sccm ($O_2$=50 vol % and Ar=50 vol %), respectively. As sputtering gases of the sample 3-f, oxygen and argon were supplied at a flow rate of 40 sccm and a flow rate of 10 sccm ($O_2$=80 vol % and Ar=20 vol %), respectively. As sputtering gases of the sample 3-g, oxygen and argon were supplied at a flow rate of 50 sccm and a flow rate of 0 sccm ($O_2$=100 vol % and Ar=0 vol %), respectively. Moreover, the aluminum oxide film was formed using aluminum oxide ($Al_2O_3$) as a sputtering target.

Next, the aluminum oxide film was removed by etching. For etching treatment, an Al-Etchant (an aqueous solution containing 2.0 wt % nitric acid, 9.8 wt % acetic acid, and 72.3 wt % phosphoric acid) produced by Wako Pure Chemical Industries Co., Ltd was used at 95° C.

Figure 48:
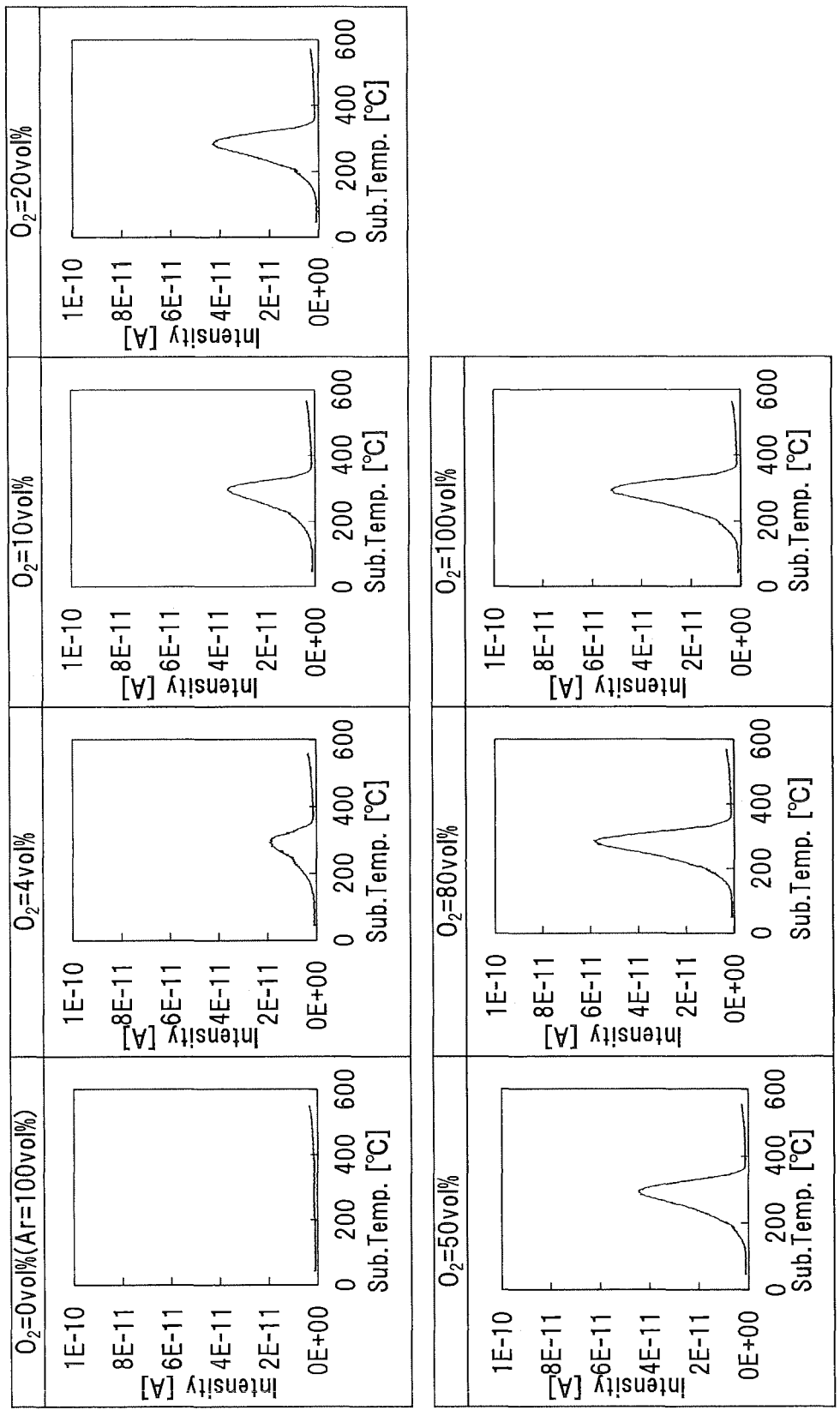
FIG. 48 shows TDS measurement results of samples in Example.

Next, release of oxygen in the fabricated samples was examined by TDS measurement, and the results are shown in FIG. 48. In FIG. 48, the vertical axis indicates intensity (current intensity) [A], and the horizontal axis indicates substrate temperature [° C.]. For the TDS measurement, EMD-WA1000S/W, a thermal desorption spectrometer manufactured by ESCO, Ltd., was used.

Note that when the evacuation speed of a measurement chamber is sufficiently high compared with a pressure change of the measurement chamber due to released gas, a change of partial pressure of released gas in the measurement chamber is proportional to the amount of released gas per unit time. With a mass spectrometer, the amount of ions is proportional to partial pressure and is therefore proportional to the amount of released gas; thus, the total amount of released gas can be calculated from area intensity which is obtained by integrating the amount of ions.

In the case of the aluminum oxide film formed over the silicon oxide film, the amount of oxygen taken into the silicon oxide film was found to be increased as partial pressure of oxygen at the formation of the aluminum oxide was increased. Furthermore, the amount of oxygen taken into the silicon oxide film was found to be increased in the case where argon was mixed at 20 vol % compared with the case where only oxygen was used as sputtering gas.

Example 4

In Example 4, in the case of an aluminum oxide film formed over a silicon oxide film, release of oxygen from the silicon oxide film was examined by TDS measurement. Here, dependence of the amount of oxygen taken into the silicon oxide film on the thickness of the aluminum oxide film was examined.

First, a method for fabricating samples 4-a to 4-f of Example 4 is described.

First, as a structure common to the samples 4-a to 4-f, by thermal oxidation of a silicon wafer, a thermal oxide film was formed on a surface of the silicon wafer. The thermal oxidation film was formed to a thickness of 100 nm at 950° C. in an oxygen atmosphere containing HCl at 3 vol %.

Then, an aluminum oxide film was formed over a silicon oxide film by a sputtering method. As sputtering gases, oxygen and argon were supplied into a treatment chamber of a sputtering apparatus each at a flow rate of 25 sccm ($O_2$=50 vol % and Ar=50 vol %); the pressure in the treatment chamber was controlled to 0.4 Pa; and an RF power of 2.5 kW was supplied. Note that the aluminum oxide film was formed at a substrate temperature of 250° C. Moreover, the aluminum oxide film was formed using aluminum oxide ($Al_2O_3$) as a sputtering target.

The aluminum oxide films of the samples 4-a, 4-b, 4-c, 4-d, 4-e, and 4-f were formed to thicknesses of 1.4 nm, 4.0 nm, 5.4 nm, 11.4 nm, 21.8 nm, and 67.2 nm, respectively.

Next, the aluminum oxide film was removed by etching. For etching treatment, an Al-Etchant was used at 85° C.

Figure 49:
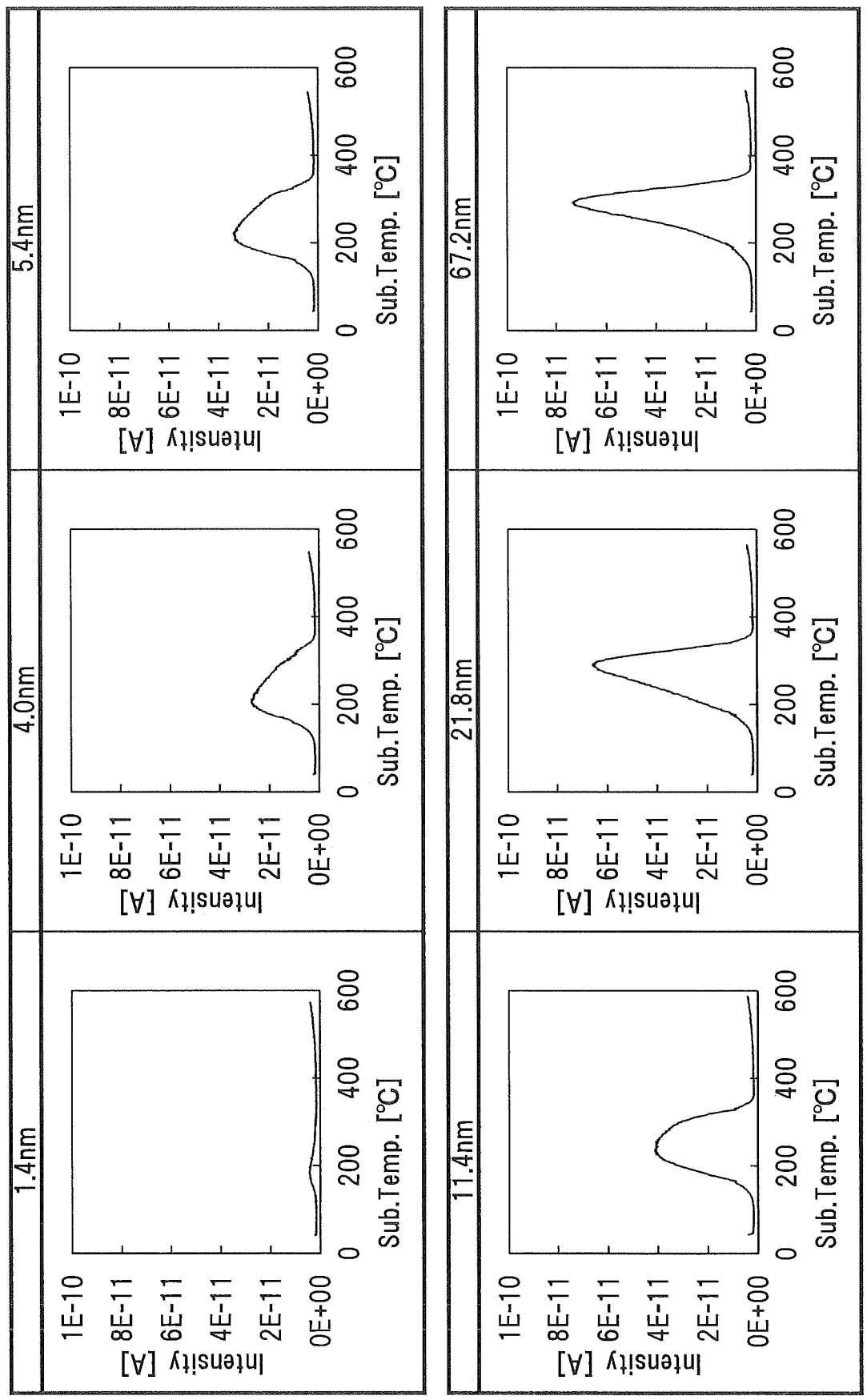
FIG. 49 shows TDS measurement results of samples in Example.

Next, release of oxygen in the fabricated samples was examined by TDS measurement, and the results are shown in FIG. 49. In FIG. 49, the vertical axis indicates intensity (current intensity) [A], and the horizontal axis indicates substrate temperature [° C.]. For the TDS measurement, EMD-WA1000S/W, a thermal desorption spectrometer manufactured by ESCO, Ltd., was used.

It was found that, among the samples up to the sample having the thickness of the aluminum oxide film of 21.8 nm, as the thickness of the aluminum oxide film was increased, the amount of oxygen taken into the silicon oxide film was increased; however, in the sample 4-e (with the 21.8-nm-thick aluminum oxide film) and the sample 4-f (with the 67.2-nm-thick aluminum oxide film), the amounts of oxygen taken into the silicon oxide films were roughly the same.

Example 5

In Example 5, in the case of an aluminum oxide film formed over a silicon oxide film, release of oxygen from the silicon oxide film was examined by TDS measurement. Here, dependence of the amount of oxygen taken into the silicon oxide film on repeatedly-performed steps of forming and then removing the aluminum oxide film was examined.

First, a method for fabricating samples 5-a to 5-d of Example 5 is described.

First, as a structure common to the samples 5-a to 5-d, by thermal oxidation of a silicon wafer, a thermal oxide film was formed on a surface of the silicon wafer. The thermal oxidation film was formed to a thickness of 100 nm at 950° C. in an oxygen atmosphere containing HCl at 3 vol %.

Then, an aluminum oxide film was not formed in the sample 5-a, and an aluminum oxide film was formed over a silicon oxide film to a thickness of 20 nm by a sputtering method in each of the samples 5-b to 5-d. As sputtering gases, oxygen and argon were supplied into a treatment chamber of a sputtering apparatus each at a flow rate of 25 sccm ($O_2$=50 vol % and Ar=50 vol %); the pressure in the treatment chamber was controlled to 0.4 Pa; and an RF power of 2.5 kW was supplied. In addition, the aluminum oxide film was formed at a substrate temperature of 250° C. Moreover, the aluminum oxide film was formed using aluminum oxide ($Al_2O_3$) as a sputtering target.

Next, the aluminum oxide film was removed by ICP etching in each of the samples 5-b to 5-d. The etching was performed under the following conditions: a boron trichloride ($BCl_3$=80 sccm) atmosphere; power supply, 450 W; bias power, 100 W; and pressure, 1.9 Pa.

Steps of forming and then removing the aluminum oxide film were performed once in the sample 5-b, and repeated twice in the sample 5-c and four times in the sample 5-d, whereby the samples were fabricated. That is, the numbers of repetitions of the step of forming and then removing the aluminum oxide film in the samples 5-a, 5-b, 5-c, and 5-d were 0, 1, 2, and 4, respectively.

Figure 50:
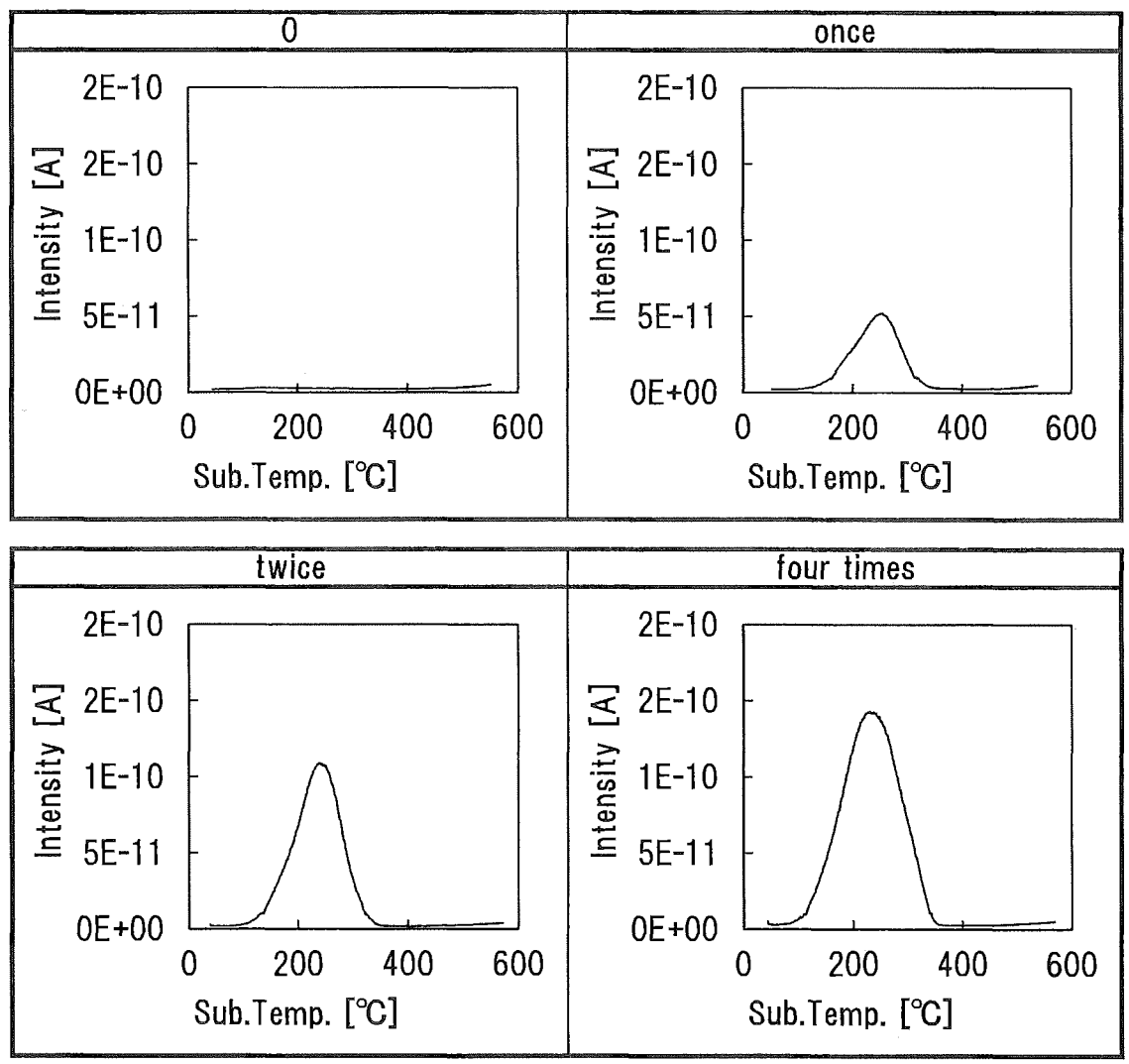
FIG. 50 shows TDS measurement results of samples in Example.

Next, release of oxygen in the fabricated samples was examined by TDS measurement, and the results are shown in FIG. 50. In FIG. 50, the vertical axis indicates intensity (current intensity) [A], and the horizontal axis indicates substrate temperature [° C.]. For the IDS measurement, EMD-WA1000S/W, a thermal desorption spectrometer manufactured by ESCO, Ltd., was used.

By repetition of the steps of forming and then removing the aluminum oxide film, the amount of oxygen taken into the silicon oxide film was found to be increased.

Example 6

In this example, transistors were fabricated, and electrical characteristics of the fabricated transistors were evaluated.

First, a method for fabricating a sample 6-a of Example 6 is described.

By thermal oxidation of a silicon wafer, a 100-nm-thick thermal oxide film was formed on a surface of the silicon wafer. The thermal oxidation was performed at 950° C. for 4 hours in a thermal oxidation atmosphere containing HCl at 3 vol % with respect to oxygen.

Then, a 300-nm-thick silicon oxynitride film was formed over the thermal oxide film by a plasma CVD method using silane at a flow rate of 1 sccm and dinitrogen monoxide at a flow rate of 800 sccm as source gases under the conditions where the pressure in a reaction chamber was 40 Pa, the substrate temperature was 500° C., and a high frequency (RF) power of 150 W was applied.

Then, an aluminum oxide film was formed over the silicon oxynitride film to a thickness of 20 nm by a sputtering method. As sputtering gases, oxygen and argon were supplied into a treatment chamber of a sputtering apparatus each at a flow rate of 25 sccm ($O_2$=50 vol % and Ar=50 vol %); the pressure in the treatment chamber was controlled to 0.4 Pa; and an RF power of 2.5 kW was supplied. Note that the aluminum oxide film was formed at a substrate temperature of 250° C. Moreover, the aluminum oxide film was formed using aluminum oxide ($Al_2O_3$) as a sputtering target.

Next, the aluminum oxide film was removed by ICP etching. The etching was performed under the following conditions: a boron trichloride ($BCl_3$=80 sccm) atmosphere; power supply, 450 W; bias power, 100 W; and pressure, 1.9 Pa.

Steps of forming and then removing the aluminum oxide film were repeated four times. That is, the step of forming and then removing the aluminum oxide film in the sample 6-a was repeated 5 times.

Then, a 20-nm-thick first oxide semiconductor film and a 20-nm-thick second oxide semiconductor film were stacked over the silicon oxynitride film by a sputtering method. The first oxide semiconductor film was formed using a target containing In, Ga, and Zn at an atomic ratio of 1:3:4 (also denoted by IGZO(134)) in a mixed atmosphere of argon and oxygen (argon at 40 sccm and oxygen at 5 sccm) under the conditions where the pressure was 0.7 Pa, a power supply (DC) of 0.5 kW was applied, the distance between the target and the substrate was 60 mm, and the substrate temperature was 200° C. The second oxide semiconductor film was formed using a target containing In, Ga, and Zn at an atomic ratio of 1:1:1 (IGZO(111)) in a mixed atmosphere of argon and oxygen (argon at 30 sccm and oxygen at 15 sccm) under the conditions where the pressure was 0.7 Pa, a power supply (DC) of 0.5 kW was applied, the distance between the target and the substrate was 60 mm, and the substrate temperature was 300° C.

Next, first heat treatment was performed. Here, heat treatment was performed at 450° C. in a nitrogen atmosphere for 1 hour, and after that, another heat treatment was performed at 450° C. in an oxygen atmosphere for 1 hour.

Next, a 150-nm-thick tungsten film was formed over the second oxide semiconductor film by a sputtering method using a tungsten target in an atmosphere of argon (Ar) at a flow rate of 80 sccm as a deposition gas under the conditions where the pressure was 0.8 Pa, the substrate temperature was 130° C., the distance between the target and the substrate was 60 mm, and a power supply (DC) of 1.0 kW was applied.

Next, a resist mask was formed over the tungsten film, and the tungsten film was processed by ICP etching three times to form a source electrode and a drain electrode. The first etching was performed in a mixed atmosphere of carbon tetrafluoride ($CF_4$) at a flow rate of 55 sccm, oxygen ($O_2$) at a flow rate of 55 sccm, and chlorine ($Cl_2$) at a flow rate of 45 sccm under the conditions where the power source was 3000 W, the bias power was 110 W, the pressure was 0.67 Pa, and the substrate temperature was 40° C. The second etching was performed in an atmosphere of oxygen ($O_2$) at a flow rate of 100 sccm under the conditions where the power source was 2000 W, the bias power was 0 W, the pressure was 3.0 Pa, and the substrate temperature was 40° C. The third etching was performed in a mixed atmosphere of carbon tetrafluoride ($CF_4$) at a flow rate of 55 sccm, oxygen ($O_2$) at a flow rate of 55 sccm, and chlorine ($Cl_2$) at a flow rate of 45 sccm under the conditions where the power source was 3000 W, the bias power was 110 W, the pressure was 0.67 Pa, and the substrate temperature was 40° C.

Then, the first and second oxide semiconductor films were processed into island shapes by ICP etching. The etching was performed in an atmosphere of boron trichloride ($BCl_3$) at a flow rate of 80 sccm under the conditions where the power source was 450 W, the bias power was 100 W, the pressure was 1.2 Pa, and the substrate temperature was 70° C.

Next, a third oxide semiconductor film was formed to a thickness of 5 nm over the second oxide semiconductor film, the source electrode, and the drain electrode. The third oxide semiconductor film was formed using a target containing In, Ga, and Zn at an atomic ratio of 1:3:2 (IGZO(132)) in a mixed atmosphere of argon and oxygen (argon at 30 sccm and oxygen at 15 sccm) under the conditions where the pressure was 0.4 Pa, a power supply (DC) of 0.5 kW was applied, the distance between the target and the substrate was 60 mm, and the substrate temperature was 200° C.

After that, a 20-nm-thick silicon oxynitride film to be a gate insulating film was formed over the third oxide semiconductor film by a plasma CVD method using silane ($SiH_4$) at a flow rate of 1 sccm and dinitrogen monoxide ($N_2O$) at a flow rate of 800 sccm as source gases under the conditions where the pressure in a reaction chamber was 200 Pa, the substrate temperature was 350° C., and a high-frequency (RF) power of 150 W was supplied to parallel plate electrodes with a 60 MHz high-frequency power source.

Next, a 30-nm-thick tantalum nitride film was formed over the silicon oxynitride film by a sputtering method using a tantalum nitride target, and an argon (Ar) gas at a flow rate of 50 sccm and a nitrogen ($N_2$) gas at a flow rate of 10 sccm as deposition gases under the conditions where the pressure was 0.6 Pa, the substrate temperature was room temperature, the distance between the target and the substrate was 50 mm, and a power supply (DC) of 1 kW was applied. Over the tantalum nitride film, a 135-nm-thick tungsten film was formed by a sputtering method using a tungsten target and an argon (Ar) gas at a flow rate of 100 sccm as a deposition gas under the conditions where the pressure was 2.0 Pa, the substrate temperature was 230° C., the distance between the target and the substrate was 60 mm, and a power supply (DC) of 4.0 kW was applied.

After that, the tantalum nitride film and the tungsten film were subjected to ICP etching twice to form a gate electrode. The first etching was performed in a mixed atmosphere of a carbon tetrafluoride ($CF_4$) gas at a flow rate of 55 sccm, a chlorine ($Cl_2$) gas at a flow rate of 45 sccm, and an oxygen ($O_2$) gas at a flow rate of 55 sccm under the conditions where the power supply was 3000 W, the bias power was 110 W, and the pressure was 0.67 Pa. The second etching was performed in an atmosphere of chlorine ($Cl_2$) at a flow rate of 100 sccm under the conditions where the power supply was 1000 W, the bias power was 50 W, and the pressure was 0.67 Pa.

Then, a resist mask was formed over the gate electrode and the gate insulating film, and the gate insulating film and the third oxide semiconductor film were processed into an island shape by ICP etching in an atmosphere of boron trichloride ($BCl_3$) at a flow rate of 80 sccm under the conditions where the power supply was 450 W, the bias power was 100 W, the pressure was 1.2 Pa, and the substrate temperature was 70° C.

Next, a 140-nm-thick aluminum oxide film was formed over the gate electrode, the source electrode, and the drain electrode by a sputtering method using an aluminum oxide target, and an argon (Ar) gas at a flow rate of 25 seem and an oxygen ($02$) gas at a flow rate of 25 seem as deposition gases under the conditions where the pressure was 0.4 Pa, the substrate temperature was 250° C., the distance between the target and the substrate was 60 mm, and an RF power of 2.5 kW was applied.

Next, the silicon oxynitride film was subjected to polishing treatment, and then, second heat treatment was performed. The second heat treatment was performed at 400° C. in an oxygen atmosphere for 1 hour.

After that, over the aluminum oxide film, a 300-nm-thick silicon oxynitride film was formed by a plasma CVD method using silane ($SiH_4$) at a flow rate of 5 sccm and dinitrogen monoxide ($N_2O$) at a flow rate of 1000 seem as source gases under the conditions where the pressure in a reaction chamber was 133 Pa, the substrate temperature was 325° C., and a high-frequency power of 35 W was supplied to parallel plate electrodes with a 13.56 MHz high-frequency power source.

Through the above steps, the transistors were fabricated. Note that three types of transistors were prepared. A transistor of a sample 6-a1 has a channel length L of 0.82 μm and a channel width W of 0.8 μm. A transistor of a sample 6-a2 has a channel length L of 0.82 μm and a channel width W of 10 μm. A transistor of a sample 6-a3 has a channel length L of 0.82 μm and a channel width W of 50 μm.

Furthermore, a sample 6-b in which a silicon oxynitride film was subjected to polishing treatment and heat treatment in this order and then to ion implantation to be implanted with an oxygen ion ($^{16}O+$) was fabricated without performing a step of forming and then removing an aluminum oxide film. Note that the heat treatment was performed at 450° C. in a vacuum for 1 hour. The oxygen ion was implanted under the conditions where the acceleration voltage was 60 kV, the dosage was $2.0 \times 10^{16}$ ions/cm$^2$, the tilt angle was 7°, and the twist angle was 72°.

Note that three types of transistors were prepared also in the sample 6-b. A transistor of a sample 6-b1 has a channel length L of 0.82 μm and a channel width W of 0.8 μm. A transistor of a sample 6-b2 has a channel length L of 0.82 μam and a channel width W of 10 μm. A transistor of a sample 6-b3 has a channel length L of 0.82 μm and a channel width W of 50 μm.

In each of the fabricated transistors, a drain current ($I_d$: [A]) was measured under the conditions where the drain voltage ($V_d$: [V]) was set to 0.1 V or 1.8 V and the gate voltage ($V_g$: [V]) was swept from −3 V to 3 V in increments of 0.1 V. In addition, the field-effect mobility ($\mu_FE$: [cm$^2$/Vs]) at $V_d=0.1$ V was measured. FIGS. 51A and 51B, FIGS. 52A and 52B, and FIGS. 53A and 53B show the measurement results.

Figure 51A:
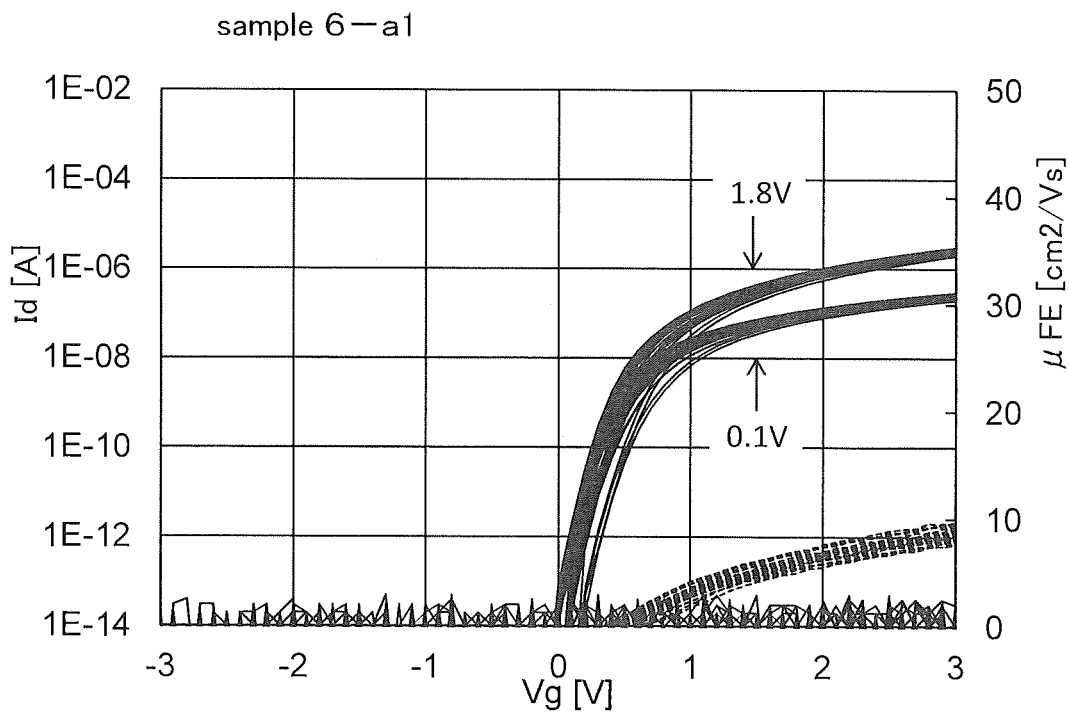
FIGS. 51A and 51B each show $V_g$-$I_d$ characteristics of transistors.
Figure 51B:
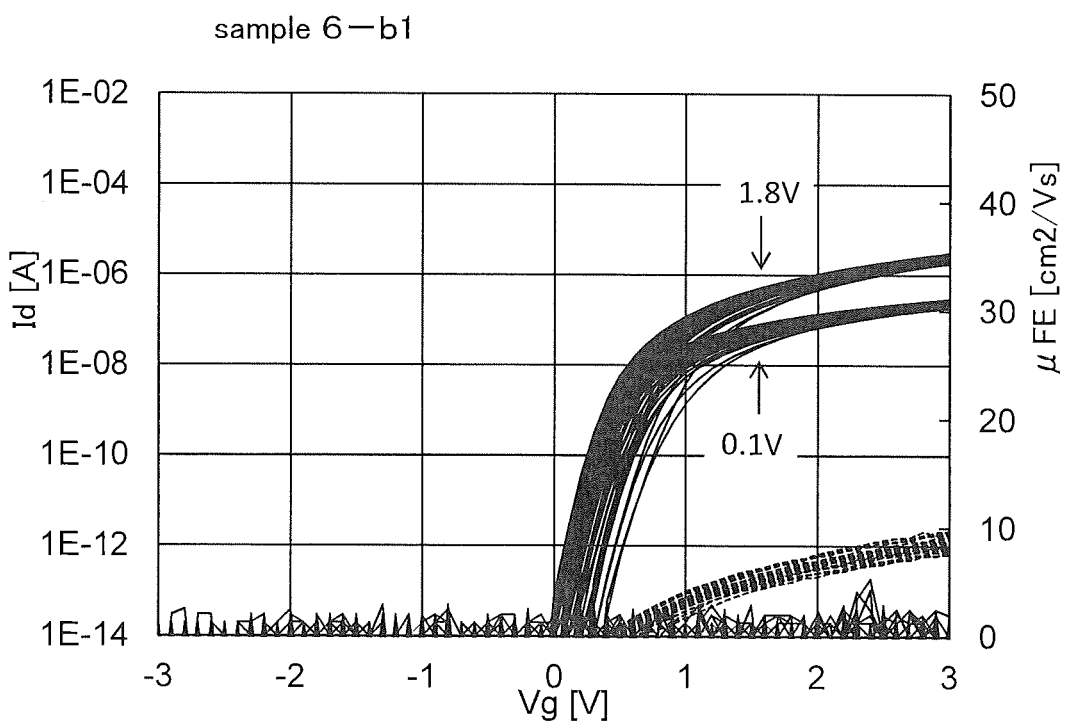
Figure 52A:
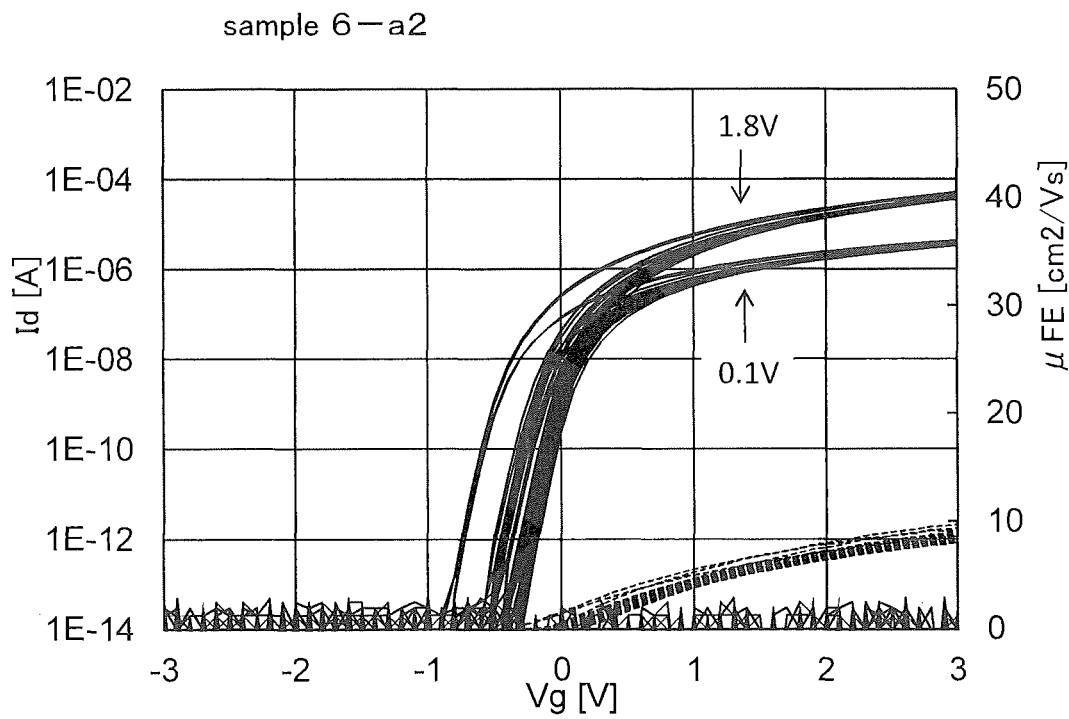
FIGS. 52A and 52B each show $V_g$-$I_d$ characteristics of transistors.
Figure 52B:
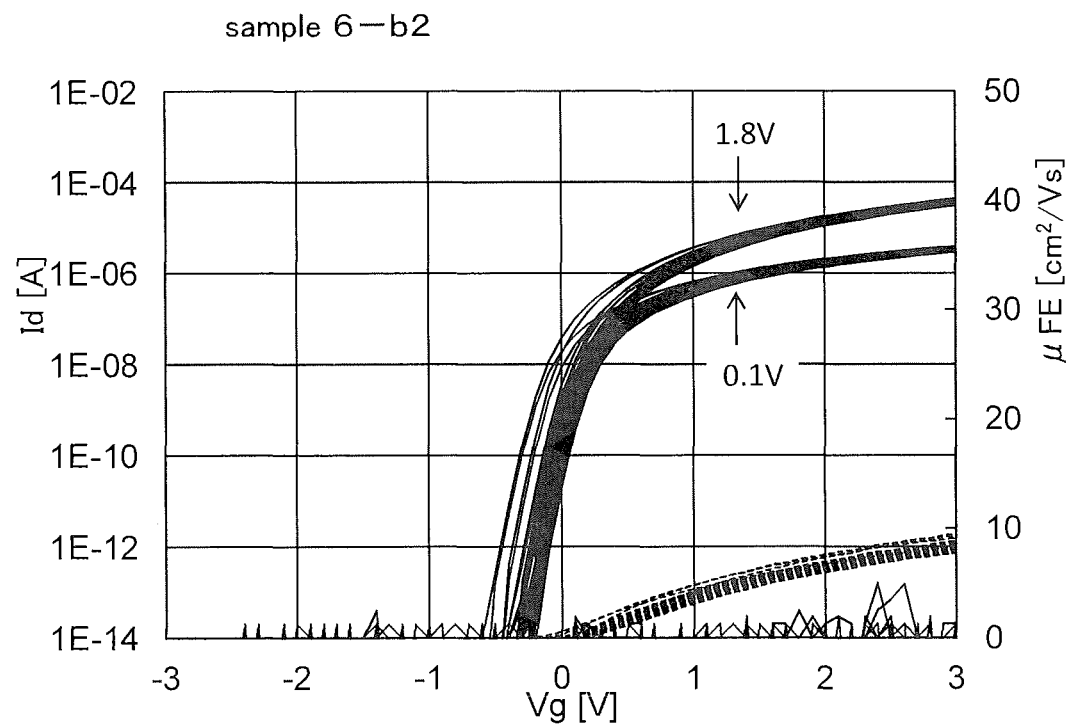
Figure 53A:
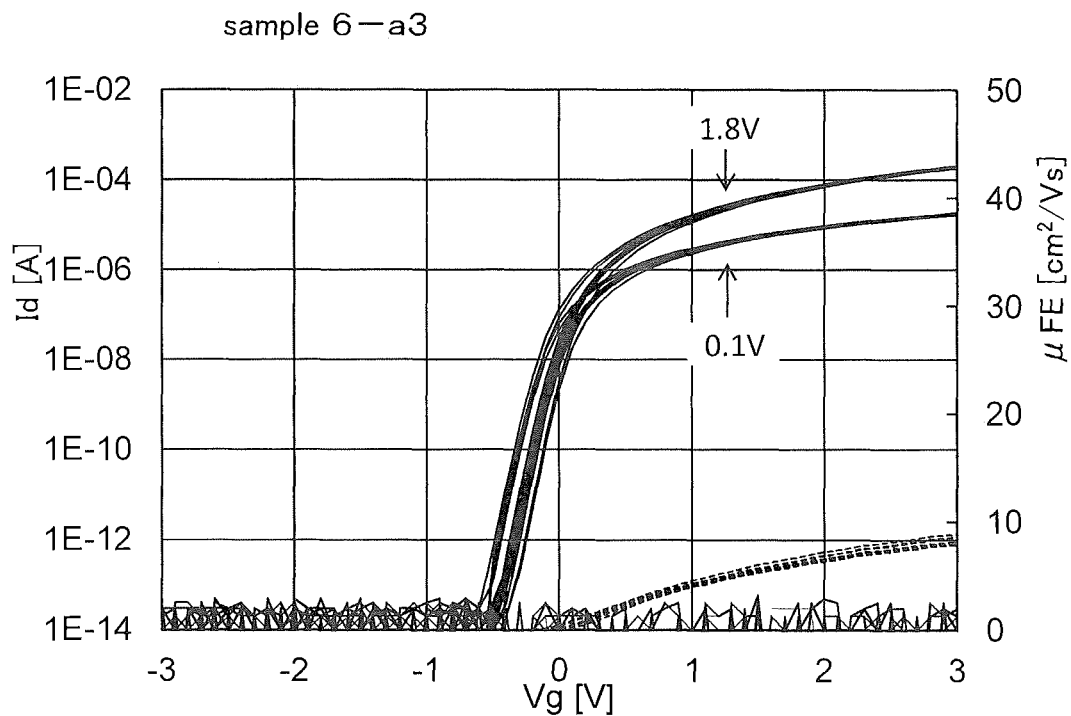
FIGS. 53A and 53B each show $V_g$-$I_d$ characteristics of transistors.
Figure 53B:
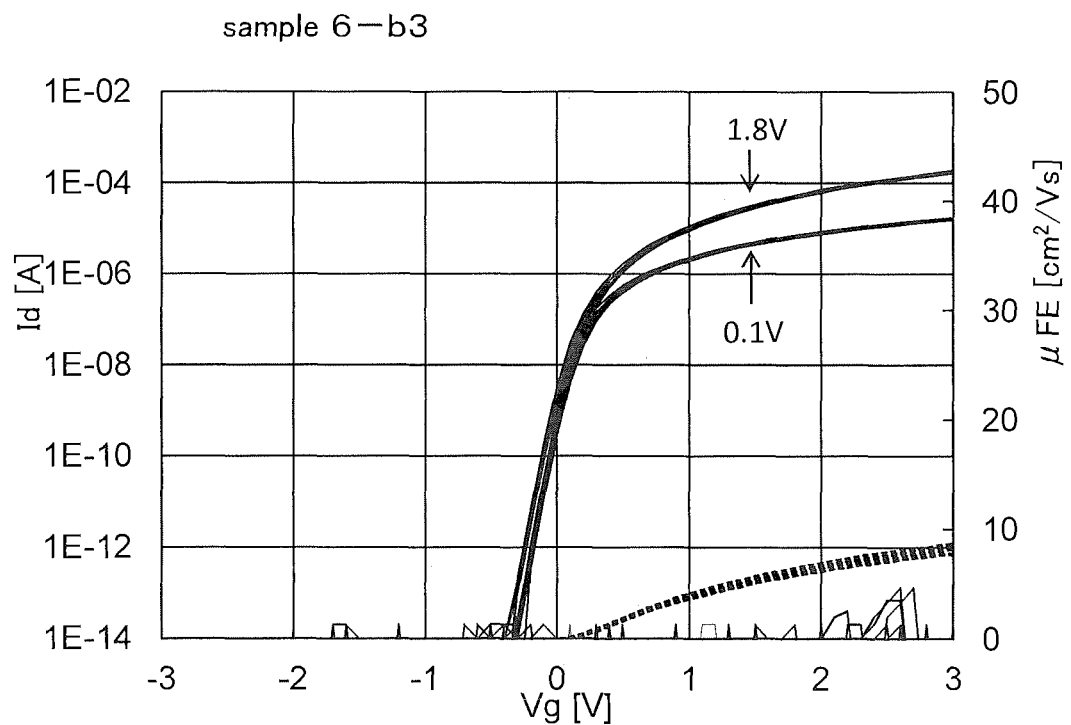

FIGS. 51A and 51B show the measurement results of the transistors each *having* a channel length L of 0.82 μm and a channel width W of 0.8 μm. FIGS. 52A and 52B show the measurement results of the transistors each having a channel length L of 0.82 μm and a channel width W of 10 μm. FIGS. 53A and 53B show the measurement results of the transistors each having a channel length L of 0.82 μm and a channel width W of 50 μm. FIGS. 51A, 52A, and 53A show the measurement results of the transistors in the samples 6-a1 to 6-a3. FIGS. 51B, 52B, and 53B show the measurement results of the transistors in the samples 6-b1 to 6-b3 into which oxygen was implanted by an ion implantation method.

According to FIGS. 51A and 51B, FIGS. 52A and 52B, and FIGS. 53A and 53B, it was found that transistor characteristics favorable for performance of the transistors were achieved by both the method of adding oxygen to a silicon oxynitride film by an ion implantation method and the method of taking oxygen by repeating steps of forming and then removing an aluminum oxide film.

This application is based on Japanese Patent Application serial no. 2014-169430 filed with Japan Patent Office on Aug. 22, 2014, the entire contents of which are hereby incorporated by reference.

What is claimed is:

1. A method for manufacturing a semiconductor device comprising:
   forming a first conductive layer over a substrate;
   forming a first oxide insulating layer over the first conductive layer;
   forming an oxide semiconductor layer over the first oxide insulating layer;
   forming a second oxide insulating layer over the oxide semiconductor layer;
   performing a heat treatment after forming the second oxide insulating layer;
   forming a second conductive layer over the second oxide insulating layer after performing the heat treatment,
   wherein the oxide semiconductor layer comprises at least one of indium, zinc, and M, the M being Al, Ti, Ga, Ge, Y, Zr, Sn, La, Ce, or Hf, and
   wherein the second oxide insulating layer comprises aluminum.

2. A method for manufacturing a semiconductor device comprising:
   forming a first conductive layer over a substrate;
   forming a first oxide insulating layer over the first conductive layer;
   forming an oxide semiconductor layer over the first oxide insulating layer;
   forming a second oxide insulating layer over the oxide semiconductor layer;
   performing a heat treatment after forming the second oxide insulating layer;
   forming a second conductive layer over the second oxide insulating layer after performing the heat treatment;
   forming a nitride insulating layer over the second conductive layer;
   forming a third oxide insulating layer over the nitride insulating layer; and
   forming a third conductive layer and a fourth conductive layer over the third oxide insulating layer, the third conductive layer being electrically connected to the oxide semiconductor layer,
   wherein the oxide semiconductor layer comprises at least one of indium, zinc, and M, the M being Al, Ti, Ga, Ge, Y, Zr, Sn, La, Ce, or Hf, and
   wherein the second oxide insulating layer comprises aluminum.

3. A method for manufacturing a semiconductor device comprising:
   forming a first conductive layer over a substrate;
   forming a first oxide insulating layer over the first conductive layer;
   forming an oxide semiconductor layer over the first oxide insulating layer;
   forming a second conductive layer and a third conductive layer over the oxide semiconductor layer;
   forming a second oxide insulating layer over the oxide semiconductor layer;
   performing a heat treatment after forming the second oxide insulating layer;
   forming a fourth conductive layer over the second oxide insulating layer after performing the heat treatment;
   forming a nitride insulating layer over the fourth conductive layer;
   forming a third oxide insulating layer over the nitride insulating layer; and
   forming a fifth conductive layer and a sixth conductive layer over the third oxide insulating layer,
   wherein each of the second conductive layer and the third conductive layer is interposed between the oxide semiconductor layer and the nitride insulating layer,
   wherein each of the second conductive layer and the third conductive layer is in contact with a top surface of the oxide semiconductor layer,
   wherein the fifth conductive layer is in contact with a top surface of the second conductive layer,
   wherein the sixth conductive layer is in contact with a top surface of the third conductive layer,
   wherein the oxide semiconductor layer comprises at least one of indium, zinc, and M, the M being Al, Ti, Ga, Ge, Y, Zr, Sn, La, Ce, or Hf, and
   wherein the second oxide insulating layer comprises aluminum.

4. The method for manufacturing a semiconductor device according to claim 1, wherein the heat treatment is performed at a temperature higher than or equal to 300° C. and lower than or equal to 500° C.

5. The method for manufacturing a semiconductor device according to claim 1, wherein the oxide semiconductor layer comprises a crystal.

6. The method for manufacturing a semiconductor device according to claim 1, wherein the second oxide insulating layer is formed over an insulating layer which is over the oxide semiconductor layer.

7. The method for manufacturing a semiconductor device according to claim 1, wherein a step of forming the second oxide insulating layer, removing the second oxide insulating layer, and forming another second oxide insulating layer is performed in the step of forming the second oxide insulating layer.

8. The method for manufacturing a semiconductor device according to claim 1, wherein the second oxide insulating layer is formed to a thickness of 4 nm or more.

9. The method for manufacturing a semiconductor device according to claim 2, wherein the heat treatment is performed at a temperature higher than or equal to 300° C. and lower than or equal to 500° C.

10. The method for manufacturing a semiconductor device according to claim 2, wherein the oxide semiconductor layer comprises a crystal.

11. The method for manufacturing a semiconductor device according to claim 2, wherein the second oxide insulating layer is formed over an insulating layer which is over the oxide semiconductor layer.

12. The method for manufacturing a semiconductor device according to claim 2, wherein a step of forming the second oxide insulating layer, removing the second oxide insulating layer, and forming another second oxide insulating layer is performed in the step of forming the second oxide insulating layer.

13. The method for manufacturing a semiconductor device according to claim 2, wherein the second oxide insulating layer is formed to a thickness of 4 nm or more.

14. The method for manufacturing a semiconductor device according to claim 3, wherein the heat treatment is performed at a temperature higher than or equal to 300° C. and lower than or equal to 500° C.

15. The method for manufacturing a semiconductor device according to claim 3, wherein the oxide semiconductor layer comprises a crystal.

16. The method for manufacturing a semiconductor device according to claim 3, wherein the second oxide insulating layer is formed over an insulating layer which is over the oxide semiconductor layer.

17. The method for manufacturing a semiconductor device according to claim 3, wherein a step of forming the second oxide insulating layer, removing the second oxide insulating layer, and forming another second oxide insulating layer is performed in the step of forming the second oxide insulating layer.

18. The method for manufacturing a semiconductor device according to claim 3, wherein the second oxide insulating layer is formed to a thickness of 4 nm or more.

* * * * *